US012562196B2

(12) United States Patent
Ootomo

(10) Patent No.: US 12,562,196 B2
(45) Date of Patent: Feb. 24, 2026

(54) SEMICONDUCTOR MEMORY DEVICE AND MEMORY SYSTEM

(71) Applicant: Kioxia Corporation, Tokyo (JP)

(72) Inventor: Goichi Ootomo, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 234 days.

(21) Appl. No.: 18/182,588

(22) Filed: Mar. 13, 2023

(65) Prior Publication Data

US 2023/0410849 A1      Dec. 21, 2023

(30) Foreign Application Priority Data

Jun. 21, 2022    (JP) ................................. 2022-099706

(51) Int. Cl.
| | |
|---|---|
| *G11C 5/02* | (2006.01) |
| *G11C 7/10* | (2006.01) |
| *G11C 16/08* | (2006.01) |

(52) U.S. Cl.
CPC ............ *G11C 5/025* (2013.01); *G11C 7/1006* (2013.01); *G11C 7/1063* (2013.01); *G11C 16/08* (2013.01)

(58) Field of Classification Search
CPC ..... G11C 5/025; G11C 7/1006; G11C 7/1063; G11C 16/08; G11C 16/10; G11C 16/26; G11C 5/063; G11C 16/0483; G11C 8/12
USPC .................................................. 365/230.003
See application file for complete search history.

(56) References Cited

U.S. PATENT DOCUMENTS

| | | | | |
|---|---|---|---|---|
| 6,728,851 | B1 * | 4/2004 | Estakhri .................. | G06F 3/064 |
| | | | | 365/189.04 |
| 7,957,173 | B2 | 6/2011 | Kim | |
| 8,954,655 | B2 | 2/2015 | Jean et al. | |
| 10,276,218 | B2 | 4/2019 | Hirashima et al. | |
| 2014/0229660 | A1 * | 8/2014 | Asnaashari .......... | G06F 3/0608 |
| | | | | 711/170 |
| 2022/0083479 | A1 * | 3/2022 | Suzuki .................... | G06F 13/28 |
| 2022/0300440 | A1 * | 9/2022 | Ootomo ................ | G11C 16/32 |
| 2023/0410857 | A1 * | 12/2023 | Suzuki ................ | G11C 7/1063 |

FOREIGN PATENT DOCUMENTS

| | | |
|---|---|---|
| JP | 2015-144006 A | 8/2015 |
| JP | 6321682 B2 | 5/2018 |
| JP | 2018-152147 A | 9/2018 |

* cited by examiner

*Primary Examiner* — Alexander Sofocleous
*Assistant Examiner* — James S Wells
(74) *Attorney, Agent, or Firm* — Foley & Lardner LLP

(57) ABSTRACT

According to an embodiment, a semiconductor memory device includes a first chip, a second chip, and a third chip. The third chip is connected to the first chip via a first channel and connected to the second chip via a second channel. Upon receiving a first command sequence for data transfer from a first device, the third chip transfers a second command sequence for the data transfer to the first chip via the first channel and transfers a third command sequence for the data transfer to the second chip via the second channel. The first address includes a chip identification number of a value indicating the first chip. The second command sequence includes the first address. The third command sequence includes a second address obtained by replacing the value of the chip identification number in the first address indicating the first chip to a value indicating the second chip.

18 Claims, 30 Drawing Sheets

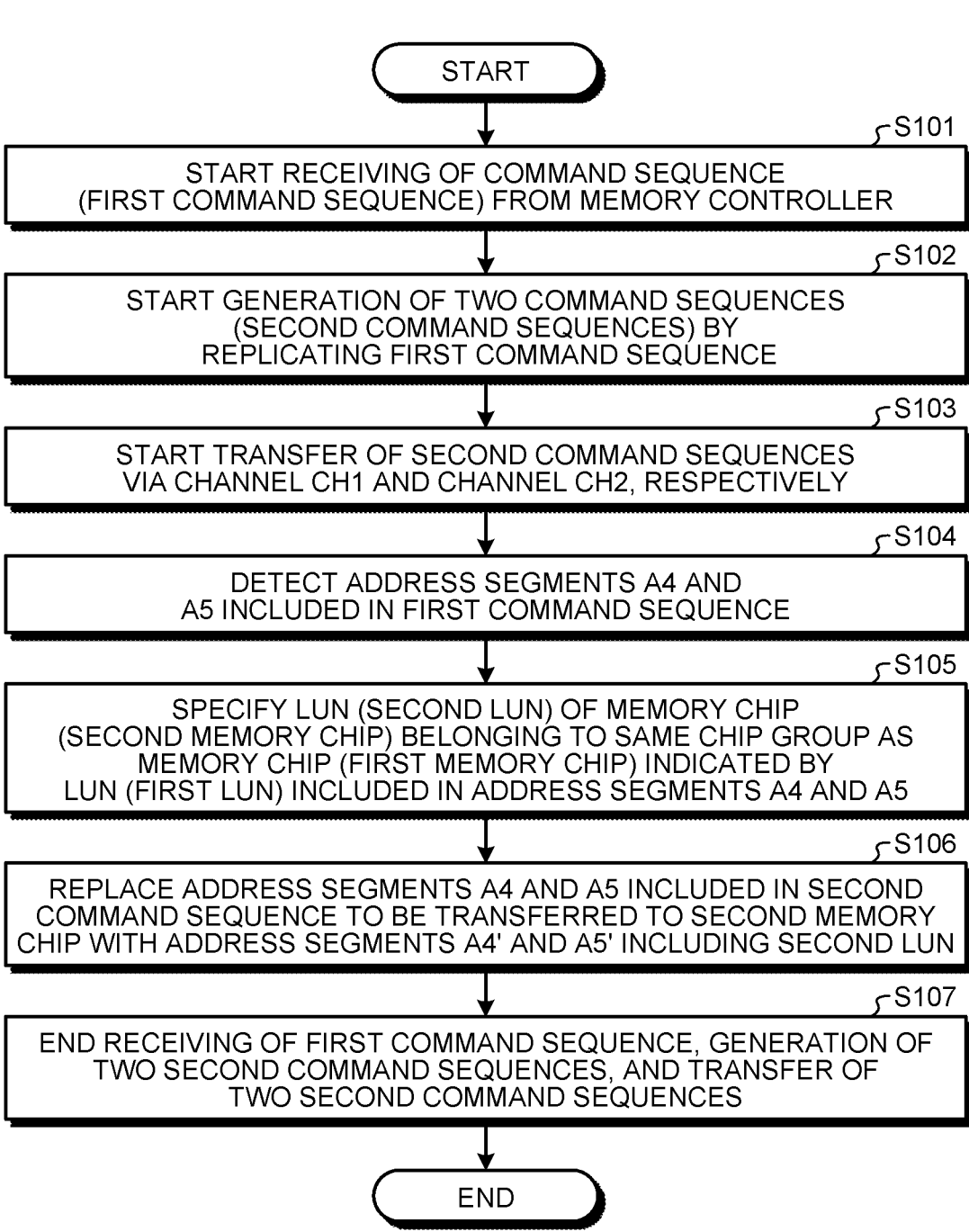

START

S101
START RECEIVING OF COMMAND SEQUENCE
(FIRST COMMAND SEQUENCE) FROM MEMORY CONTROLLER

S102
START GENERATION OF TWO COMMAND SEQUENCES
(SECOND COMMAND SEQUENCES) BY
REPLICATING FIRST COMMAND SEQUENCE

S103
START TRANSFER OF SECOND COMMAND SEQUENCES
VIA CHANNEL CH1 AND CHANNEL CH2, RESPECTIVELY

S104
DETECT ADDRESS SEGMENTS A4 AND
A5 INCLUDED IN FIRST COMMAND SEQUENCE

S105
SPECIFY LUN (SECOND LUN) OF MEMORY CHIP
(SECOND MEMORY CHIP) BELONGING TO SAME CHIP GROUP AS
MEMORY CHIP (FIRST MEMORY CHIP) INDICATED BY
LUN (FIRST LUN) INCLUDED IN ADDRESS SEGMENTS A4 AND A5

S106
REPLACE ADDRESS SEGMENTS A4 AND A5 INCLUDED IN SECOND
COMMAND SEQUENCE TO BE TRANSFERRED TO SECOND MEMORY
CHIP WITH ADDRESS SEGMENTS A4' AND A5' INCLUDING SECOND LUN

S107
END RECEIVING OF FIRST COMMAND SEQUENCE, GENERATION OF
TWO SECOND COMMAND SEQUENCES, AND TRANSFER OF
TWO SECOND COMMAND SEQUENCES

END

| CH1 | | | CH2 | | | BLOCK MANAGE-MENT NUMBER | BASIC ADDRESS | | ADDRESS MODE | FIRST ADDRESS | | | SECOND ADDRESS | | |
|---|---|---|---|---|---|---|---|---|---|---|---|---|---|---|---|
| LUN | BLK# | STATUS | LUN | BLK# | STATUS | | LUN | BLK# | | LUN | BLK# | PL# | LUN | BLK# | PL# |
| 0 | 0000 | UNUSED | 4 | 0000 | UNUSED | 00000 | 0/4 | 0000 | UNDEFINED | | | | | | |
| 1 | 0000 | UNUSED | 5 | 0000 | UNUSED | 00001 | 1/5 | 0000 | UNDEFINED | | | | | | |
| 2 | 0000 | UNUSED | 6 | 0000 | UNUSED | 00002 | 2/6 | 0000 | UNDEFINED | | | | | | |
| 3 | 0000 | UNUSED | 7 | 0000 | UNUSED | 00003 | 3/7 | 0000 | UNDEFINED | | | | | | |
| 0 | 0001 | UNUSED | 4 | 0001 | UNUSED | 00004 | 0/4 | 0001 | UNDEFINED | | | | | | |
| 1 | 0001 | UNUSED | 5 | 0001 | UNUSED | 00005 | 1/5 | 0001 | UNDEFINED | | | | | | |
| 2 | 0001 | UNUSED | 6 | 0001 | UNUSED | 00006 | 2/6 | 0001 | UNDEFINED | | | | | | |
| 3 | 0001 | UNUSED | 7 | 0001 | UNUSED | 00007 | 3/7 | 0001 | UNDEFINED | | | | | | |
| 0 | 0002 | UNUSED | 4 | 0002 | UNUSED | 00008 | 0/4 | 0002 | UNDEFINED | | | | | | |
| 1 | 0002 | UNUSED | 5 | 0002 | UNUSED | 00009 | 1/5 | 0002 | UNDEFINED | | | | | | |
| 2 | 0002 | UNUSED | 6 | 0002 | UNUSED | 00010 | 2/6 | 0002 | UNDEFINED | | | | | | |
| 3 | 0002 | UNUSED | 7 | 0002 | UNUSED | 00011 | 3/7 | 0002 | UNDEFINED | | | | | | |
| 0 | 0003 | UNUSED | 4 | 0003 | UNUSED | 00012 | 0/4 | 0003 | UNDEFINED | | | | | | |
| 1 | 0003 | UNUSED | 5 | 0003 | UNUSED | 00013 | 1/5 | 0003 | UNDEFINED | | | | | | |
| 2 | 0003 | UNUSED | 6 | 0003 | UNUSED | 00014 | 2/6 | 0003 | UNDEFINED | | | | | | |
| 3 | 0003 | UNUSED | 7 | 0003 | UNUSED | 00015 | 3/7 | 0003 | | | | | | | |
| 0 | 3659 | UNUSED | 4 | 3659 | UNUSED | 14636 | 0/4 | 3455 | UNDEFINED | | | | | | |
| 1 | 3659 | UNUSED | 5 | 3659 | UNUSED | 14637 | 1/5 | 3455 | UNDEFINED | | | | | | |
| 2 | 3659 | UNUSED | 6 | 3659 | UNUSED | 14638 | 2/6 | 3455 | UNDEFINED | | | | | | |
| 3 | 3659 | UNUSED | 7 | 3659 | UNUSED | 14639 | 3/7 | 3455 | UNDEFINED | | | | | | |

| CH1 | | | CH2 | | | BLOCK MANAGE-MENT NUMBER | BASIC ADDRESS | | ADDRESS MODE | FIRST ADDRESS | | | | SECOND ADDRESS | | |
|---|---|---|---|---|---|---|---|---|---|---|---|---|---|---|---|---|
| LUN | BLK# | STATUS | LUN | BLK# | STATUS | | LUN | BLK# | | LUN | BLK# | PL# | | LUN | BLK# | PL# |
| 0 | 0000 | UNUSED | 4 | 0000 | UNUSED | 00000 | 0/4 | 0000 | UNDEFINED | | | | | | | |
| 1 | 0000 | UNUSED | 5 | 0000 | UNUSED | 00001 | 1/5 | 0000 | UNDEFINED | | | | | | | |
| 2 | 0000 | UNUSED | 6 | 0000 | UNUSED | 00002 | 2/6 | 0000 | UNDEFINED | | | | | | | |
| 3 | 0000 | NG | 7 | 0000 | NG | 00003 | 3/7 | 0000 | UNDEFINED | | | | | | | |
| 0 | 0001 | UNUSED | 4 | 0001 | UNUSED | 00004 | 0/4 | 0001 | UNDEFINED | | | | | | | |
| 1 | 0001 | UNUSED | 5 | 0001 | UNUSED | 00005 | 1/5 | 0001 | UNDEFINED | | | | | | | |
| 2 | 0001 | UNUSED | 6 | 0001 | UNUSED | 00006 | 2/6 | 0001 | UNDEFINED | | | | | | | |
| 3 | 0001 | UNUSED | 7 | 0001 | UNUSED | 00007 | 3/7 | 0001 | UNDEFINED | | | | | | | |
| 0 | 0002 | UNUSED | 4 | 0002 | UNUSED | 00008 | 0/4 | 0002 | UNDEFINED | | | | | | | |
| 1 | 0002 | UNUSED | 5 | 0002 | UNUSED | 00009 | 1/5 | 0002 | UNDEFINED | | | | | | | |
| 2 | 0002 | UNUSED | 6 | 0002 | UNUSED | 00010 | 2/6 | 0002 | UNDEFINED | | | | | | | |
| 3 | 0002 | UNUSED | 7 | 0002 | UNUSED | 00011 | 3/7 | 0002 | UNDEFINED | | | | | | | |
| 0 | 0003 | NG | 4 | 0003 | NG | 00012 | 0/4 | 0003 | UNDEFINED | | | | | | | |
| 1 | 0003 | UNUSED | 5 | 0003 | UNUSED | 00013 | 1/5 | 0003 | UNDEFINED | | | | | | | |
| 2 | 0003 | UNUSED | 6 | 0003 | UNUSED | 00014 | 2/6 | 0003 | UNDEFINED | | | | | | | |
| 3 | 0003 | UNUSED | 7 | 0003 | UNUSED | 00015 | 3/7 | 0003 | | | | | | | | |
| 0 | 3659 | UNUSED | 4 | 3659 | UNUSED | 14636 | 0/4 | 3455 | UNDEFINED | | | | | | | |
| 1 | 3659 | UNUSED | 5 | 3659 | UNUSED | 14637 | 1/5 | 3455 | UNDEFINED | | | | | | | |
| 2 | 3659 | UNUSED | 6 | 3659 | UNUSED | 14638 | 2/6 | 3455 | UNDEFINED | | | | | | | |
| 3 | 3659 | UNUSED | 7 | 3659 | UNUSED | 14639 | 3/7 | 3455 | UNDEFINED | | | | | | | |

| CH1 LUN | CH1 BLK# | CH1 STATUS | CH2 LUN | CH2 BLK# | CH2 STATUS | BLOCK MANAGEMENT NUMBER | BASIC ADDRESS LUN | BASIC ADDRESS BLK# | ADDRESS MODE | FIRST ADDRESS LUN | FIRST ADDRESS BLK# | FIRST ADDRESS PL# | SECOND ADDRESS LUN | SECOND ADDRESS BLK# | SECOND ADDRESS PL# |
|---|---|---|---|---|---|---|---|---|---|---|---|---|---|---|---|
| 0 | 0000 | IN USE | 4 | 0000 | IN USE | 00000 | 0/4 | 0000 | 1Address | 0 | 0000 | 0 | 4 | 0000 | 0 |
| 1 | 0000 | IN USE | 5 | 0000 | IN USE | 00001 | 1/5 | 0000 | 1Address | 1 | 0000 | 0 | 5 | 0000 | 0 |
| 2 | 0000 | IN USE | 6 | 0000 | IN USE | 00002 | 2/6 | 0000 | 1Address | 2 | 0000 | 0 | 6 | 0000 | 0 |
| 3 | 0000 | UNUSED | 7 | 0000 | NG | 00003 | 3/7 | 0000 | UNDEFINED | | | | | | |
| 0 | 0001 | IN USE | 4 | 0001 | IN USE | 00004 | 0/4 | 0001 | 1Address | 0 | 0001 | 1 | 4 | 0001 | 1 |
| 1 | 0001 | IN USE | 5 | 0001 | IN USE | 00005 | 1/5 | 0001 | 1Address | 1 | 0001 | 1 | 5 | 0001 | 1 |
| 2 | 0001 | IN USE | 6 | 0001 | IN USE | 00006 | 2/6 | 0001 | 1Address | 2 | 0001 | 1 | 6 | 0001 | 1 |
| 3 | 0001 | IN USE | 7 | 0001 | IN USE | 00007 | 3/7 | 0001 | 1Address | 3 | 0001 | 1 | 7 | 0001 | 1 |
| 0 | 0002 | IN USE | 4 | 0002 | IN USE | 00008 | 0/4 | 0002 | 1Address | 0 | 0002 | 2 | 4 | 0002 | 2 |
| 1 | 0002 | IN USE | 5 | 0002 | IN USE | 00009 | 1/5 | 0002 | 1Address | 1 | 0002 | 2 | 5 | 0002 | 2 |
| 2 | 0002 | IN USE | 6 | 0002 | IN USE | 00010 | 2/6 | 0002 | 1Address | 2 | 0002 | 2 | 6 | 0002 | 2 |
| 3 | 0002 | IN USE | 7 | 0002 | NG | 00011 | 3/7 | 0002 | 1Address | 3 | 0002 | 2 | 7 | 0002 | 1 |
| 0 | 0003 | NG | 4 | 0003 | IN USE | 00012 | 0/4 | 0003 | UNDEFINED | | | | | | |
| 1 | 0003 | IN USE | 5 | 0003 | IN USE | 00013 | 1/5 | 0003 | 1Address | 1 | 0003 | 3 | 5 | 0003 | 3 |
| 2 | 0003 | IN USE | 6 | 0003 | IN USE | 00014 | 2/6 | 0003 | 1Address | 2 | 0003 | 3 | 6 | 0003 | 3 |
| 3 | 0003 | IN USE | 7 | 0003 | IN USE | 00015 | 3/7 | 0003 | 1Address | 3 | 0003 | 3 | 7 | 0003 | 3 |
| 0 | 3659 | IN USE | 4 | 3659 | IN USE | 14636 | 0/4 | 3455 | 1Address | 0 | 3659 | 3 | 4 | 3659 | 3 |
| 1 | 3659 | IN USE | 5 | 3659 | IN USE | 14637 | 1/5 | 3455 | 1Address | 1 | 3659 | 3 | 5 | 3659 | 3 |
| 2 | 3659 | IN USE | 6 | 3659 | IN USE | 14638 | 2/6 | 3455 | 1Address | 2 | 3659 | 3 | 6 | 3659 | 3 |
| 3 | 3659 | IN USE | 7 | 3659 | IN USE | 14639 | 3/7 | 3455 | 1Address | 3 | 3659 | 3 | 7 | 3659 | 3 |

| CH1 LUN | CH1 BLK# | CH1 STATUS | CH2 LUN | CH2 BLK# | CH2 STATUS | BLOCK MANAGEMENT NUMBER | BASIC ADDRESS LUN | BASIC ADDRESS BLK# | ADDRESS MODE | FIRST ADDRESS LUN | FIRST ADDRESS BLK# | FIRST ADDRESS PL# | SECOND ADDRESS LUN | SECOND ADDRESS BLK# | SECOND ADDRESS PL# |
|---|---|---|---|---|---|---|---|---|---|---|---|---|---|---|---|
| 0 | 0000 | IN USE | 4 | 0000 | IN USE | 00000 | 0/4 | 0000 | 1Address | 0 | 0000 | 0 | 4 | 0000 | 0 |
| 1 | 0000 | IN USE | 5 | 0000 | IN USE | 00001 | 1/5 | 0000 | 1Address | 1 | 0000 | 0 | 5 | 0000 | 0 |
| 2 | 0000 | IN USE | 6 | 0000 | IN USE | 00002 | 2/6 | 0000 | 1Address | 2 | 0000 | 0 | 6 | 0000 | 0 |
| 3 | 0000 | NG | 7 | 0000 | IN USE | 00003 | 3/7 | 0000 | 2Address | 3 | 0000 | 0 | 7 | 3456 | 0 |
| 0 | 0001 | IN USE | 4 | 0001 | IN USE | 00004 | 0/4 | 0001 | 1Address | 0 | 0001 | 1 | 4 | 0001 | 1 |
| 1 | 0001 | IN USE | 5 | 0001 | IN USE | 00005 | 1/5 | 0001 | 1Address | 1 | 0001 | 1 | 5 | 0001 | 1 |
| 2 | 0001 | IN USE | 6 | 0001 | IN USE | 00006 | 2/6 | 0001 | 1Address | 2 | 0001 | 1 | 6 | 0001 | 1 |
| 3 | 0001 | IN USE | 7 | 0001 | IN USE | 00007 | 3/7 | 0001 | 1Address | 3 | 0001 | 1 | 7 | 0001 | 1 |
| 0 | 0002 | IN USE | 4 | 0002 | IN USE | 00008 | 0/4 | 0002 | 1Address | 0 | 0002 | 2 | 4 | 0002 | 2 |
| 1 | 0002 | IN USE | 5 | 0002 | IN USE | 00009 | 1/5 | 0002 | 1Address | 1 | 0002 | 2 | 5 | 0002 | 2 |
| 2 | 0002 | IN USE | 6 | 0002 | IN USE | 00010 | 2/6 | 0002 | 1Address | 2 | 0002 | 2 | 6 | 0002 | 2 |
| 3 | 0002 | IN USE | 7 | 0002 | IN USE | 00011 | 3/7 | 0002 | 1Address | 3 | 0002 | 2 | 7 | 0002 | 1 |
| 0 | 0003 | NG | 4 | 0003 | NG | 00012 | 0/4 | 0003 | 2Address | 0 | 1111 | 3 | 6 | 2222 | 2 |
| 1 | 0003 | IN USE | 5 | 0003 | IN USE | 00013 | 1/5 | 0003 | 1Address | 1 | 0003 | 3 | 5 | 0003 | 3 |
| 2 | 0003 | IN USE | 6 | 0003 | IN USE | 00014 | 2/6 | 0003 | 1Address | 2 | 0003 | 3 | 6 | 0003 | 3 |
| 3 | 0003 | IN USE | 7 | 0003 | IN USE | 00015 | 3/7 | 0003 | 1Address | 3 | 0003 | 3 | 7 | 0003 | 3 |
| 0 | 3659 | IN USE | 4 | 3659 | IN USE | 14636 | 0/4 | 3455 | 1Address | 0 | 3659 | 3 | 4 | 3659 | 3 |
| 1 | 3659 | IN USE | 5 | 3659 | IN USE | 14637 | 1/5 | 3455 | 1Address | 1 | 3659 | 3 | 5 | 3659 | 3 |
| 2 | 3659 | IN USE | 6 | 3659 | IN USE | 14638 | 2/6 | 3455 | 1Address | 2 | 3659 | 3 | 6 | 3659 | 3 |
| 3 | 3659 | IN USE | 7 | 3659 | IN USE | 14639 | 3/7 | 3455 | 1Address | 3 | 3659 | 3 | 7 | 3659 | 3 |

| LUN | CH1 BLK# | STATUS | LUN | CH2 BLK# | STATUS |
|---|---|---|---|---|---|
| 0 | 0000 | IN USE | 4 | 0000 | IN USE |
| 1 | 0000 | IN USE | 5 | 0000 | IN USE |
| 2 | 0000 | IN USE | 6 | 0000 | IN USE |
| 3 | 0000 | IN USE | 7 | 0000 | NG |
| 0 | 0001 | IN USE | 4 | 0001 | IN USE |
| 1 | 0001 | IN USE | 5 | 0001 | IN USE |
| 2 | 0001 | IN USE | 6 | 0001 | IN USE |
| 3 | 0001 | NG | 7 | 0001 | IN USE |
| 0 | 0002 | IN USE | 4 | 0002 | IN USE |
| 1 | 0002 | IN USE | 5 | 0002 | IN USE |
| 2 | 0002 | IN USE | 6 | 0002 | IN USE |
| 3 | 0002 | IN USE | 7 | 0002 | IN USE |

302

| BLOCK MANAGE-MENT NUMBER | BASIC ADDRESS LUN | BASIC ADDRESS BLK# | ADDRESS MODE | FIRST ADDRESS LUN | FIRST ADDRESS BLK# | SECOND ADDRESS LUN | SECOND ADDRESS BLK# |
|---|---|---|---|---|---|---|---|
| 00000 | 0/4 | 0000 | 1Address | 0 | 0000 | 4 | 0000 |
| 00001 | 1/5 | 0000 | 1Address | 1 | 0000 | 5 | 0000 |
| 00002 | 2/6 | 0000 | 1Address | 2 | 0000 | 6 | 0000 |
| 00003 | 3/7 | 0000 | 2Address | 3 | 0000 | 7 | 3456 |
| 00004 | 0/4 | 0001 | 1Address | 0 | 0001 | 4 | 0001 |
| 00005 | 1/5 | 0001 | 1Address | 1 | 0001 | 5 | 0001 |
| 00006 | 2/6 | 0001 | 1Address | 2 | 0001 | 6 | 0001 |
| 00007 | 3/7 | 0001 | UNDEFINED | | | | |
| 00008 | 0/4 | 0002 | 1Address | 0 | 0002 | 4 | 0002 |
| 00009 | 1/5 | 0002 | 1Address | 1 | 0002 | 5 | 0002 |
| 00010 | 2/6 | 0002 | 1Address | 2 | 0002 | 6 | 0002 |
| 00011 | 3/7 | 0002 | 1Address | 3 | 0002 | 7 | 0002 |

| | CH1 | | CH2 | | | BLOCK MANAGE-MENT NUMBER | BASIC ADDRESS | | ADDRESS MODE | FIRST ADDRESS | | SECOND ADDRESS | |
|---|---|---|---|---|---|---|---|---|---|---|---|---|---|
| LUN | BLK# | STATUS | LUN | BLK# | STATUS | | LUN | BLK# | | LUN | BLK# | LUN | BLK# |
| 0 | 0000 | IN USE | 4 | 0000 | IN USE | 00000 | 0/4 | 0000 | 1Address | 0 | 0000 | 4 | 0000 |
| 1 | 0000 | IN USE | 5 | 0000 | IN USE | 00001 | 1/5 | 0000 | 1Address | 1 | 0000 | 5 | 0000 |
| 2 | 0000 | IN USE | 6 | 0000 | IN USE | 00002 | 2/6 | 0000 | 1Address | 2 | 0000 | 6 | 0000 |
| 3 | 0000 | IN USE | 7 | 0000 | NG | 00003 | 3/7 | 0000 | 2Address | 3 | 0000 | 7 | 3456 |
| 0 | 0001 | IN USE | 4 | 0001 | IN USE | 00004 | 0/4 | 0001 | 1Address | 0 | 0001 | 4 | 0001 |
| 1 | 0001 | IN USE | 5 | 0001 | IN USE | 00005 | 1/5 | 0001 | 1Address | 1 | 0001 | 5 | 0001 |
| 2 | 0001 | NG | 6 | 0001 | IN USE | 00006 | 2/6 | 0001 | 1Address | 2 | 0001 | 6 | 0001 |
| 3 | 0001 | IN USE | 7 | 0001 | IN USE | 00007 | 3/7 | 0001 | 2Address | 3 | 0273 | 7 | 0001 |
| 0 | 0002 | IN USE | 4 | 0002 | IN USE | 00008 | 0/4 | 0002 | 1Address | 0 | 0002 | 4 | 0002 |
| 1 | 0002 | IN USE | 5 | 0002 | IN USE | 00009 | 1/5 | 0002 | 1Address | 1 | 0002 | 5 | 0002 |
| 2 | 0002 | IN USE | 6 | 0002 | IN USE | 00010 | 2/6 | 0002 | 1Address | 2 | 0002 | 6 | 0002 |
| 3 | 0002 | IN USE | 7 | 0002 | IN USE | 00011 | 3/7 | 0002 | 1Address | 3 | 0002 | 7 | 0002 |

SEMICONDUCTOR MEMORY DEVICE AND MEMORY SYSTEM

CROSS-REFERENCE TO RELATED APPLICATIONS

This application is based upon and claims the benefit of priority from Japanese Patent Application No. 2022-099706, filed on Jun. 21, 2022; the entire contents of which are incorporated herein by reference.

FIELD

Embodiments described herein relate generally to a semiconductor memory device and a memory system.

BACKGROUND

There has been a semiconductor memory device in which a semiconductor integrated circuit called a bridge chip is disposed between an external terminal group capable of being connected to an external controller (hereinafter, referred to as a memory controller) and a plurality of memory chips. In such a semiconductor memory device, data transfer between the memory controller and the plurality of memory chips is performed via the bridge chip.

BRIEF DESCRIPTION OF THE DRAWINGS

FIG. 4 is a timing chart illustrating an example of information transferred via each channel when an instruction for a write operation is given in the memory system according to the first embodiment;

FIG. 8 is a flowchart illustrating an example of an operation related to processing for a command sequence for data transfer in a bridge chip according to the first embodiment;

FIG. 14 is a schematic diagram illustrating an example of a memory system to which a semiconductor memory device according to a third embodiment is applied;

FIG. 15 is a schematic diagram illustrating an example of data configurations of first information and second information according to the third embodiment;

FIG. 17 is a diagram illustrating an example of a content of block management information after the first initialization processing according to the third embodiment;

FIG. 19 is a diagram illustrating an example of a content of the block management information after the second initialization processing according to the third embodiment is executed;

FIG. 21 is a diagram illustrating an example of a content of the block management information after the third initialization processing according to the third embodiment is executed;

FIG. 23 is a diagram illustrating an example of transition of a content of the block management information by the processing of updating the block management information according to the third embodiment;

FIG. 24 is a diagram illustrating another example of transition of a content of the block management information by the processing of updating the block management information according to the third embodiment;

FIG. 27 is a timing chart illustrating an example of information transferred via each channel when status information is acquired in a memory system according to a first modified example of the fourth embodiment;

FIG. 28 is a timing chart illustrating an example of information transferred via each channel when status information is acquired in a memory system according to a second modified example of the fourth embodiment;

DETAILED DESCRIPTION

According to the present embodiment, a semiconductor memory device includes a first chip, a second chip, and a third chip. The first chip includes a first memory cell array. The second chip includes a second memory cell array. The third chip is connectable to a first device. The third chip is connected to the first chip via a first channel and connected to the second chip via a second channel. The third chip is configured to, in a case where a first command sequence for data transfer is received from the first device, transfer a second command sequence for the data transfer to the first chip via the first channel and transfer a third command sequence for the data transfer to the second chip via the second channel. The first command sequence includes a first address indicating a position in the first memory cell array. The first address includes a chip identification number of a value indicating the first chip. The second command sequence includes the first address. The third command sequence includes a second address obtained by replacing the value of the chip identification number in the first address indicating the first chip with a value indicating the second chip.

Exemplary embodiments of a semiconductor memory device and a memory system will be explained below in detail with reference to the accompanying drawings. The present invention is not limited to the following embodiments.

First Embodiment

Figure 1:
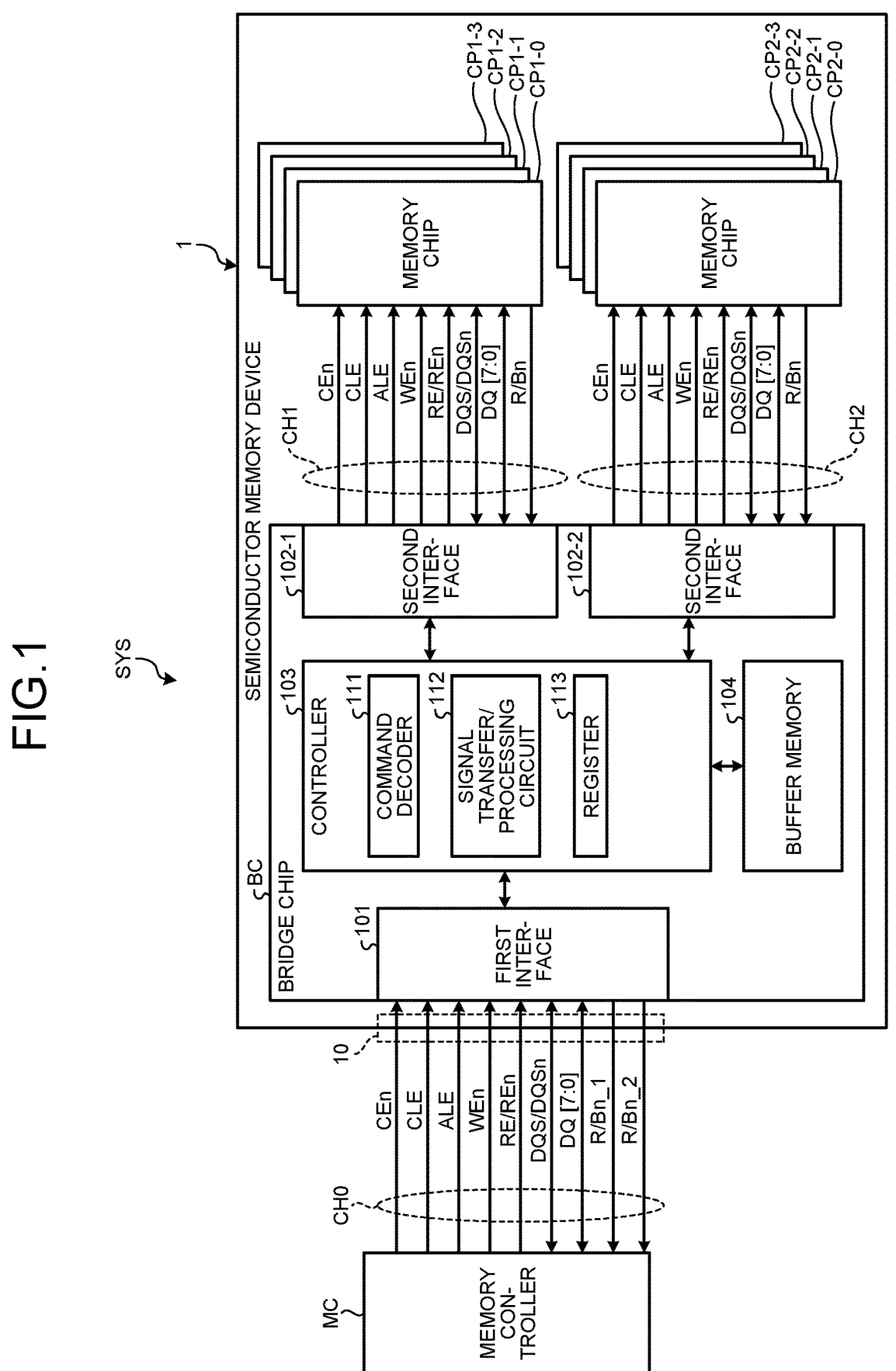
FIG. 1 is a schematic diagram illustrating an example of a configuration of a memory system to which a semiconductor memory device according to a first embodiment is applied.

FIG. 1 is a schematic diagram illustrating an example of a configuration of a memory system SYS to which a semiconductor memory device 1 according to a first embodiment is applied.

The memory system SYS includes a memory controller MC and the semiconductor memory device 1. The semiconductor memory device 1 includes an external terminal group 10, a bridge chip BC, and a plurality of memory chips CP1-0 to CP1-3 and CP2-0 to CP2-3.

The memory controller MC is an example of the first device. The bridge chip BC is an example of the third chip.

The semiconductor memory device 1 can be installed as a multi-chip package (MCP) in which the memory chips CP1-0 to CP1-3 and the memory chips CP2-0 to CP2-3 are each stacked. In a case where the semiconductor memory device 1 is installed as the MCP, the periphery of the bridge chip BC and the memory chips CP1-0 to CP1-3 and CP2-0 to CP2-3 in the semiconductor memory device 1 may be sealed with a molding resin.

In FIG. 1, four memory chips CP1-0 to CP1-3 are connected to the bridge chip BC via a channel CH1, and four memory chips CP2-0 to CP2-3 are connected to the bridge chip BC via a channel CH2. That is, the semiconductor memory device 1 can be configured as a multi-memory chip module including the plurality of (here, eight) memory chips CP1-0 to CP1-3 and CP2-0 to CP2-3.

Each of the memory chips CP1-0 to CP1-3 and CP2-0 to CP2-3 is, for example, a memory chip of a non-volatile memory such as a NAND flash memory. Note that the number of memory chips CP included in the semiconductor memory device 1 is not limited to eight. In addition, the number of channels connecting the bridge chip BC and the memory chips CP to each other is not limited to two.

The semiconductor memory device 1 can be connected to the memory controller MC via a wired communication path. This wired communication path is referred to as a channel CH0. The channel CH0 is configured based on a predetermined standard. In a case where each of the memory chips CP1-0 to CP1-3 and CP2-0 to CP2-3 is a NAND flash memory, the predetermined standard is, for example, a toggle DDR standard.

The bridge chip BC is electrically connected to a plurality of (here, two) channels CH1 and CH2. The memory chips CP1-0 to CP1-3 and CP2-0 to CP2-3 are connected to the bridge chip BC via the plurality of channels CH1 and CH2. The memory chips CP1-0 to CP1-3 are connected to the channel CH1 configured based on a predetermined standard. The memory chips CP2-0 to CP2-3 are connected to the channel CH2 configured based on a predetermined standard. In a case where each memory chip CP is a NAND flash memory, the predetermined standard is, for example, the toggle DDR standard. Hereinafter, it is assumed that each memory chip CP is a NAND flash memory, and the predetermined standard is the toggle DDR standard.

The channel CH0 includes a signal line that transfers a chip enable signal CEn, a signal line that transfers a command latch enable signal CLE, a signal line that transfers an address latch enable signal ALE, a signal line that transfers a write enable signal WEn, a signal line that transfers a read enable signal RE/REn, a signal line that transfers a data strobe signal DQS/DQSn, a signal line that transfers a data signal DQ(7:0) having a predetermined bit width (here, as an example, a bit width of 8 bits), a signal line that transfers a ready/busy signal R/Bn_1, and a signal line that transfers a ready/busy signal R/Bn_2. Note that "n" written at the end of a sign representing a signal that is operated with negative logic. Each signal can be optionally operated with any one of negative logic and positive logic.

The chip enable signal CEn is a signal for enabling the memory chip CP to be accessed. The data strobe signal DQS/DQSn is a signal instructing a counterpart device to acquire data transferred as the data signal DQ(7:0). The data strobe signal DQS/DQSn is a differential signal including a data strobe signal DQS and a data strobe signal DQSn. The command latch enable signal CLE is a signal indicating that the data signal DQ(7:0) is a command. The address latch enable signal ALE is a signal indicating that the data signal DQ(7:0) is an address. The write enable signal WEn is a signal instructing a counterpart device to acquire a command or an address transferred as the data signal DQ(7:0). The read enable signal RE/REn is a signal instructing a counterpart device to output the data signal DQ(7:0). The read enable signal RE/REn is a differential signal constituted by a read enable signal RE and a read enable signal REn. The ready/busy signal R/Bn_1 and the ready/busy signal R/Bn_2 are signals indicating whether it is a ready state in which receiving of a command is waited for or a busy state in which even when a command is received, the command cannot be executed. Note that the configuration of the signal line that transfers the ready/busy signal R/Bn in the channel CH0 is not limited to the example described above. For example, regarding the ready/busy signal R/Bn, the channel CH0 may include one signal line for transferring one ready/busy signal R/Bn generated by wired OR connection or the like from the ready/busy signal R/Bn_1 related to the channel CH1 and the ready/busy signal R/Bn_2 related to the channel CH2.

Each of the channels CH1 and CH2 can transfer and receive a signal group of the same type as the signal group of the channel CH0. That is, each of the channels CH1 and CH2 includes a signal line that transfers the chip enable signal CEn, a signal line that transfers the command latch enable signal CLE, a signal line that transfers the address latch enable signal ALE, a signal line that transfers the write enable signal WEn, a signal line that transfers the read enable signal RE/REn, a signal line that transfers the data strobe signal DQS/DQSn, a signal line group that transfers the data signal DQ(7:0), and a signal line that transfers the ready/busy signal R/Bn.

The bridge chip BC includes a first interface 101, two second interfaces 102, a controller 103, and a buffer memory 104.

The first interface 101 is a PHY circuit that transfers and receives an electric signal to and from the memory controller MC via the channel CH0.

A second interface 102-1 of the two second interfaces 102 is a PHY circuit that transfers and receives electric signals to and from four memory chips CP1-0 to CP1-3 via the channel CH1. A second interface 102-2 of the two second interfaces 102 is a PHY circuit that transfers and receives electric signals to and from four memory chips CP2-0 to CP2-3 via the channel CH2.

The buffer memory 104 is a memory that temporarily stores data transferred between the memory controller MC and the memory chip CP. The buffer memory 104 may be implemented by a dynamic random access memory (DRAM) or a static random access memory (SRAM). Note that the type of memory implementing the buffer memory 104 is not limited thereto.

The controller 103 is disposed between the first interface 101 and the two second interfaces 102. The controller 103 controls transferring/receiving of information between the first interface 101 and the two second interfaces 102 by using the buffer memory 104.

The controller 103 includes a command decoder 111, a signal transfer/processing circuit 112, and a register 113.

The command decoder 111 analyzes a command received from the memory controller MC via the channel CH0. The command decoder 111 is capable of issuing a command to the memory chip CP in accordance with the analysis result.

The register 113 is a memory that stores various types of information (referred to as operation control information) for controlling the operation of the bridge chip BC. The operation control information is not limited to specific information. For example, the operation control information may be setting information used for controlling the bridge chip BC. The setting information is transferred from the memory controller MC and stored in the bridge chip BC. The controller 103 performs an operation according to the setting information.

The signal transfer/processing circuit 112 transfers signals between the first interface 101 and the two second interfaces 102 and executes processing on the signals. In particular, in a case where a command received from the memory controller MC via the channel CH0 is found to be a data transfer command by analysis performed by the command decoder 111, the signal transfer/processing circuit 112 performs duplication, transfer, and operation of a command sequence including a command and address information.

Each memory chip CP is given a logical unit number (LUN) which is a unique identification number in the semiconductor memory device 1. The bridge chip BC manages a plurality of (here, two) memory chips CP, which are connected to different channels, as one group on the basis of a simple relationship using the LUN. Hereinafter, such a group is referred to as a chip group. Note that the LUN is an example of the chip identification number.

The signal transfer/processing circuit 112 duplicates the command sequence and transfers via different channels the two command sequences obtained by the duplication, such that data transfer to the two memory chips CP belonging to one chip group can be executed simultaneously (in parallel).

When the two command sequences are transferred, the signal transfer/processing circuit 112 controls the address information included in one of the command sequences in such a way that each command sequence reaches each of the two memory chips CP belonging to the one chip group.

Figure 2:
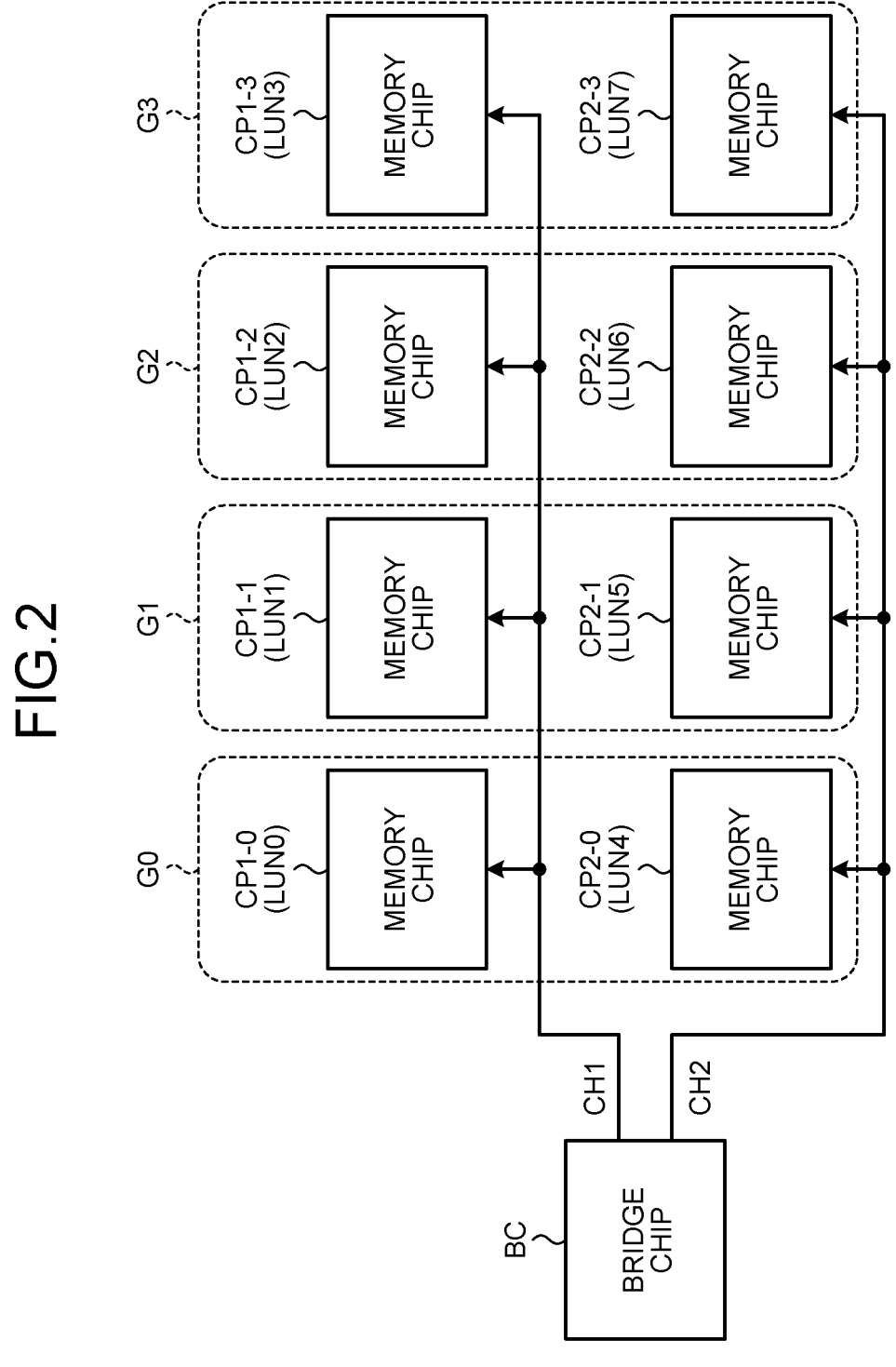
FIG. 2 is a schematic diagram for describing a logical unit number (LUN) given to each memory chip and a chip group according to the first embodiment.

FIG. 2 is a schematic diagram for describing the LUN given to each memory chip CP and the chip group according to the first embodiment.

In the example illustrated in FIG. 2, LUN0 is given to the memory chip CP1-0, LUN1 is given to the memory chip CP1-1, LUN2 is given to the memory chip CP1-2, LUN3 is given to the memory chip CP1-3, LUN4 is given to the memory chip CP2-0, LUN5 is given to the memory chip CP2-1, LUN6 is given to the memory chip CP2-2, and LUN7 is given to the memory chip CP2-3.

A chip group G0 contains the memory chip CP1-0 to which LUN0 is given and the memory chip CP2-0 to which LUN4 is given. A chip group G1 contains the memory chip CP1-1 to which LUN1 is given and the memory chip CP2-1 to which LUN5 is given. A chip group G2 contains the memory chip CP1-2 to which LUN2 is given and the memory chip CP2-2 to which LUN6 is given. A chip group G3 contains the memory chip CP1-3 to which LUN3 is given and the memory chip CP2-3 to which LUN7 is given.

In short, one chip group Gi contains a memory chip CP to which LUNi is given and a memory chip CP to which LUN(i+4) is given. Note that "i" is an integer from 0 to 3. If the LUN of a certain memory chip CP is known, the signal transfer/processing circuit 112 can identify another memory chip CP belonging to the same chip group as the certain memory chip CP by a simple arithmetic operation using the LUN.

Figure 3:
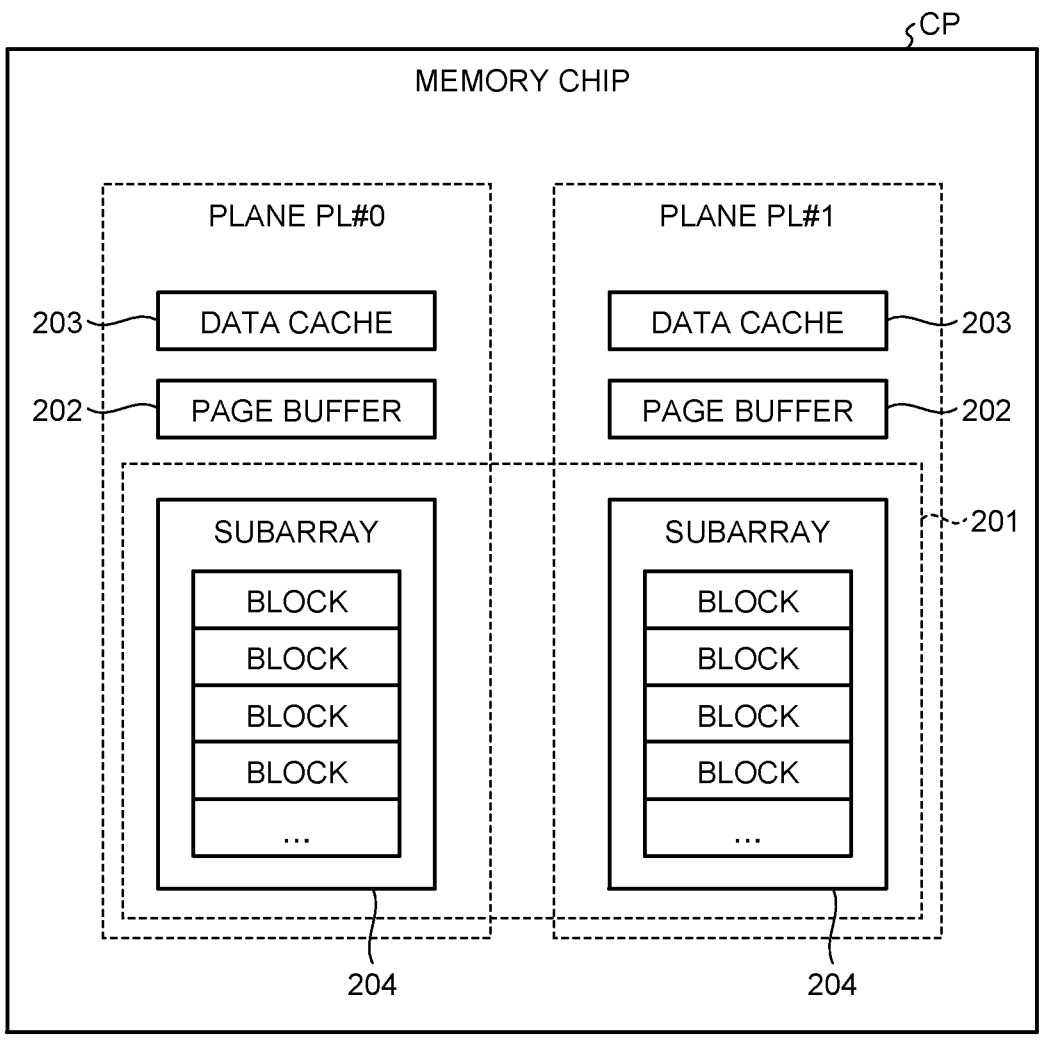
FIG. 3 is a schematic diagram illustrating an example of a configuration of the memory chip according to the first embodiment.

FIG. 3 is a schematic diagram illustrating an example of a configuration of the memory chip CP according to the first embodiment.

The memory chip CP includes a memory cell array 201 divided into two subarrays 204, two page buffers 202, and two data caches 203. The two page buffers 202 and the two data caches 203 each include, for example, a static random access memory (SRAM). The two page buffers 202 and the two data caches 203 may be implemented by flip-flops.

Access to the memory cell array 201 includes write (also referred to as program), read, and erase. Each subarray 204 constitutes one plane together with one of the two page buffers 202 and one of the two data caches 203. That is, the memory chip CP includes two planes.

The two planes are operable independently of each other. Each plane in each memory chip CP is identified by a plane number (PL#). A plane with a plane number X (X is an integer of 0 or more) is referred to as a plane PL#X. The memory chip CP includes a plane PL#0 and a plane PL#1.

Note that the number of planes included in the memory chip CP is not limited to two, but equal to or more than three. The memory chip CP does not need to be divided into a plurality of planes.

A series of operations, in which the memory chip CP receives data input from the memory controller MC and the memory chip CP writes the input data to the memory cell array 201, is referred to as a write operation in the present specification. The data input from the memory controller MC to the memory chip CP is also referred to as write data. A series of operations in which the memory chip CP reads data from the memory cell array 201 and outputs the data to the memory controller MC is referred to as a read operation. The data output from the memory chip CP to the memory controller MC is also referred to as read data.

In the write operation, the memory chip CP receives the write data input from the outside (in this case, the bridge chip BC) in the data cache 203. An operation of inputting the write data to the data cache 203 is also referred to as a data-in operation. After the data-in operation, the memory chip CP transfers the write data received in the data cache 203 to the page buffer 202, and writes the write data from the page buffer 202 to the memory cell array 201 after completion of the transfer. An operation of writing data from the page buffer 202 to the memory cell array 201 is also referred to as a program operation.

In the read operation, the memory chip CP first transfers the read data from the memory cell array 201 to the page buffer 202. An operation of transferring the read data from the memory cell array 201 to the page buffer 202 is also referred to as a page read operation. The memory chip CP transfers the read data stored in the page buffer 202 by the page read operation from the page buffer 202 to the data cache 203. Then, the memory chip CP outputs the read data from the data cache 203 to the outside (in this case, the bridge chip BC). An operation of outputting the read data from the data cache 203 to the outside is also referred to as a data-out operation.

Each subarray 204 includes a plurality of blocks. Pieces of data written to one block are erased collectively.

Note that each block includes a plurality of pages. The page is a storage region in units of writing of data by the program operation and in units of reading of data by the page read operation with respect to the subarray 204. Each data cache 203 and each page buffer 202 have a storage capacity of at least one page so that the program operation and the page read operation can be performed in units of pages with respect to the subarray 204.

In the first embodiment, when a command sequence for data transfer in which a target memory chip CP is designated is received from the memory controller MC, the bridge chip BC interprets all memory chips CP included in a chip group to which the target memory chip CP belongs as targets. Then, the bridge chip BC transfers the command sequence for data transfer to all the memory chips CP included in the chip group.

The command sequence for data transfer includes a data-in command sequence for causing the memory chip CP to perform the data-in operation, a page read command sequence for causing the memory chip CP to perform the page read operation, and a data-out command sequence for causing the memory chip CP to perform the data-out operation.

Each command sequence includes a command in addition to the command sequence for data transfer. The command decoder 111 determines whether or not the received command sequence is a command sequence for data transfer based on a command included in the command sequence. In addition, the command decoder 111 determines a type of data transfer based on the command included in the command sequence. The type of data transfer includes the data-in operation, the page read operation, or the data-out operation.

Figure 4:
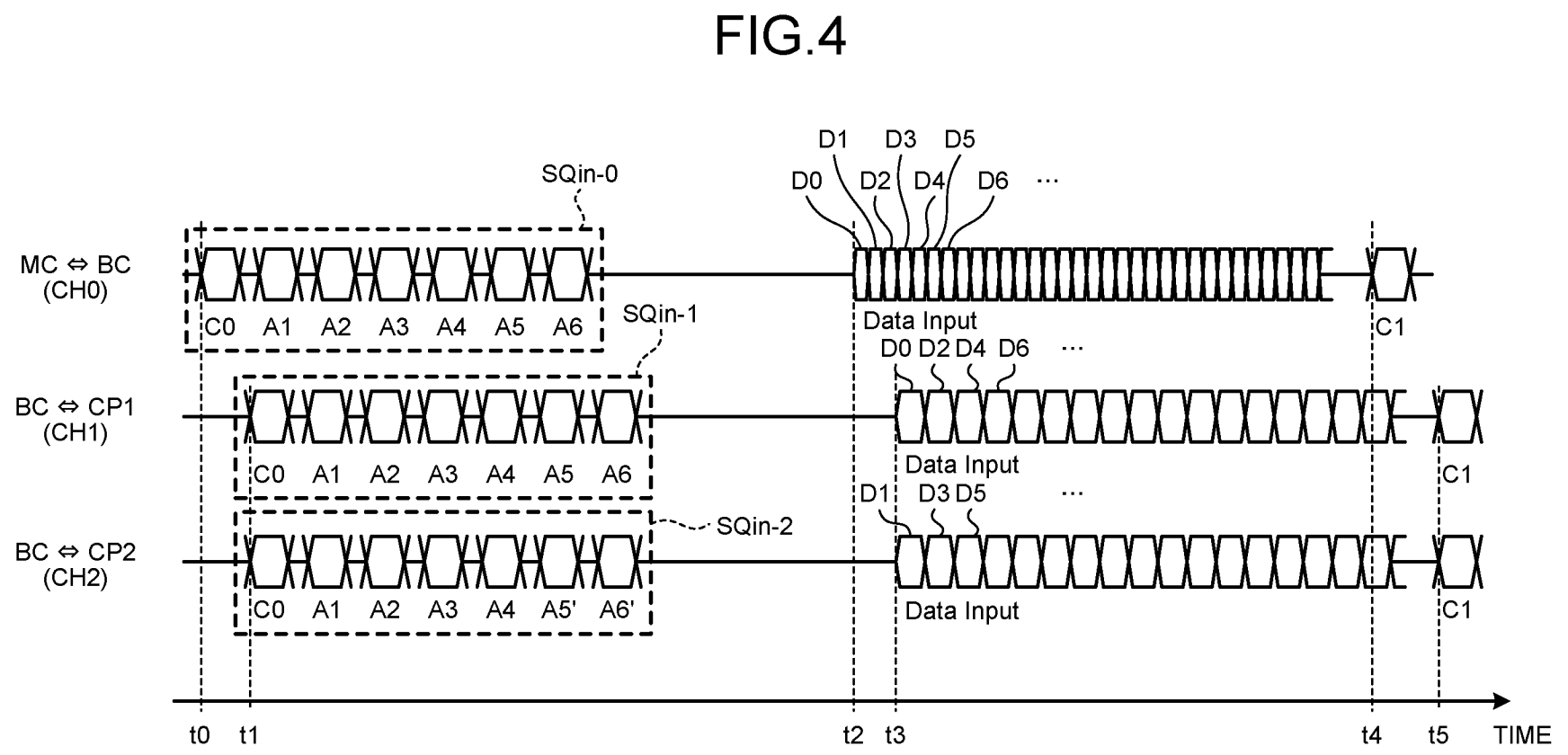

FIG. 4 is a timing chart illustrating an example of information transferred via each channel when an instruction for the write operation is given in the memory system SYS according to the first embodiment. FIG. 4 illustrates a waveform of the data signal DQ(7:0) transferred via the channel CH0, a waveform of the data signal DQ(7:0) transferred via the channel CH1, and a waveform of the data signal DQ(7:0) transferred via the channel CH2. The same applies to some timing charts described below.

The memory controller MC first inputs a data-in command sequence SQin-0 to the bridge chip BC (time t0). The data-in command sequence SQin-0 includes a data-in command C0 and address information. The data-in command C0 is a command requesting the data-in operation. In this example, the address information is transferred as 1-byte address segments A1 to A6, each being information of a minimum unit transferred by eight data signal DQ(7:0). Note that the configuration of the data-in command sequence SQin-0 is compliant with the toggle DDR standard.

In the bridge chip BC, when the command decoder 111 interprets the data-in command C0, the signal transfer/processing circuit 112 generates two data-in command sequences SQin-1 and SQin-2 by duplicating the data-in command sequence SQin-0. Then, the signal transfer/processing circuit 112 starts transfer of the two data-in command sequences SQin-1 and SQin-2 (time t1). The data-in command sequence SQin-1 is transferred to a memory chip CP via the channel CH1, and the data-in command sequence SQin-2 is transferred to another memory chip CP via the channel CH2.

The signal transfer/processing circuit 112 specifies another memory chip CP belonging to the same chip group as the memory chip CP indicated by the address information, based on the address information included in the data-in command sequence SQin-0. Then, the address information included in one of the two data-in command sequences SQin-1 and SQin-2 is replaced with address information indicating another memory chip CP. Hereinafter, in the description of the first embodiment, the memory chip CP indicated by the address information included in the command sequence transferred from the memory controller MC to the bridge chip BC is referred to as a first memory chip CP. Another memory chip CP belonging to the same chip group as the first memory chip CP is referred to as a second memory chip CP. The first memory chip CP is an example of the first chip. The second memory chip CP is an example of the second chip.

In a case where a memory chip CP1 connected to the channel CH1 corresponds to the first memory chip CP, the signal transfer/processing circuit 112 does not perform replacement of the address information in the data-in command sequence SQin-1 but performs replacement of the address information in the data-in command sequence SQin-2. As a result, the first memory chip CP can receive the data-in command sequence SQin-1, and the second memory chip CP can receive the data-in command sequence SQin-2.

In a case where a memory chip CP2 connected to the channel CH2 corresponds to the first memory chip CP, the signal transfer/processing circuit 112 does not perform replacement of the address information in the data-in command sequence SQin-2 but performs replacement of the address information in the data-in command sequence SQin-1. As a result, the first memory chip CP can receive the data-in command sequence SQin-2, and the second memory chip CP can receive the data-in command sequence SQin-1.

According to the example illustrated in FIG. 4, the address segments A1 to A6 of six bytes are included as the address information in the data-in command sequence SQin- 0. The signal transfer/processing circuit 112 performs replacement of the value of the LUN for one or more address segments including the LUN among the address segments A1 to A6 of six bytes.

Figure 5:
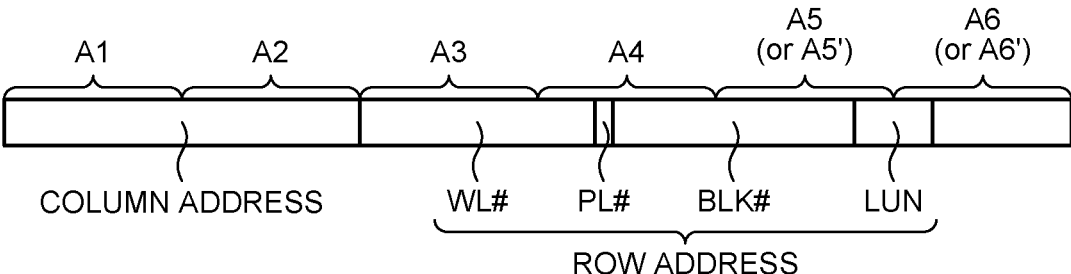
FIG. 5 is a schematic diagram illustrating an example of a configuration of address information included and transferred in a data-in command sequence according to the first embodiment.

FIG. 5 is a schematic diagram illustrating an example of a configuration of the address information included and transferred in the data-in command sequence according to the first embodiment. Note that the configuration of the address information is also commonly used in the page read command sequence and the data-out command sequence to be described later.

In the example illustrated in FIG. 5, the address information has a configuration in which a column address and a row address are arranged in this order. The row address has a configuration in which a word line number (WL#), the plane number (PL#), a block number (BLK#), and the LUN are arranged in this order. Note that the block number is an identification number unique within a plane (or within a memory chip CP that is not divided into a plurality of planes), and is an example of a block identification number.

The address segments A1 and A2 include the column address in the address information. The address segment A3 includes part of a bit string of the word line number. The address segment A4 includes the remaining part of the bit string of the word line number, the plane number, and part of a bit string of the block number. The address segment A5 includes the remaining part of the bit string of the block number and part of a bit string of the LUN. The address segment A6 includes the remaining part of the bit string of the LUN.

When transferring the command sequence addressed to the second memory chip CP, the signal transfer/processing circuit 112 replaces, with a value indicating the second memory chip CP, a value of the LUN indicating the first memory chip CP and being included in the address segments A5 and A6 out of the address segments A1 to A6 of six bytes. The address segments A5 and A6 after the replacement of the LUN value are referred to as address segments A5' and A6'.

In the example illustrated in FIG. 4, a memory chip CP1 connected to the channel CH1 corresponds to the first memory chip CP. Therefore, in the data-in command sequence SQin-1, the address information received by the bridge chip BC is transferred as it is, and in the data-in command sequence SQin-2, the address information in which the address segments A5 and A6 are replaced with the address segments A5' and A6' is transferred.

After inputting the data-in command sequence SQin-0 to the bridge chip BC, the memory controller MC starts inputting the write data (time t2). The write data addressed to the first memory chip CP (referred to as first write data) and the write data addressed to the second memory chip CP (referred to as second write data) are alternately input to the bridge chip BC by every predetermined size (here, for example, one byte). The bridge chip BC distributes the input write data to the channels CH1 and CH2 by each byte.

In the example illustrated in FIG. 4, data segments D0, D1, D2, D3, D4, D5, D6, etc. each having a size of one byte are transferred via the channel CH0. The data segments D0, D2, D4, D6, etc. are transferred via the channel CH1, and the data segments D1, D3, D5, etc. are transferred via the channel CH2.

As described above, the bridge chip BC alternately receives the first write data and the second write data by a given size. Therefore, the transfer of the first write data to the first memory chip CP and the transfer of the second write data to the second memory chip CP can be started immediately after start of the receiving of the write data.

Note that the transfer rate of the write data transferred via the channel CH0 is multiple times the transfer rate of write data transferred via each of the channels CH1 and CH2. Here, as an example, the transfer rate of the data transferred via the channel CH0 is twice the transfer rate of the data transferred via each of the channels CH1 and CH2.

The bridge chip BC starts the transfer of the first write data to the first memory chip CP and the transfer of the second write data to the second memory chip CP immediately after and simultaneously with the start of the receiving of the write data from the memory controller MC (time t3).

After inputting the write data to the bridge chip BC, the memory controller MC inputs a program command C1 to the bridge chip BC (time t4). The program command C1 is a command for giving an instruction for the start of the program operation.

In the bridge chip BC, when the command decoder 111 interprets the program command C1, the signal transfer/processing circuit 112 generates two program commands C1 by duplicating the program command C1. Then, the signal transfer/processing circuit 112 simultaneously transfers one of the two program commands C1 to the first memory chip CP and transfers the other of the two program commands C1 to the second memory chip CP (time t5). The first memory chip CP and the second memory chip CP simultaneously receive the program command C1, thereby simultaneously starting the program operation.

Figure 6:
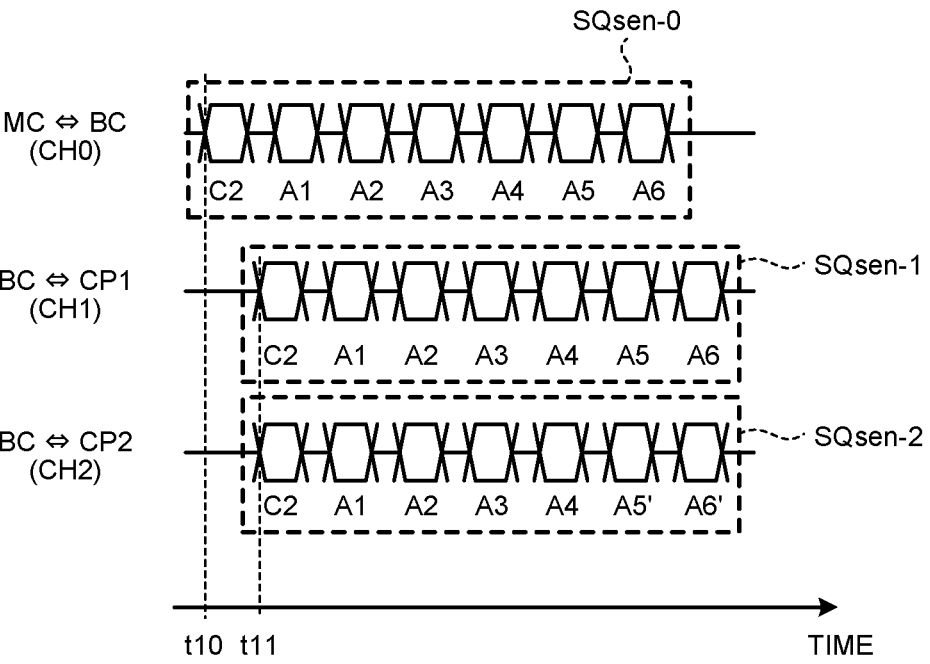
FIG. 6 is a timing chart illustrating an example of information transferred via each channel when an instruction for a page read operation is given in the memory system according to the first embodiment.

FIG. 6 is a timing chart illustrating an example of information transferred via each channel when an instruction for the page read operation is given in the memory system SYS according to the first embodiment.

The memory controller MC inputs a page read command sequence SQsen-0 to the bridge chip BC (time t10). The page read command sequence SQsen-0 includes a page read command C2 and address information (address segments A1 to A6). The page read command C2 is a command for requesting the page read operation. The configuration of the page read command sequence SQsen-0 is compliant with the toggle DDR standard.

In the bridge chip BC, when the command decoder 111 interprets the page read command C2, the signal transfer/processing circuit 112 generates two page read command sequences SQsen-1 and SQsen-2 by duplicating the page read command sequence SQsen-0. Then, the transfer of the two page read command sequences SQsen-1 and SQsen-2 is started (time t11). The page read command sequence SQsen-1 is transferred to a memory chip CP via the channel CH1, and the data-in command sequence SQin-2 is transferred to another memory chip CP via the channel CH2.

Similar to the case of the write operation, the signal transfer/processing circuit 112 specifies the second memory chip CP based on the address information included in the page read command sequence SQsen-0. Then, the address information included in one of the two page read command sequences SQsen-1 and SQsen-2 is replaced with address information indicating the second memory chip CP.

In the example illustrated in FIG. 6, a memory chip CP1 connected to the channel CH1 corresponds to the first memory chip CP. Therefore, in the page read command sequence SQsen-1, the received address information is transferred as it is, and in the page read command sequence SQsen-2, the address information in which the address segments A5 and A6 are replaced with the address segments A5' and A6' including the LUN indicating the second memory chip CP is transferred.

The first memory chip CP starts the page read operation in response to the receiving of the page read command sequence SQsen-1. The second memory chip CP starts the page read operation in response to the receiving of the page read command sequence SQsen-2.

Figure 7:
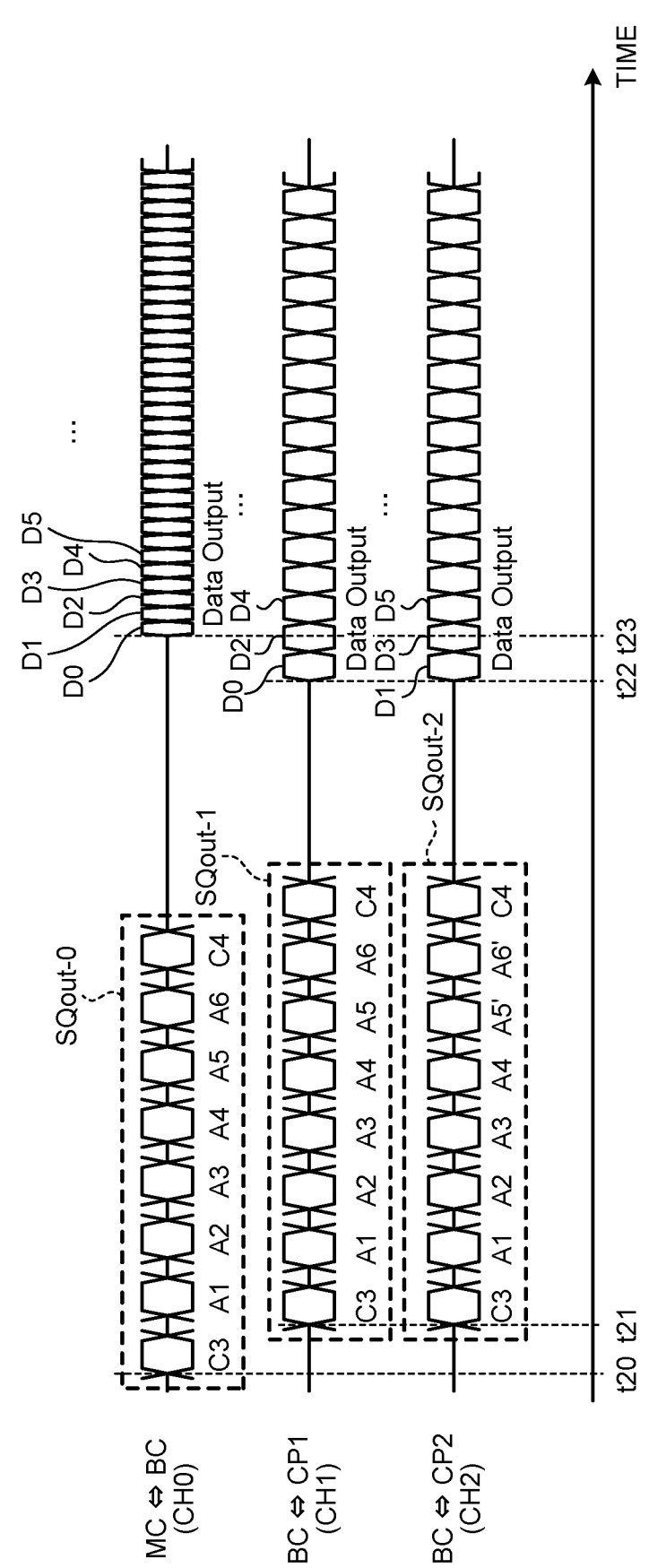
FIG. 7 is a timing chart illustrating an example of information transferred via each channel when an instruction for a data-out operation is given in the memory system according to the first embodiment.

FIG. 7 is a timing chart illustrating an example of information transferred via each channel when an instruction for the data-out operation is given in the memory system SYS according to the first embodiment.

The memory controller MC inputs a data-out command sequence SQout-0 to the bridge chip BC (time t20). The data-out command sequence SQout-0 includes a data-out command C3, address information (address segments A1 to A6), and a preparation command C4. The data-out command C3 is a command requesting the data-out operation. The preparation command C4 is a command for giving an instruction for preparation of the data-out operation. The configuration of the data-out command sequence SQout-0 is compliant with the toggle DDR standard.

In the bridge chip BC, when the command decoder 111 interprets the data-out command C3, the signal transfer/processing circuit 112 generates two data-out command sequences SQout-1 and SQout-2 by duplicating the data-out command sequence SQout-0. Then, the transfer of the two data-out command sequences SQout-1 and SQout-2 is started (time t21). The data-out command sequence SQout-1 is transferred to a memory chip CP via the channel CH1, and the data-out command sequence SQout-2 is transferred to another memory chip CP via the channel CH2.

Similar to the case of the write operation, the signal transfer/processing circuit 112 specifies the second memory chip CP based on the address information included in the data-out command sequence SQout-0. Then, the address information included in one of the two data-out command sequences SQout-1 and SQout-2 is replaced with the address information indicating the second memory chip CP.

In the example illustrated in FIG. 7, a memory chip CP1 connected to the channel CH1 corresponds to the first memory chip CP. Therefore, in the data-out command sequence SQout-1, the received address information is transferred as it is, and in the data-out command sequence SQout-2, the address information in which the address segments A5 and A6 are replaced with the address segments A5' and A6' including the LUN indicating the second memory chip CP is transferred.

After completion of the transfer of the data-out command sequences SQout-1 and SQout-2, the bridge chip BC simultaneously starts toggling of the read enable signal RE/REn transferred via the channels CH1 and CH2 (not illustrated). Then, the output of the read data (referred to as first read data) from the first memory chip CP and the output of the read data (referred to as second read data) from the second memory chip CP start (time t22).

The bridge chip BC acquires data by one byte from a received portion of each of the first read data and the second read data. The bridge chip BC continuously performs, for example, transfer of 1-byte data acquired from the first read data to the memory controller MC and transfer of 1-byte data acquired from the second read data to the memory controller MC (time t23). Thereafter, the bridge chip BC alternately performs the transfer of the 1-byte data acquired from the first read data to the memory controller MC and the transfer of the 1-byte data acquired from the second read data to the memory controller MC. It should be noted that the bridge chip BC receives toggling of the read enable signal RE/REn transferred via the channel CH0 from the memory controller MC (not illustrated). The bridge chip BC starts the output of the 1-byte data acquired from the first read data to the memory controller MC and the transfer of the 1-byte data acquired from the second read data to the memory controller MC in accordance with the toggling of the read enable signal RE/REn.

For example, in a case where the 1-byte data segments D0, D2, and D4 included in the first read data are received in this order and the 1-byte data segments D1, D3, and D5 included in the second read data are received in this order, the bridge chip BC transfers the data segments D0, D1, D2, D3, D4, and D5 to the memory controller MC in this order. Note that the transfer rate of the data transferred via the channel CH0 is twice the transfer rate of the data transferred via each of the channels CH1 and CH2.

As described above, the bridge chip BC alternately transfers the first read data and the second read data to the memory controller MC by a given size (one byte in this case). Therefore, it is possible to immediately start the transfer of the first read data and the second read data to the memory controller MC after the receiving of the first read data and the second read data is started. It shoud be noted that the bridge chip BC starts the output of the 1-byte data acquired from the first read data to the memory controller MC and the transfer of the 1-byte data acquired from the second read data to the memory controller MC in accordance with the toggling of the read enable signal RE/REn transferred from the memory controller MC (not illustrated). The bridge chip BC stores received data (that is, the first read data and the second read data) into the buffer memory 104, then start the output of the data from the buffer memory 104 in accordance with the toggling of the read enable signal RE/REn.

FIG. 8 is a flowchart illustrating an example of an operation related to processing for the command sequence for data transfer described above in the bridge chip BC according to the first embodiment.

In the bridge chip BC, when receiving of the command sequence for data transfer (referred to as a first command sequence in the description of the first embodiment) from the memory controller MC is started (S101), the signal transfer/processing circuit 112 starts generation of two command sequences (referred to as second command sequences in the description of the first embodiment) by duplicating the first command sequence (S102). Then, the signal transfer/processing circuit 112 starts transfer of the second command sequences via the channel CH1 and the channel CH2, respectively (S103).

The first command sequence includes the data-in command sequence, the page read command sequence, or the data-out command sequence.

While receiving the first command sequence, the signal transfer/processing circuit 112 detects the address segments A4 and A5 included in the first command sequence (S104). The signal transfer/processing circuit 112 specifies a LUN (referred to as a second LUN in the description of FIG. 8) of the memory chip CP (the second memory chip CP) belonging to the same chip group as the memory chip CP (the first memory chip CP) indicated by the LUN (referred to as a first LUN in the description of FIG. 8) included in the address segments A4 and A5 (S105).

The signal transfer/processing circuit 112 replaces the address segments A4 and A5 included in the second command sequence to be transferred to the second memory chip CP with address segments A4' and A5' including the second LUN (S106). As a result, the second command sequence including the address segments A4' and A5' is transferred to the second memory chip CP.

Subsequently, the receiving of the first command sequence, the generation of the two second command sequences, and the transfer of the two second command sequences are sequentially completed (S107), and the processing of the command sequence for data transfer in the bridge chip BC ends.

Note that the second command sequence, which includes the address segments A4' and A5' and is transferred to the second memory chip CP, is referred to as a third command sequence in the description of the first embodiment.

As described above, according to the first embodiment, in a case where the first command sequence is received from the memory controller MC, the bridge chip BC duplicates the first command sequence to generate two second command sequences. Then, the bridge chip BC transfers one of the two second command sequences to the first memory chip CP indicated by the address information in the first command sequence. In addition, the bridge chip BC transfers another one of the two second command sequences to the second memory chip CP as the third command sequence including address information in which a value of the LUN has been replaced with a value indicating the second memory chip CP.

Therefore, the memory controller MC can control plural data transfers between the bridge chip BC and the two memory chips CP by inputting one command sequence. That is, the semiconductor memory device 1 has a configuration capable of simultaneously controlling plural data transfers between the bridge chip BC and the memory chips CP.

In addition, in the first embodiment, the bridge chip BC performs simultaneously (in parallel) the transfer of the second command sequence and the transfer of the third command sequence.

Therefore, the data transfer for the first memory chip CP and the data transfer for the second memory chip CP are performed simultaneously (in parallel).

In addition, in the first embodiment, when the receiving of the first command sequence is started, the bridge chip BC starts the transfer of the second command sequence to the first memory chip CP and the transfer of the third command sequence to the second memory chip CP before the receiving of the first command sequence is completed.

Therefore, a time required for processing the first command sequence received from the memory controller MC in the semiconductor memory device 1 is reduced.

Note that the bridge chip BC may start the transfer of the second command sequence and the transfer of the third command sequence after the receiving of the first command sequence is completed.

In the first embodiment, the signal transfer/processing circuit 112 acquires the value of LUN indicating the second memory chip CP by an arithmetic operation using the value of LUN indicating the first memory chip CP.

Therefore, the signal transfer/processing circuit 112 can specify a configuration of each chip group without using information having a large size such as a table. In addition, it is possible to easily share an arithmetic operation method between the memory controller MC and the semiconductor memory device 1.

Moreover, in the first embodiment, the bridge chip BC generates two second command sequences by duplicating the first command sequence. Then, the bridge chip BC generates the third command sequence by replacing, with a value indicating the second memory chip CP, a value of the LUN indicating the first memory chip CP in the address information included in one of the two second command sequences.

Note that the method of generating the third command sequence is not limited thereto. The bridge chip BC may store the first command sequence in the buffer memory 104 and generate the second command sequence and the third command sequence on the buffer memory 104.

Second Embodiment

In a second embodiment, a bridge chip is configured to be able to process a command sequence including a plurality of sets of address information so as to designate, by a memory controller, a column address, a word line number, a plane number, and a block number for each of memory chips that are targets of simultaneous data transfer.

Hereinafter, contents of the second embodiment differing from those of the first embodiment will be described. Contents of the second embodiment that are the same as those of the first embodiment will be briefly described or omitted.

Figure 9:
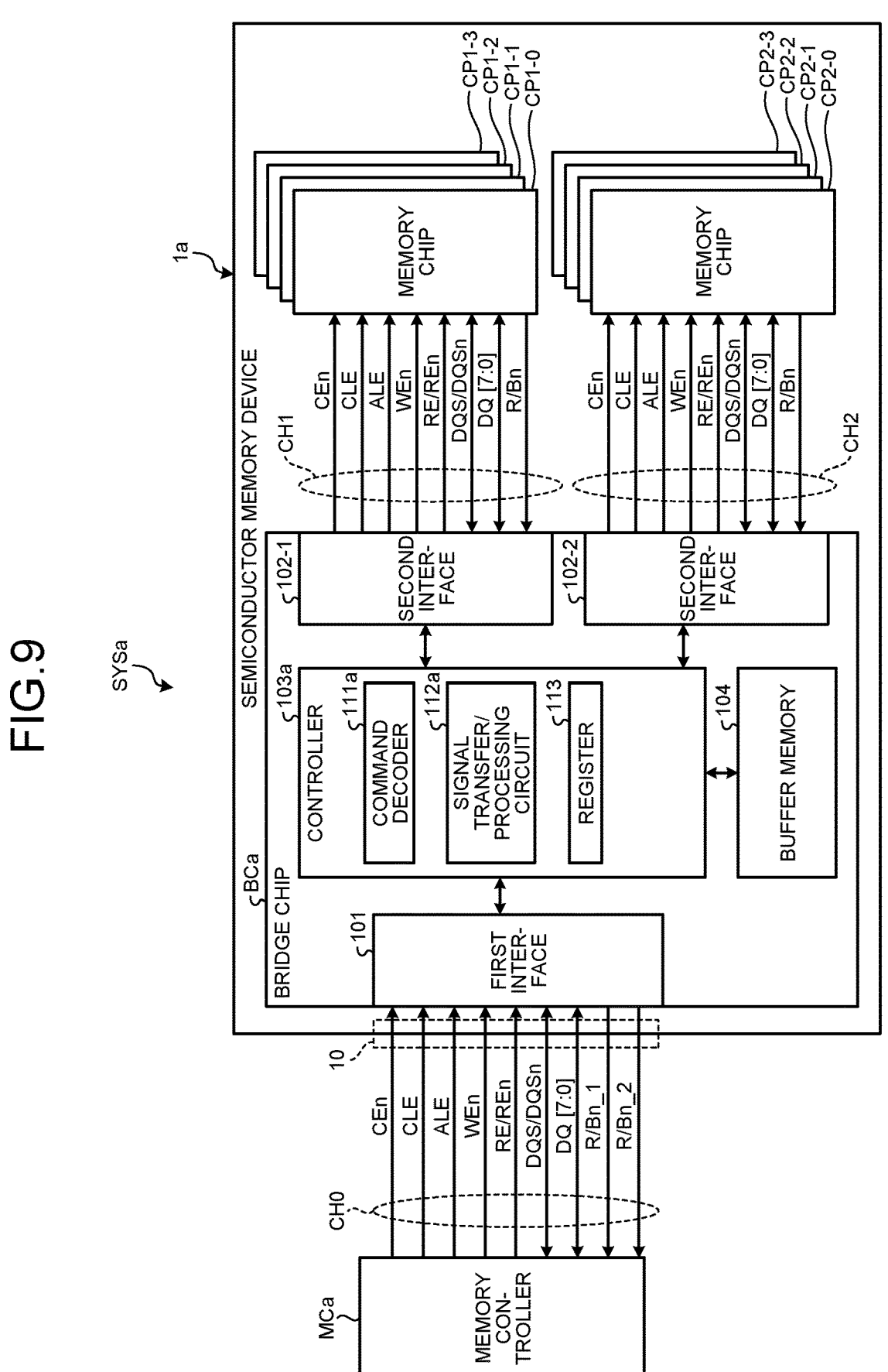
FIG. 9 is a schematic diagram illustrating an example of a memory system to which a semiconductor memory device according to a second embodiment is applied.

FIG. 9 is a schematic diagram illustrating an example of a memory system SYSa to which a semiconductor memory device 1a according to the second embodiment is applied.

The memory system SYSa includes a memory controller MCa and the semiconductor memory device 1a. The semiconductor memory device 1a includes an external terminal group 10, a bridge chip BCa, and memory chips CP1-0 to CP1-3 and CP2-0 to CP2-3. Four memory chips CP1-0 to CP1-3 are connected to the bridge chip BCa via a channel CH1, and four memory chips CP2-0 to CP2-3 are connected to the bridge chip BCa via a channel CH2.

The bridge chip BCa includes a first interface 101, two second interfaces 102, a controller 103a, and a buffer memory 104.

The controller 103a controls transferring/receiving of information between the first interface 101 and the two second interfaces 102 by using the buffer memory 104.

The controller 103a includes a command decoder 111a, a signal transfer/processing circuit 112a, and a register 113.

The command decoder 111a is capable of interpreting a parallel operation command (parallel operation command C10) in addition to the function of the command decoder 111 of the first embodiment. The parallel operation command is a command that instructs the bridge chip BCa to perform simultaneous processing on the memory chips CP. The parallel operation command C10 is, for example, a special command that is not defined in the toggle DDR standard.

Note that the parallel operation command C10 can be included in a command sequence for data transfer (that is, a data-in command sequence, a page read command sequence, and a data-out command sequence) in the second embodiment. When causing the bridge chip BCa to perform simultaneous data transfer to the memory chips CP, the memory controller MCa includes, in the command sequence, the parallel operation command and plural sets of address information indicating the memory chips CP. As an example, the group of the memory chips CP that are targets of simultaneous data transfer includes two memory chips CP connected with different channels. Therefore, the command sequence for data transfer may include two sets of address information together with the parallel operation command C10.

In a case where the parallel operation command C10 is included in a command sequence received by the memory controller MCa via a channel CH0, the signal transfer/processing circuit 112a generates two command sequences each including a different one of two sets of address information included in the command sequence. After that, the signal transfer/processing circuit 112a transfers each of the generated command sequences to a corresponding destination memory chip CP.

As described above, the destination of the plurality of command sequences generated by the signal transfer/processing circuit 112a is designated by a plurality of sets of address information included in the command sequence from the memory controller MCa. That is, the memory controller MCa directly designates a plurality of memory chips CP as targets of simultaneous data transfer. Therefore, unlike the signal transfer/processing circuit 112 according to the first embodiment, the signal transfer/processing circuit 112a does not need to store the configuration of each chip group.

Figure 10:
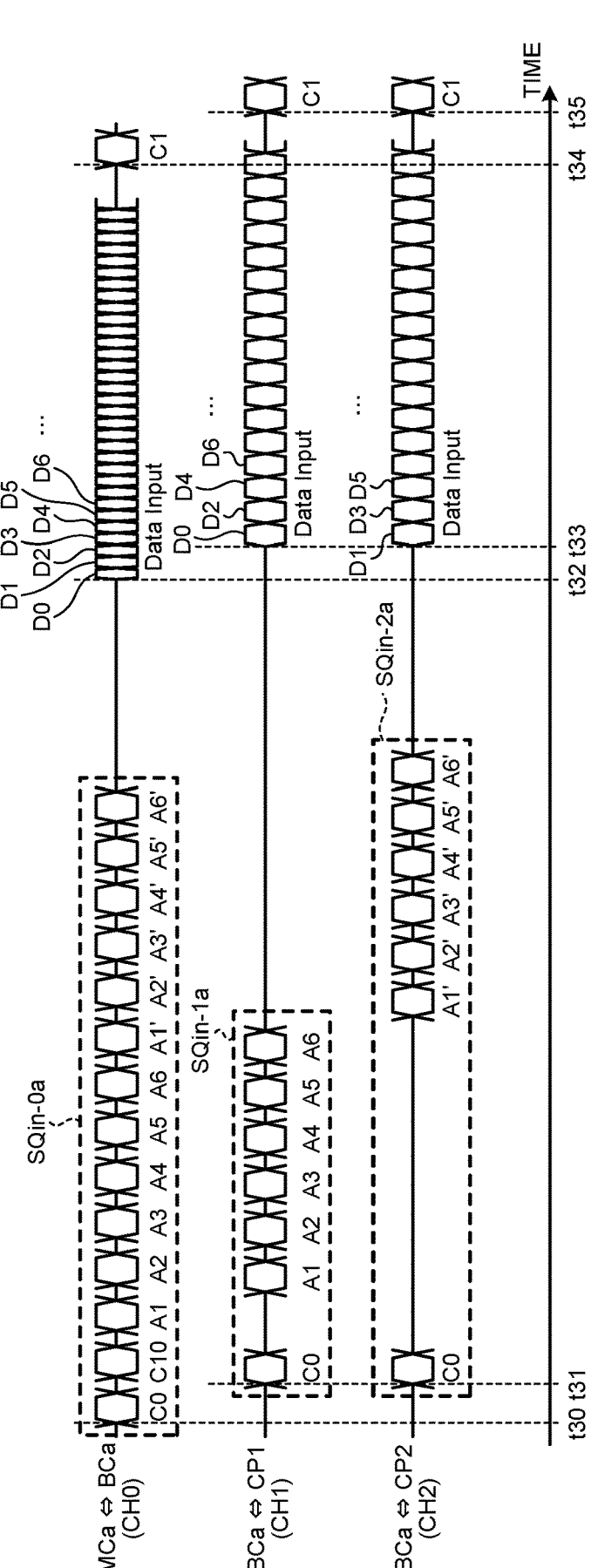
FIG. 10 is a timing chart illustrating an example of information transferred in each channel when an instruction for a write operation is given in the memory system according to the second embodiment.

FIG. 10 is a timing chart illustrating an example of information transferred in each channel when an instruction for a write operation is given in the memory system SYSa according to the second embodiment.

The memory controller MCa first inputs a data-in command sequence SQin-0a to the bridge chip BCa (time t30). Unlike the configuration defined by the toggle DDR standard, the data-in command sequence SQin-0a includes a data-in command C0, the parallel operation command C10, first address information (address segments A1 to A6), and second address information (address segments A1' to A6').

The first address information, namely, the address segments A1 to A6 have, for example, the configuration illustrated in FIG. 5. The second address information, namely, the address segments A1' to A6' have the same configuration as that of the first address information, whereas an address value in the address segments A1' to A6' to be transferred is different from that of the first address information in an optional portion out of the column address, the word line number, the plane number, and the block number in addition to the LUN.

A channel used for transferring each of the two sets of address information included in the data-in command sequence SQin-0a is preset from among the channels CH1 and CH2 by means of an optional method. As one example, it is herein assumed that the presetting is made on the bridge chip BCa such that the first address information is addressed to a memory chip CP that is connected to the channel CH1 and the second address information is addressed to a memory chip CP that is connected to the channel CH2.

In the description of the second embodiment and a modified example thereof, a memory chip CP indicated by the first address information (more precisely, the LUN included in the first address information) is referred to as a first memory chip CP. A memory chip CP indicated by the second address information (more precisely, the LUN included in the second address information) is referred to as a second memory chip CP.

In the bridge chip BCa, after the command decoder 111a interprets the data-in command C0 and the parallel operation command C10, the signal transfer/processing circuit 112a generates two data-in command sequences SQin-1a and SQin-2a by duplicating the data-in command sequence SQin-0a. Then, the signal transfer/processing circuit 112a starts transfer of the two data-in command sequences SQin-1a and SQin-2a (time t31). The data-in command sequence SQin-1a of the two data-in command sequences SQin-1a and SQin-2a is a data command sequence addressed to the first memory chip CP. The data-in command sequence SQin-2a is a data command sequence addressed to the second memory chip CP.

The signal transfer/processing circuit 112a masks the parallel operation command C10 when transferring the two data-in command sequences SQin-1a and SQin-2a. The signal transfer/processing circuit 112a masks the second address information when transferring the data-in command sequence SQin-1a. The signal transfer/processing circuit 112a masks the first address information when transferring the data-in command sequence SQin-2a.

Therefore, each of the data-in command sequences SQin-1a and SQin-2a is transferred to the corresponding destination memory chip CP as a signal having a configuration compliant with the toggle DDR standard and including the data-in command C0 and a set of address information.

Note that the method of masking the parallel operation command C10 and the address information is not limited to a specific method. For example, the signal transfer/processing circuit 112a may transfer the duplicated data-in command sequence without toggling a data signal DQ(7:0), or may transfer it while setting a write enable signal WEn to a disabled state.

After inputting the data-in command sequence SQin-0a to the bridge chip BCa, the memory controller MCa starts inputting write data (time t32). The bridge chip BCa distributes the input write data to the channels CH1 and CH2 by each byte (time t33).

After inputting the write data to the bridge chip BCa, the memory controller MCa inputs a program command C1 to the bridge chip BCa (time t34). The signal transfer/processing circuit 112a generates two program commands C1 by duplicating the input program command C1. Then, the signal transfer/processing circuit 112a simultaneously transfers one of the two program commands C1 to the first memory chip CP and transfers the other of the two program commands C1 to the second memory chip CP (time t35). The first memory chip CP and the second memory chip CP simultaneously receive the program command C1, thereby simultaneously starting the program operation.

Figure 11:
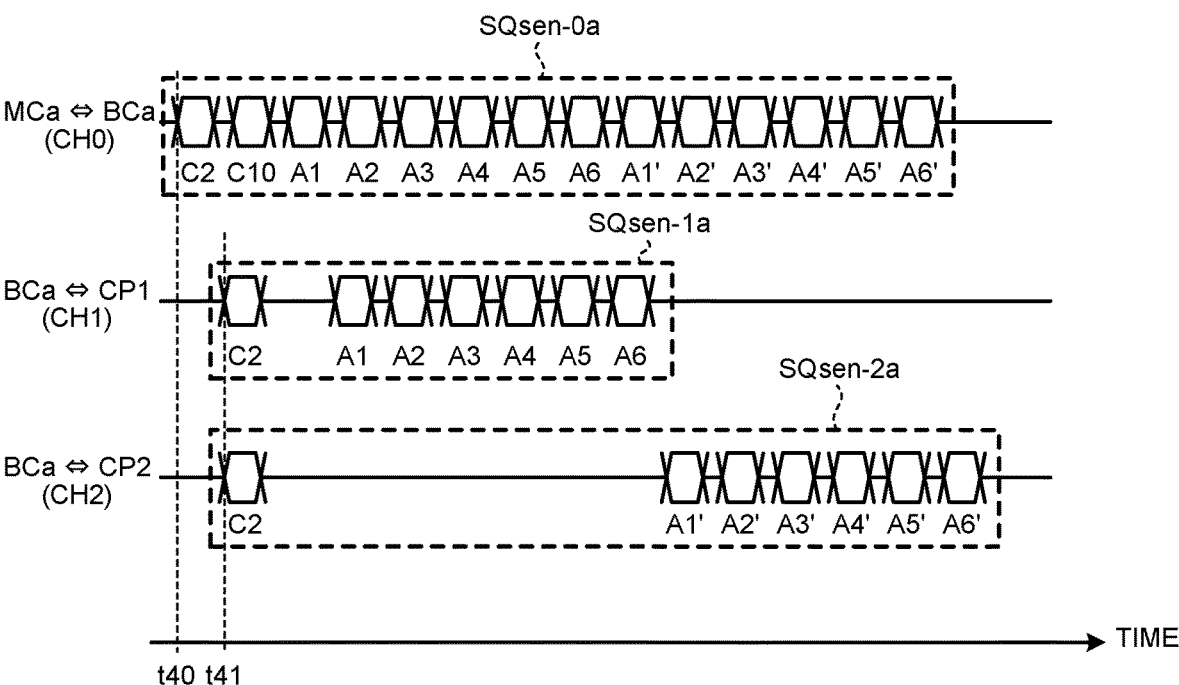
FIG. 11 is a timing chart illustrating an example of information transferred via each channel when an instruction for a page read operation is given in the memory system according to the second embodiment.

FIG. 11 is a timing chart illustrating an example of information transferred via each channel when an instruction for a page read operation is given in the memory system SYSa according to the second embodiment.

The memory controller MCa inputs a page read command sequence SQsen-0a to the bridge chip BCa (time t40). The page read command sequence SQsen-0a includes a page read command C2, the parallel operation command C10, the first address information (the address segments A1 to A6), and the second address information (the address segments A1' to A6'). Note that the configuration of the page read command sequence SQsen-0a is not compliant with the toggle DDR standard.

In the bridge chip BCa, when the command decoder 111a interprets the page read command C2 and the parallel operation command C10, the signal transfer/processing circuit 112a generates two page read command sequences SQsen-1a and SQsen-2a by duplicating the page read command sequence SQsen-0a. Then, the signal transfer/processing circuit 112a starts transfer of the two page read command sequences SQsen-1a and SQsen-2a (time t41). The page read command sequence SQsen-1a is a page read command sequence addressed to the first memory chip CP. The page read command sequence SQsen-2a is a page read command sequence addressed to the second memory chip CP.

The signal transfer/processing circuit 112a masks various types of information as in the case of transferring the data-in command sequences SQin-1a and SQin-2a. Specifically, the signal transfer/processing circuit 112a masks the parallel operation command C10 when transferring the two page read command sequences SQsen-1a and SQsen-2a. The signal transfer/processing circuit 112a masks the second address information when transferring the page read command sequence SQsen-1a. The signal transfer/processing circuit 112a masks the first address information when transferring the page read command sequence SQsen-2a.

Therefore, each of the two page read command sequences SQsen-1a and SQsen-2a is transferred to a destination memory chip CP as a signal having a configuration compliant with the toggle DDR standard and including the data-in command C0 and one set of address information.

The first memory chip CP starts the page read operation in response to the receiving of the page read command sequence SQsen-1a. The second memory chip CP starts the page read operation in response to the receiving of the page read command sequence SQsen-2a.

Figure 12:
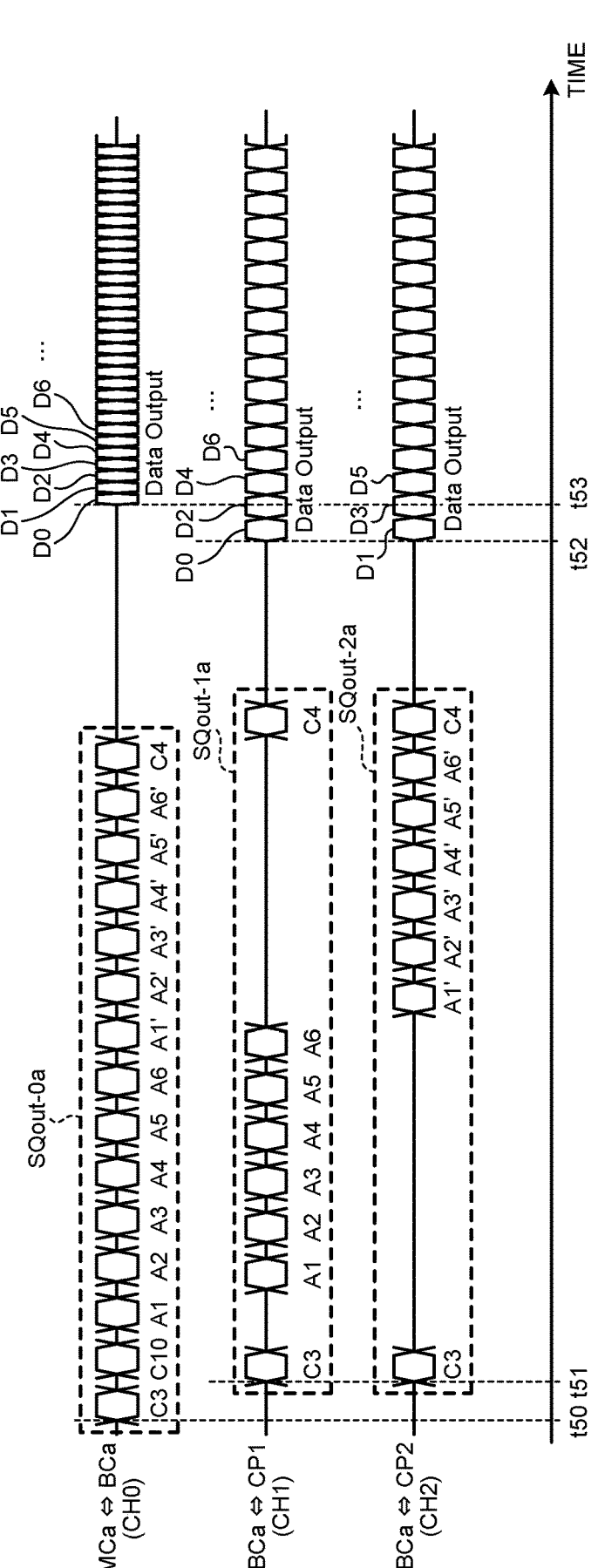
FIG. 12 is a timing chart illustrating an example of information transferred via each channel when an instruction for a data-out operation is given in the memory system according to the second embodiment.

FIG. 12 is a timing chart illustrating an example of information transferred via each channel when an instruction for a data-out operation is given in the memory system SYSa according to the second embodiment.

The memory controller MCa inputs a data-out command sequence SQout-0a to the bridge chip BCa (time t50). The data-out command sequence SQout-0a includes a data-out command C3, the parallel operation command C10, address information (address segments A1 to A6), and a preparation command C4. The configuration of the data-out command sequence SQout-0a is not compliant with the toggle DDR standard.

In the bridge chip BCa, when the command decoder 111a interprets the data-out command C3 and the parallel operation command C10, the signal transfer/processing circuit 112a generates two data-out command sequences SQout-1a and SQout-2a by duplicating the data-out command sequence SQout-0a. Then, the signal transfer/processing circuit 112a starts transfer of the two data-out command sequences SQout-1a and SQout-2a (time t51). The data-out command sequence SQout-1a is a data-out command sequence addressed to the first memory chip CP. The data-out command sequence SQout-2a is a data-out command sequence addressed to the second memory chip CP.

The signal transfer/processing circuit 112a masks various types of information as in the case of transferring the data-in command sequences SQin-1a and SQin-2a. Specifically, the signal transfer/processing circuit 112a masks the parallel operation command C10 when transferring the two data-out command sequences SQout-1a and SQout-2a. The signal transfer/processing circuit 112a masks the second address information when transferring the data-out command sequence SQout-1a. The signal transfer/processing circuit 112a masks the first address information when transferring the data-out command sequence SQout-2a.

Therefore, each of the two data-out command sequences SQout-1a and SQout-2a is transferred to a destination memory chip CP as a signal having a configuration compliant with the toggle DDR standard and including the data-out command C3, one set of address information, and the preparation command C4.

After completion of the transfer of the data-out command sequences SQout-1a and SQout-2a, the bridge chip BCa simultaneously starts toggling of the read enable signal RE/REn transferred via the channels CH1 and CH2 (not illustrated). Then, the output of the read data (referred to as first read data) from the first memory chip CP and the output of the read data (referred to as second read data) from the second memory chip CP start (time t52).

The bridge chip BCa acquires data by one byte from a received portion of each of the first read data and the second read data, and performs transfer of 1-byte data acquired from the first read data to the memory controller MCa and transfer of 1-byte data acquired from the second read data to the memory controller MCa (time t53). Thereafter, the bridge chip BCa alternately performs the transfer of the 1-byte data acquired from the first read data to the memory controller MCa and the transfer of the 1-byte data acquired from the second read data to the memory controller MCa. It should be noted that the bridge chip BC receives toggling of the read enable signal RE/REn transferred via the channel CH0 from the memory controller MC (not illustrated). The bridge chip BC starts the output of the 1-byte data acquired from the first read data to the memory controller MCa and the transfer of the 1-byte data acquired from the second read data to the memory controller MCa in accordance with the toggling of the read enable signal RE/REn.

As described above, according to the second embodiment, the bridge chip BCa can process a command sequence (referred to as a first command sequence in the description of the second embodiment), which includes the first address information and the second address information. In a case where the first command sequence is received from the memory controller MCa, the bridge chip BCa transfers a command sequence (referred to as a second command sequence in the description of the second embodiment), which includes the first address information but not include the second address information to the first memory chip CP. The bridge chip BCa transfers a command sequence (referred to as a third command sequence in the description of the second embodiment), which includes the second address information but not include the first address information to the second memory chip CP.

Therefore, the memory controller MCa can control plural data transfers between the bridge chip BCa and the two memory chips CP by inputting one command sequence. That is, the semiconductor memory device 1a has a configuration capable of simultaneously controlling plural data transfers between the bridge chip BCa and the plurality of memory chips CP.

In addition, according to the second embodiment, the bridge chip BCa generates the second command sequence and the third command sequence by duplicating the first command sequence. The bridge chip BCa masks the second address information in the second command sequence. The bridge chip BCa masks the first address information in the third command sequence.

Therefore, the bridge chip BCa can start the transfer of the second command sequence and the third command sequence before the receiving of the first command sequence is completed.

Note that, similarly to the first embodiment, the bridge chip BCa may start the transfer of the second command sequence and the transfer of the third command sequence after the receiving of the first command sequence is completed.

According to the second embodiment, the first command sequence includes the parallel operation command C10. The bridge chip BCa masks the parallel operation command C10 in the second command sequence and the third command sequence.

Therefore, the bridge chip BCa can transfer each of the second command sequence and the third command sequence to the memory chip CP as a signal having a configuration compliant with the toggle DDR standard.

Modified Example of Second Embodiment

In a modified example of the second embodiment, part of the second address information, which is common with the first address information, is omitted. The portions to be omitted are predetermined. As one example, for the second address information, a column address, a word line number, and a plane number are omitted from complete address information that contains the column address, the word line number, a LUN, the plane number, and a block number. In this configuration, the block number and the LUN may have different values between the first address information and the second address information. Note that the portions to be omitted are not limited to the above example.

In the modified example of the second embodiment, the contents different from the second embodiment will be described.

Figure 13:
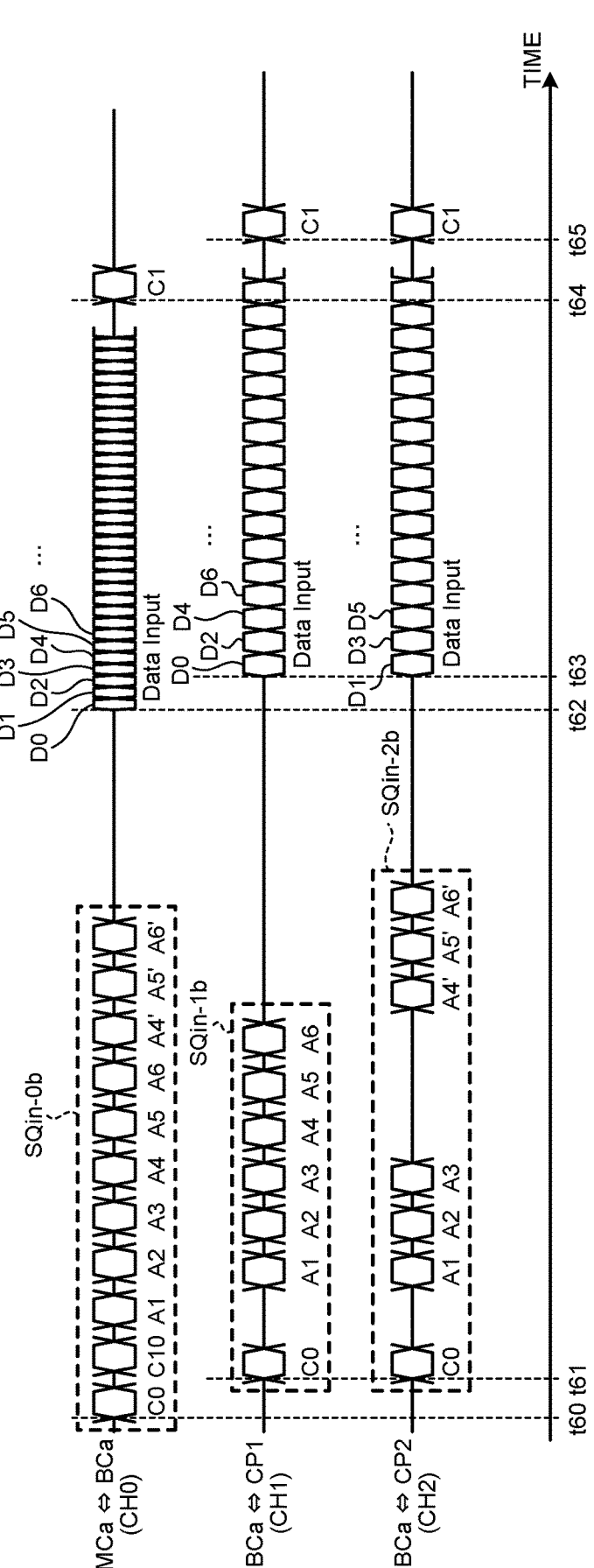
FIG. 13 is a timing chart illustrating an example of information transferred via each channel when an instruction for a write operation is given in a memory system according to a modified example of the second embodiment.

FIG. 13 is a timing chart illustrating an example of information transferred via each channel when an instruction for a write operation is given in the memory system SYSa according to the modified example of the second embodiment.

The memory controller MCa first inputs a data-in command sequence SQin-0b to the bridge chip BCa (time t60). The data-in command sequence SQin-0b includes the address segments A1 to A6 as the first address information and includes the address segments A4' to A6' as the second address information. That is, the address segments A1' to A3' are omitted from the complete address information (the address segments A1' to A6') transferred as the second address information according to the second embodiment. Values transferred as the LUNs in the address segments A4 to A6 and the address segments A4' to A6' are different from each other. Additionally, values transferred as the block numbers in the address segments A4 to A6 and the address segments A4' to A6' can be different from each other.

In the bridge chip BCa, when the command decoder 111a interprets the data-in command C0 and the parallel operation command C10, the signal transfer/processing circuit 112a generates two data-in command sequences SQin-1b and SQin-2b by duplicating the data-in command sequence SQin-0b. Then, the transfer of the two data-in command sequences SQin-1b and SQin-2b is started (time t61). The data-in command sequence SQin-1b of the two data-in command sequences SQin-1b and SQin-2b is a data command sequence addressed to the first memory chip CP. The data-in command sequence SQin-2b is a data command sequence addressed to the second memory chip CP.

The signal transfer/processing circuit 112a masks the parallel operation command C10 when transferring the two data-in command sequences SQin-1b and SQin-2b. The signal transfer/processing circuit 112a masks the second address information when transferring the data-in command sequence SQin-1b. The signal transfer/processing circuit 112a does not mask the address segments A1 to A3 of the first address information but masks the address segments A4 to A6 when transferring the data-in command sequence SQin-2b.

Therefore, each of the two data-in command sequences SQin-1b and SQin-2b is transferred to a destination memory chip CP as a signal having a configuration compliant with the toggle DDR standard and including the data-in command C0 and one set of address information.

Also in the page read command sequence and the data-out command sequence, similarly to the data-in command sequence SQin-0b, the memory controller MCa inputs a command sequence including the parallel operation command C10, the address segments A1 to A6 as the first address information, and the address segments A4' to A6' as the second address information to the bridge chip BCa. The signal transfer/processing circuit 112a duplicates the received command sequence and transfers each of the two command sequences generated by the duplication to the destination memory chip CP. When transferring one of the two command sequences to the first memory chip CP, the signal transfer/processing circuit 112a masks the parallel operation command C10 and the second address information. When transferring the other of the two command sequences to the second memory chip CP, the signal transfer/processing circuit 112a masks the parallel operation command C10, does not mask the address segments A1 to A3 of the first address information, and masks the address segments A4 to A6.

As described above, according to the modified example of the second embodiment, the bridge chip BCa can receive the first command sequence including the first address information and the second address information. The first address information has a configuration of a complete address information. The second address information has a configuration obtained by omitting part of the complete address information, which is common with the first address information (the common part is referred to as a first portion in the description of the modified example of the second embodiment). In a case where such a first command sequence is received from the memory controller MCa, the bridge chip BCa generates the second command sequence and the third command sequence by duplicating the first command sequence. The bridge chip BCa masks the second address information in the second command sequence. The bridge chip BCa masks a second portion that is a portion other than the first portion in the first address information in the third command sequence.

Therefore, it is possible to reduce a length of the first command sequence transferred by the memory controller MCa.

In the description of the modified example of the second embodiment, the second address information is transferred as the address segments A4' to A6' including the block number and the LUN. The configuration of the second address information is not limited thereto.

Third Embodiment

As the number of executions of cycles of a program operation and an erase operation increases, memory cells included in a memory cell array are exhausted, and reliability of data stored in the memory cells deteriorates. A block in which reliability of stored data is lower than a required level is registered as a defective block. In addition, a block that is difficult to read due to a failure of an element or the like during use is also registered as the defective block. A block registered as the defective block is unusable. Each block included in a semiconductor memory device may become the defective block during operation.

According to a third embodiment, a bridge chip is configured to be able to process a command sequence in both the manner of the first embodiment and the manner of the second embodiment. A memory controller constructs a plurality of block groups each including a plurality of blocks based on the simple relationship between the LUNs described in the first embodiment. That is, a group of blocks given the same block number among a plurality of memory chips included in a chip group is managed as a block group. The memory controller performs, for each block group, simultaneous control of data transfer to a plurality of memory chips by the manner of the first embodiment. In a case where a block included in a block group is registered as the defective block, the memory controller reconstructs the block group with blocks that are not defective blocks. The memory controller performs, for the reconstructed block group, simultaneous control of data transfer to memory chips by the manner of the second embodiment.

Note that, in the third embodiment, as in the first embodiment and the second embodiment, an example in which a plurality of memory chips are connected to the bridge chip via any one of two channels CH1 and CH2 will be described. The manner of the first embodiment is described as a 1-address mode, and the manner of the second embodiment is described as a 2-address mode.

In the third embodiment, the same contents as those in the first embodiment or the second embodiment will be briefly described or a description thereof will be omitted.

Figure 14:
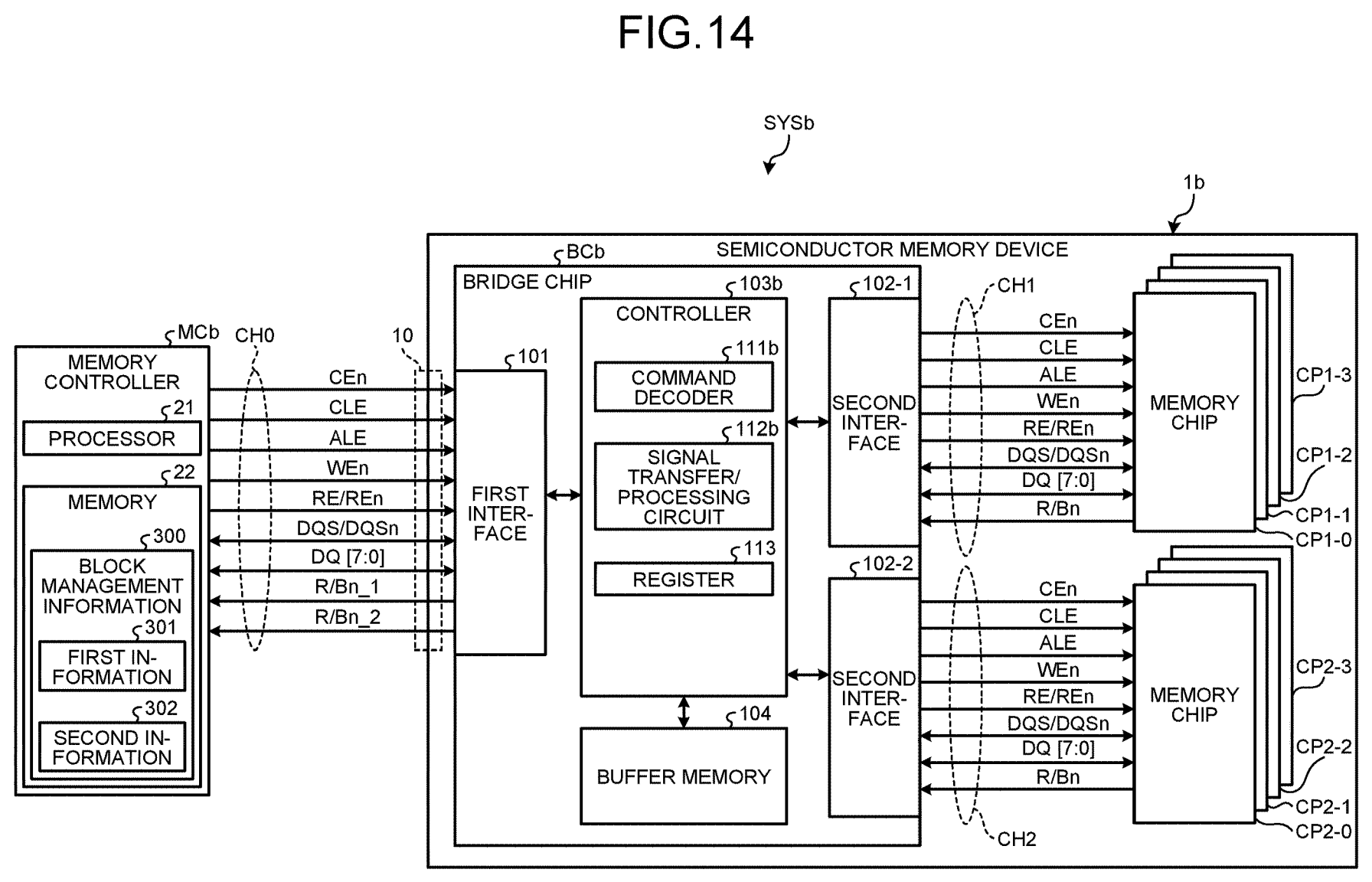

FIG. 14 is a schematic diagram illustrating an example of a memory system SYSb to which a semiconductor memory device 1b according to the third embodiment is applied.

The memory system SYSb includes a memory controller MCb and the semiconductor memory device 1b. The semiconductor memory device 1b includes an external terminal group 10, a bridge chip BCb, and a plurality of memory chips CP1-0 to CP1-3 and CP2-0 to CP2-3. Four memory chips CP1-0 to CP1-3 are connected to the bridge chip BCa via a channel CH1, and four memory chips CP2-0 to CP2-3 are connected to the bridge chip BCa via a channel CH2.

The bridge chip BCb includes a first interface 101, two second interfaces 102, a controller 103b, and a buffer memory 104.

The controller 103b controls transferring/receiving of information between the first interface 101 and the two second interfaces 102 by using the buffer memory 104.

The controller 103b includes a command decoder 111b, a signal transfer/processing circuit 112b, and a register 113.

The signal transfer/processing circuit 112b has the function of the signal transfer/processing circuit 112 according to the first embodiment and the function of the signal transfer/ processing circuit 112a according to the second embodiment.

The memory controller MCb includes a processor 21 and a memory 22.

The processor 21 is, for example, a central processing unit (CPU) that operates according to a computer program. The processor 21 controls the memory controller MCb based on a firmware program. As part of control of the memory controller MCb, the processor 21 constructs a plurality of block groups, detects a defective block, reconstructs a block group according to the detection of the defective block, and the like. Note that some of or all the functions of the processor 21 may be implemented by a hardware circuit such as a field-programmable gate array (FPGA) or an application specific integrated circuit (ASIC).

The memory 22 is a memory capable of high-speed operation, such as a DRAM or an SRAM. The memory 22 stores block management information 300. The block management information 300 includes first information 301 and second information 302. The processor 21 manages each block group by using the first information 301 and the second information 302.

A status of each block is recorded in the first information 301. The status includes "unused" meaning that it does not belong to any block group, "in use" meaning that it belongs to any block group, and "NG" meaning a defective block.

The configuration of each block group is recorded in the second information 302.

FIG. 15 is a schematic diagram illustrating an example of data configurations of the first information 301 and the second information 302 according to the third embodiment.

FIG. 15 illustrates the configurations of the first information 301 and the second information 302 in a state immediately after the block management information 300 is generated.

The first information 301 has a data structure of a table in which the status is recorded for each combination of a channel number, a LUN, and a block number. In the state immediately after the block management information 300 is generated, the status of each block is "unused".

The second information 302 has a data structure of a table in which an entry including fields in which a basic address, an address mode, a first address, and a second address are recorded is provided for each block group.

A serial number is given to each block group. This serial number is referred to as a block management number. In the second information 302, the block management number is recorded as an index of each entry.

The basic address indicates a configuration of a block group in the state immediately after the block management information 300 is generated.

In the state immediately after the block management information 300 is generated, as an example, the configuration of the management information in a case where a block group is used in the 1-address mode is recorded in the field of the basic address. More specifically, a pair of LUNs and a block number are recorded in the field of the basic address of the second information 302. The pair of LUNs recorded in this field indicates two memory chips CP each including one block included in the block group. The block number recorded in this field indicates the block included in the block group included in each of the two memory chips CP indicated by the pair of LUNs.

In the field of the basic address, the pair of LUNs and the block number determined based on a simple rule are recorded. According to the example illustrated in FIG. 15, a pair of LUNi and LUN(i+4) is recorded in the field of the basic address. Note that "i" is an integer from 0 to 3. Four entries in which pairs of LUNs having different values are recorded in the fields of the basic addresses are set as one set, and block numbers having different values are recorded for each set.

In the field of the address mode, whether to process the command sequence in the 1-address mode or the 2-address mode is recorded. In the state immediately after the block management information 300 is generated, "undefined" indicating that setting has not yet been completed is recorded in the field of the address mode of each entry.

The first address and the second address indicate an actual block group configuration. The first address indicates one of the two blocks included in the block group, and the second address indicates the other of the two blocks. In the state immediately after the block management information 300 is generated, no value is recorded in the field of the first address and the field of the second address.

The block management information 300 becomes available through a plurality of initialization processing. The initialization processing include first initialization processing, second initialization processing, and third initialization processing. The processor 21 executes the first initialization processing, the second initialization processing, and the third initialization processing in this order.

Figure 16:
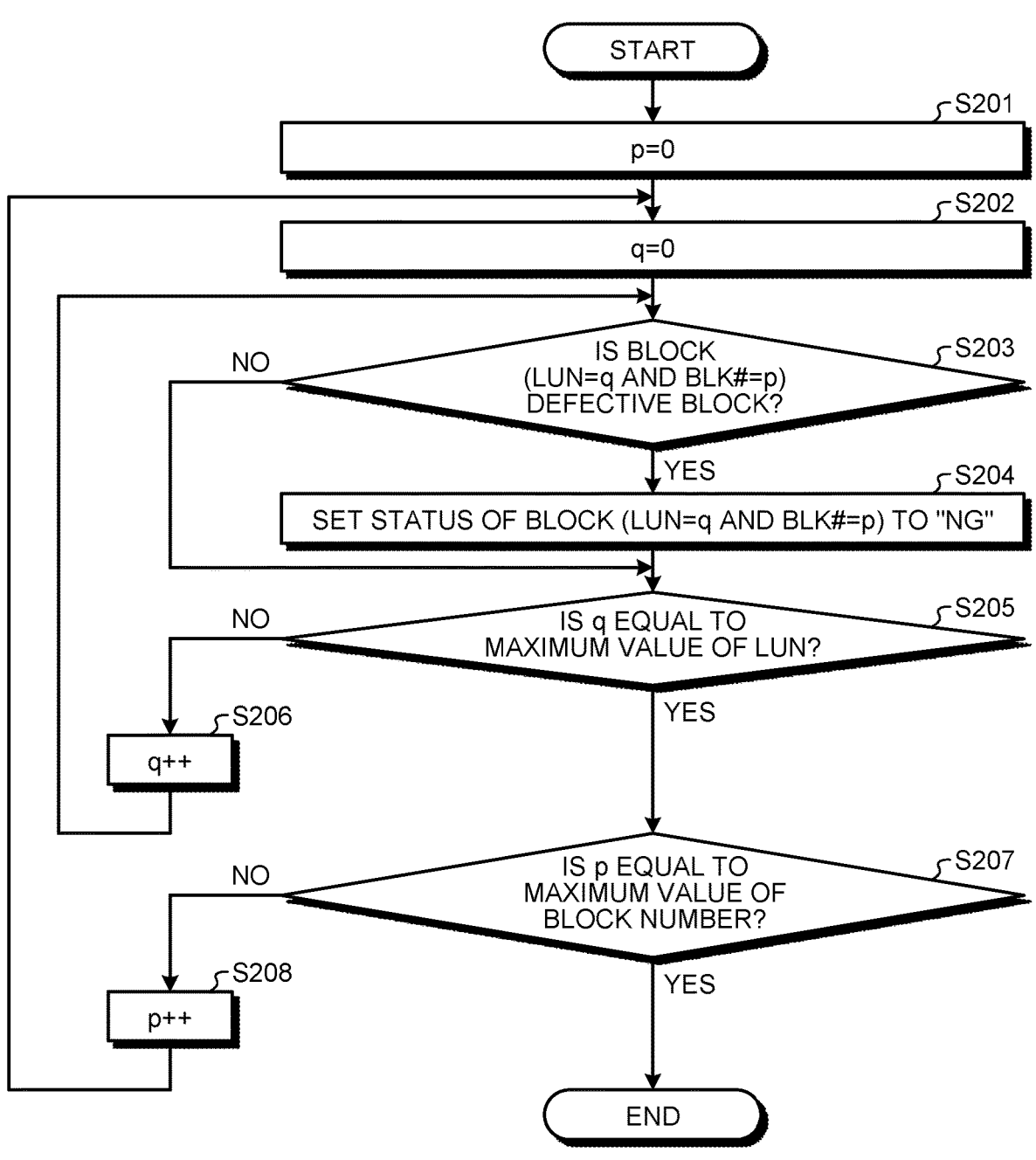
FIG. 16 is a flowchart illustrating an example of first initialization processing according to the third embodiment.

FIG. 16 is a flowchart illustrating an example of the first initialization processing according to the third embodiment. Note that a series of processing illustrated in FIG. 16 includes loop processing. Counters for the loop processing are denoted by p and q.

First, the processor 21 sets p to 0 (S201) and sets q to 0 (S202). Then, the processor 21 determines whether or not a block whose block number is p (referred to as a target block in the description of FIG. 16) included in a memory chip CP whose LUN is q is a defective block (S203).

At the time of manufacturing the memory chip CP or the semiconductor memory device 1b, defect inspection is executed for each block. Information of a block in which a defect of a level unsuitable for use is found by the defect inspection at the time of manufacturing is recorded as a defective block in an optional non-volatile storage region in the memory chip CP including the block. The non-volatile storage region is, for example, a fuse ROM such as an EEPROM. In S203, the processor 21 checks whether or not the target block is recorded as a defective block in the non-volatile storage region. In a case where the target block is recorded as the defective block, the processor 21 determines that the target block is the defective block. In a case where the target block is not recorded as the defective block, the processor 21 determines that the target block is not the defective block.

In a case where the target block is the defective block (S203: Yes), the processor 21 sets "NG" as the status of the target block in the first information 301 (S204). In a case where the target block is not the defective block (S203: No), the processing of S204 is skipped.

Subsequently, the processor 21 determines whether or not q is equal to a maximum value of the LUN (S205). In a case where q is not equal to the maximum value of the LUN (S205: No), the processor 21 increments q by 1 (S206), and the control proceeds to S203.

In a case where q is equal to the maximum value of the LUN (S205: Yes), the processor 21 determines whether or not p is equal to a maximum value of the block address (S207). In a case where p is not equal to the maximum value of the block address (S207: No), the processor 21 increments p by 1 (S208), and the control proceeds to S202.

In a case where p is equal to the maximum value of the block address (S207: Yes), the first initialization processing ends.

As described above, in the first initialization processing, the processor 21 determines whether or not each block is the defective block based on a result of the defect inspection at the time of manufacturing. Then, in a case where there is a block determined to be the defective block, the processor 21 sets "NG" as the status of the block in the first information 301.

FIG. 17 is a diagram illustrating an example of a content of the block management information 300 after the first initialization processing according to the third embodiment. In the example illustrated in FIG. 17, the statuses of a block whose block number is 0 in the memory chip CP whose LUN is 7, a block whose block number is 3 in the memory chip CP whose LUN is 0, and a block whose block number is 3 in the memory chip CP whose LUN is 4 are set to "NG". The statuses of all the remaining blocks are maintained at "unused".

Figure 18:
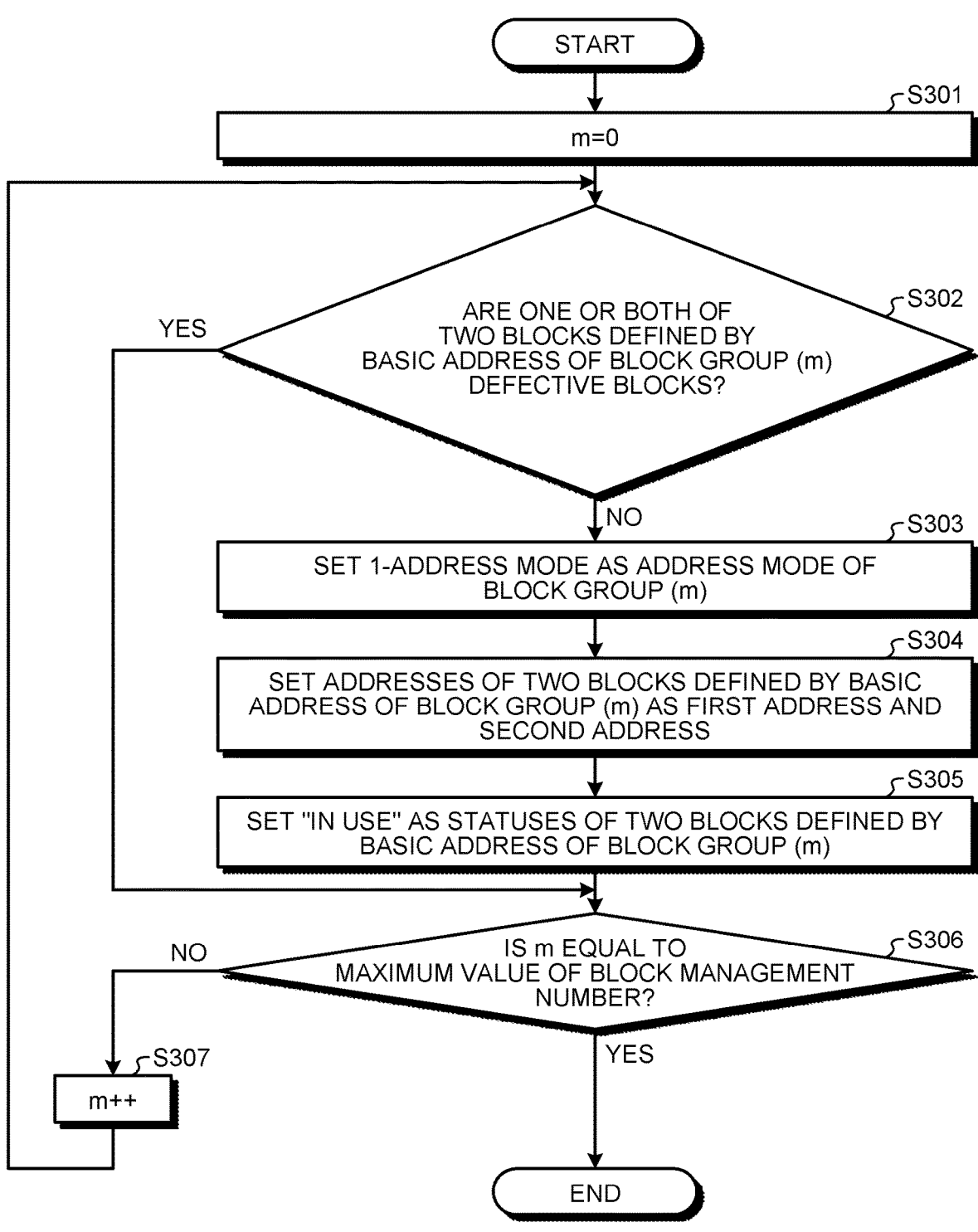
FIG. 18 is a flowchart illustrating an example of second initialization processing according to the third embodiment.

FIG. 18 is a flowchart illustrating an example of the second initialization processing according to the third embodiment. Note that a series of processing illustrated in FIG. 18 includes loop processing. A counter for loop processing is denoted by m.

First, the processor 21 sets m to 0 (S301). Then, the processor 21 determines whether or not one or both of two blocks defined by the basic address are defective blocks for a block group whose block management number is m (S302). The processor 21 executes determination processing of S302 by referring to the first information 301.

In a case where none of the two blocks defined by the basic address is the defective block (S302: No), the processor 21 sets the "1-address mode" as the address mode in the second information 302 for the block group whose block management number is m (S303). The processor 21 sets addresses of the two blocks defined by the basic addresses as the first address and the second address in the second information 302 (S304). The processor 21 sets "in use" as the status for each of the two blocks defined by the basic address in the first information 301 (S305).

After S305, or in a case where one or both of the two blocks defined by the basic address are defective blocks (S302: Yes), the processor 21 determines whether or not m is equal to a maximum value of the block management number (S306). In a case where m is not equal to the maximum value of the block management number (S306: No), the value of m is incremented by 1 (S307), and the control proceeds to S302.

In a case where m is equal to the maximum value of the block management number (S306: Yes), the second initialization processing ends.

FIG. 19 is a diagram illustrating an example of a content of the block management information 300 after the second initialization processing according to the third embodiment is executed on the block management information 300 illustrated in FIG. 17.

According to the first information 301, the status of a block whose block number is 0 in a memory chip CP whose LUN is 7 is "NG". In addition, the statuses of a block whose block number is 3 in a memory chip CP whose LUN is 0 and a block whose block number is 3 in a memory chip CP whose LUN is 4 are "NG". According to the second information 302, these blocks whose statuses are "NG" correspond to one of two blocks included in a block group whose block management number is 3 or two blocks included in a block group whose block management number is 12.

Therefore, in the second information 302, the "1-address mode" is set as the address mode for all the block groups except the block group whose block management number is 3 and the block group whose block management number is 12, and two addresses set by the basic address are recorded as the first address and the second address.

In the first information 301, the status of a block whose block number is 0 in a memory chip CP whose LUN is 3 is maintained at "unused". This block is a block that is not the defective block among two blocks included in the block group whose block management number is 3. In the first information 301, the statuses of a block whose block number is 0 in a memory chip CP whose LUN is 7, a block whose block number is 3 in a memory chip CP whose LUN is 0, and a block whose block number is 0 in a memory chip CP whose LUN is 4 are maintained at "NG". "In use" is recorded as the statuses of the other blocks.

Figure 20:
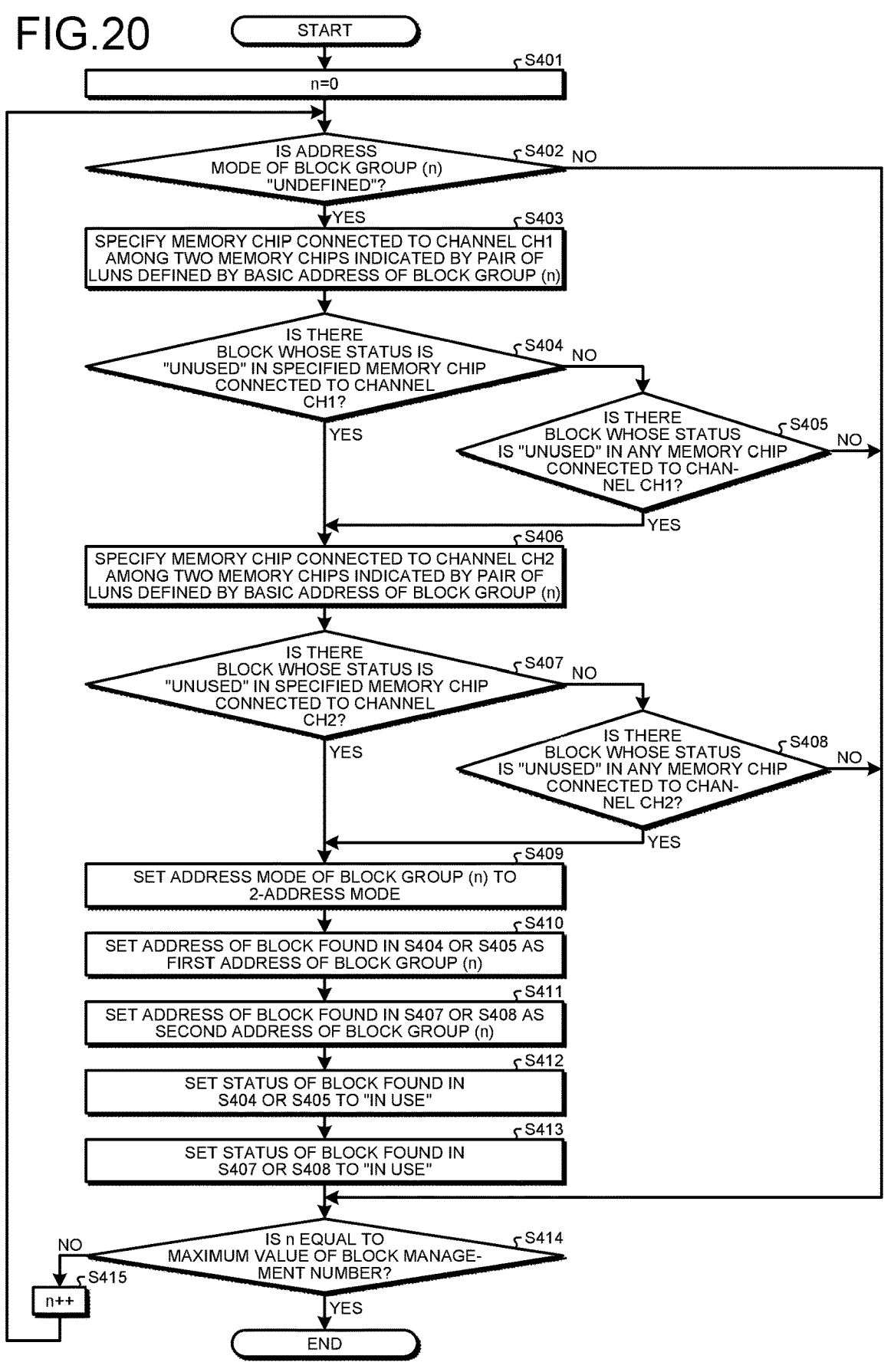
FIG. 20 is a flowchart illustrating an example of third initialization processing according to the third embodiment.

FIG. 20 is a flowchart illustrating an example of the third initialization processing according to the third embodiment. Note that a series of processing illustrated in FIG. 20 includes loop processing. A counter for loop processing is denoted by n.

First, the processor 21 sets n to 0 (S401). Then, the processor 21 determines whether or not an address mode of a block group whose block management number is n is "undefined" (S402).

In a case where the address mode of the block group whose block management number is n is "undefined" (S402: Yes), the processor 21 refers to the second information 302 and specifies a memory chip CP1 connected to the channel CH1 among a pair of memory chips CP indicated by a pair of LUNs defined by a basic address related to the block group whose block management number is n (S403). Then, the processor 21 refers to the first information 301 and determines whether or not there is a block whose status is "unused" in the memory chip CP1 specified in S403 (S404).

If No in the determination processing of S404, the processor 21 determines whether or not there is a block whose status is "unused" in any memory chip CP1 connected to the channel CH1 (S405).

If Yes in any of the determination processing of S404 and S405, the processor 21 temporarily stores a block whose status found in any of the determination processing of S404 and S405 is "unused". Then, the processor 21 refers to the second information 302 and specifies a memory chip CP2 connected to the channel CH2 among the two memory chips CP indicated by the pair of LUNs defined by the basic address of the block group whose block management number is n (S406). Then, the processor 21 refers to the first information 301 and determines whether or not there is a block whose status is "unused" in the memory chip CP2 specified in S406 (S407).

If No in the determination processing of S407, the processor 21 determines whether or not there is a block whose status is "unused" in any memory chip CP2 connected to the channel CH2 (S408).

If Yes in any of the determination processing of S407 and S408, the processor 21 temporarily stores a block whose status found in any of the determination processing of S407 and S408 is "unused". Then, the processor 21 sets the "2-address mode" in the second information 302 as the address mode of the block group whose block management number is n (S409).

The processor 21 sets the address of the block whose status is "unused" as the first address of the block group whose block management number is n in the second information 302, the block being found in the determination processing of any one of S404 and S405 (S410). Similarly, the processor 21 sets the address of the block whose status is "unused" as the second address of the block group whose block management number is n in the second information 302, the block being found in the determination processing of any one of S407 and S408 (S411).

The processor 21 sets "in use" in the first information 301 as the status of the block found in the determination processing of any one of S404 and S405 (S412). Similarly, the processor 21 sets "in use" in the first information 301 as the status of the block found in the determination processing of any one of S407 and S408 (S413).

After S413, or if No in the determination processing of any one of S402, S405, and S408, the processor 21 determines whether or not n is equal to the maximum value of the block management number (S414). In a case where n is not equal to the maximum value of the block management number (S414: No), the processor 21 increments n by 1 (S415), and the control proceeds to S402.

In a case where n is equal to the maximum value of the block management number (S414: Yes), the third initialization processing ends.

FIG. 21 is a diagram illustrating an example of a content of the block management information 300 after the third initialization processing according to the third embodiment is executed on the block management information 300 illustrated in FIG. 18.

In the example illustrated in FIG. 21, the "2-address mode" is set as the address mode for the block group whose block management number is 3 and the block group whose block management number is 12. Then, addresses of blocks acquired from unused blocks are newly set as the first address and the second address for each of the block group whose block management number is 3 and the block group whose block management number is 12.

In the example illustrated in FIG. 19, the block whose block number is 0 in the memory chip CP whose LUN is 3 is a block whose status is set to "unused" in the first information 301. This block is incorporated into the block group whose block management number is 3 by the third initialization processing, and the address of the block is set as the first address in the second information 302. Then, in the first information 301, the status of this block is changed from "unused" to "in use".

After the third initialization processing, the memory system SYSb can start operation. When the memory system SYSb operates, a defective block may be newly generated due to exhaustion of a memory cell, failure of an element, or the like. Therefore, the memory controller MCb appropriately determines whether or not each block that is in use corresponds to the defective block. In a case where a new defective block is detected by this determination, the processor 21 updates the block management information 300 to reconfigure some block groups and change the address mode.

Figure 22:
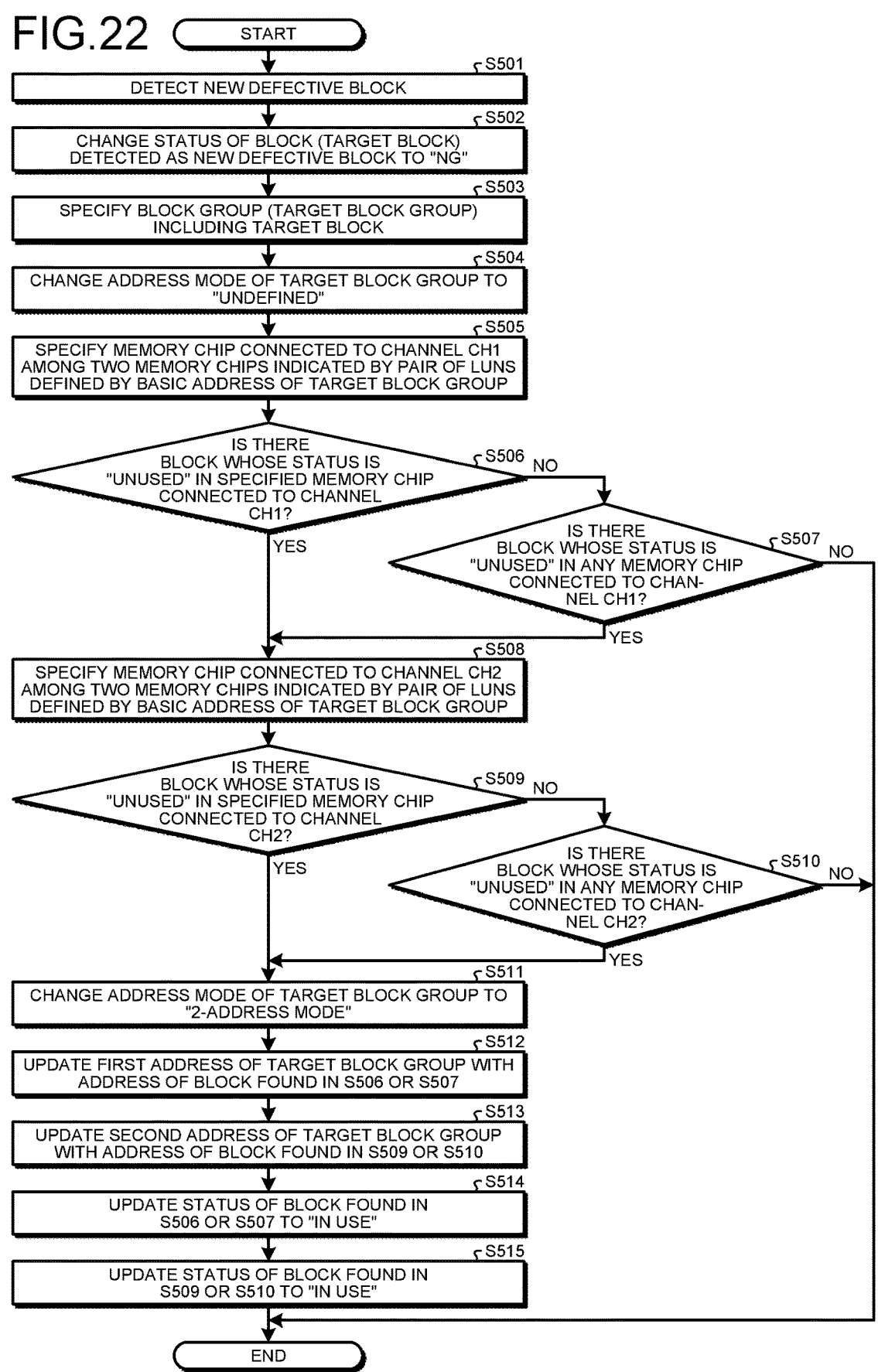
FIG. 22 is a flowchart illustrating an example of processing of updating the block management information during operation of the memory system according to the third embodiment.

FIG. 22 is a flowchart illustrating an example of processing of updating the block management information 300 during operation of the memory system SYSb according to the third embodiment.

Once a new defective block is detected (S501), the processor 21 changes the status of the block detected as the new defective block in the first information 301 from "in use" to "NG" (S502). In the description of FIG. 22, the block detected as the new defective block in S501 is referred to as a target block.

Subsequently, the processor 21 refers to the second information 302 and specifies a block group including the target block (S503). In the description of FIG. 22, the block group specified in S503 is referred to as a target block group.

In the second information 302, the processor 21 changes an address mode of the target block group to "undefined" (S504).

The processor 21 refers to the second information 302 and specifies the memory chip CP1 connected to the channel CH1 among two memory chips CP indicated by a pair of LUNs defined by a basic address of the target block group (S505). Then, the processor 21 refers to the first information 301 and determines whether or not there is a block whose status is "unused" in the memory chip CP1 specified in S505 (S506).

If No in the determination processing of S506, the processor 21 determines whether or not there is a block whose status is "unused" in any memory chip CP1 connected to the channel CH1 (S507).

If Yes in any of the determination processing of S506 and S507, the processor 21 temporarily stores a block whose status found in any of the determination processing of S506 and S507 is "unused". Then, the processor 21 refers to the second information 302 and specifies the memory chip CP2 connected to the channel CH2 among two memory chips CP indicated by a pair of LUNs defined by the basic address of the target block group (S508). Then, the processor 21 refers to the first information 301 and determines whether or not there is a block whose status is "unused" in the memory chip CP2 specified in S508 (S509).

If No in the determination processing of S509, the processor 21 determines whether or not there is a block whose status is "unused" in any memory chip CP2 connected to the channel CH2 (S510).

If Yes in any of the determination processing of S509 and S510, the processor 21 temporarily stores a block whose status found in any of the determination processing of S509 and S510 is "unused". Then, the processor 21 changes the address mode of the target block group to the "2-address mode" in the second information 302 (S511).

In the second information 302, the processor 21 updates the first address of the target block group with an address of a block whose status is "unused", the block being found in the determination processing of any one of S506 and S507 (S512). Similarly, in the second information 302, the processor 21 updates the second address of the target block group with an address of a block whose status is "unused", the block being found in the determination processing of any one of S509 and S510 (S513).

In the first information 301, the processor 21 changes the status of the block found in the determination processing of any one of S506 and S507 from "unused" to "in use" (S514). Similarly, in the first information 301, the processor 21 changes the status of the block found in the determination processing of any one of S509 and S510 from "unused" to "in use" (S515).

After S515 or if No in the determination processing of any one of S507 and S510, the processing of updating the block management information 300 ends.

FIGS. 23 and 24 are diagrams illustrating examples of transition of a content of the block management information 300 by the processing of updating the block management information 300 according to the third embodiment illustrated in FIG. 22.

As an example, it is assumed that a block whose block number is 1 in a memory chip CP whose LUN is 3 is detected as a new defective block. In such a case, as illustrated in FIG. 23, the status of the block whose block number is 1 in the memory chip CP whose LUN is 3 is changed to "NG" by the processing of S502 of FIG. 22.

Additionally, by the processing of S503 of FIG. 22, as illustrated in FIG. 23, it is specified that a block group including the block whose block number is 1 in the memory chip CP whose LUN is 3 is a block group whose block management number is 7. Then, an address mode of the block group whose block management number is 7 is changed from "1-address mode" to "undefined".

By the processing of S505 and S508 of FIG. 22, it is specified that the block group whose block management number is 7 includes a block included in the memory chip CP1-3 connected to the channel CH1 and a block included in a memory chip CP2-7 connected to the channel CH2.

By the processing of S506 of FIG. 22, a block whose block number is 273 is found as a block whose status is "unused" from the memory chip CP1-3. In addition, by the processing of S509, a block whose block number is 1 is found as a block whose status is "unused" from the memory chip CP2-7.

Then, as illustrated in FIG. 24, the address mode of the block group whose block management number is 7 is changed from "undefined" to "2-address mode" by the processing of S511 of FIG. 22. Moreover, by the processing of S512 of FIG. 22, as illustrated in FIG. 24, the first address of the block group whose block management number is 7 is updated with the address of the block whose block number is 273 included in the memory chip CP1-3. By the processing of S513 of FIG. 22, as illustrated in FIG. 24, the second address of the block group whose block management number is 7 is updated with the block whose block number is 1 included in the memory chip CP2-7.

By performing the above operation, whether the processing method for the command sequence is the 1-address mode or the 2-address mode is managed for each block group. In a case where two blocks included in a block group for which the 1-address mode is set are data transfer targets, the memory controller MCb inputs a command sequence to the bridge chip BCb in the manner of the first embodiment. In a case where two blocks included in a block group for which the 2-address mode is set are data transfer targets, the memory controller MCb inputs a command sequence to the bridge chip BCb in the manner of the second embodiment.

In other words, in a case where a first block indicated by address information (referred to as first address information in the description of the third embodiment) and a second block indicated by address information (referred to as second address information in the description of the third embodiment) obtained by performing replacement on a value of a LUN in the first address information on the basis of a pair of LUNs defined by a basic address are data transfer targets, the memory controller MCb transfers a command sequence to the bridge chip BCb according to the manner of the first embodiment. In a case where the first block and a third block different from the second block are data transfer targets, the memory controller MCb transfers a command sequence to the bridge chip BCb according to the manner of the second embodiment.

In addition, in a case where the first block and the second block are not defective blocks, namely, in a case where both the first block and the second block are set to be usable, the memory controller MCb manages the first block and the second block as a group for which a command sequence according to the manner of the first embodiment can be used. In a case where the second block is the defective block, in other words, in a case where the second block becomes unusable, the group of the first block and the second block is canceled, and the first block and the third block that is not the defective block are managed as a new group.

Therefore, even in a case where a defective block is generated while the memory system SYSb is operating, it is possible to continue simultaneous control of data transfer to a plurality of memory chips by switching the address mode.

Fourth Embodiment

After a memory chip starts an internal operation in accordance with a given command sequence, the memory chip transitions to a busy state, and, when the internal operation is completed, the memory chip transitions to a ready state.

There is a case where a memory controller needs to know whether or not the memory chip has succeeded in performing the internal operation.

In order to know whether the memory chip is in a ready state or a busy state, or whether or not the internal operation in the memory chip has been successfully performed (pass), the memory controller may specify a target memory chip and transfer a read status command sequence. The target memory chip outputs status information in response to the read status command. The status information includes a value indicating whether the memory chip is in the ready state or the busy state, or a value indicating whether the internal operation has been successfully performed.

In the toggle DDR standard, it is defined that a time equal to or longer than a time $t_{WHR}$ is provided between a timing at which the transfer of the read status command sequence to the memory chip is completed and a timing at which transfer of a read enable signal RE/REn for causing the memory chip to output the status information is started.

Here, a technology to be compared with a fourth embodiment will be described. The technology to be compared with the fourth embodiment is referred to as a comparative example. In the comparative example, the technologies according to the first to third embodiments are not used. According to the comparative example, the memory controller first transfers the read status command sequence and the read enable signal RE/REn to a memory chip via a bridge chip, and acquires the status information from the memory chip via the bridge chip. Next, the memory controller transfers the read status command sequence and the read enable signal RE/REn to another memory chip via the bridge chip, and acquires the status information from the memory chip via the bridge chip.

That is, according to the comparative example, in order to acquire the status information from a plurality of memory chips, the transfer of the read status command sequence and the transfer of the read enable signal RE/REn are performed serially in time for the plurality of memory chips. Therefore, processing of waiting for the time $t_{WHR}$ or more occurs as many as the number of target memory chips, and it takes a lot of time to acquire the status information from all the target memory chips.

In the fourth embodiment, similarly to a case of data transfer in the first to third embodiments, the bridge chip is configured in such a way that acquisition of the status information from a plurality of (here, two as an example) memory chips can be simultaneously controlled by one read status command sequence. The bridge chip generates a plurality of read status command sequences addressed to different memory chips based on one read status command sequence input from the memory controller, and transfers the plurality of read status command sequences to the different memory chips in parallel. As a result, some of or all the pieces of processing of waiting for the time $t_{WHR}$ or more can be overlapped in time. As a result, a time required to acquire the status information from all of the plurality of memory chips is reduced.

In the fourth embodiment, the same contents as those in the first embodiment, the second embodiment, the modified example of the second embodiment, or the third embodiment will be briefly described or a description thereof will be omitted.

Figure 25:
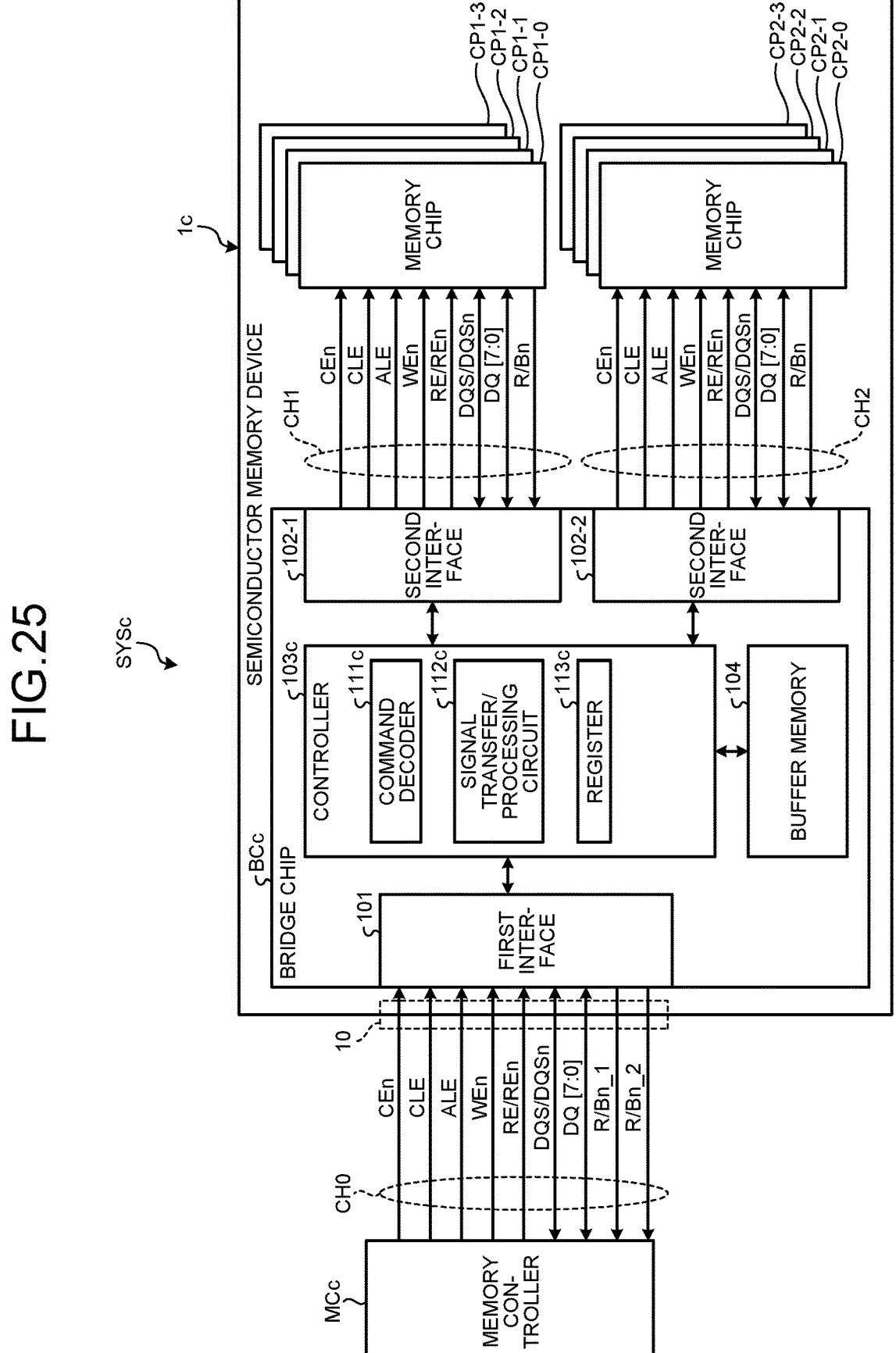
FIG. 25 is a schematic diagram illustrating an example of a memory system to which a semiconductor memory device according to a fourth embodiment is applied.

FIG. 25 is a schematic diagram illustrating an example of a memory system SYSc to which a semiconductor memory device 1c according to the fourth embodiment is applied.

The memory system SYSc includes a memory controller MCc and the semiconductor memory device 1c. The semiconductor memory device 1c includes an external terminal group 10, a bridge chip BCc, and a plurality of memory chips CP1-0 to CP1-3 and CP2-0 to CP2-3. Four memory chips CP1-0 to CP1-3 are connected to the bridge chip BCc via a channel CH1, and four memory chips CP2-0 to CP2-3 are connected to the bridge chip BCc via a channel CH2.

The bridge chip BCc includes a first interface 101, two second interfaces 102, a controller 103c, and a buffer memory 104.

The controller 103c controls transferring/receiving of information between the first interface 101 and the two second interfaces 102 by using the buffer memory 104.

The controller 103c includes a command decoder 111c, a signal transfer/processing circuit 112c, and a register 113c.

The command decoder 111c can interpret a parallel operation command C10. In the fourth embodiment, the parallel operation command C10 may be included in the read status command sequence. More specifically, in the fourth embodiment, the read status command sequence may include the parallel operation command C10 and two sets of address information, similar to the command sequence for data transfer described in the second embodiment.

In a case where the parallel operation command C10 is included in the read status command sequence received by the memory controller MCc via a channel CH0, the signal transfer/processing circuit 112c generates two read status command sequences each including a different set of address information among two sets of address information included in the read status command sequence. Then, the signal transfer/processing circuit 112c transfers the respective generated read status command sequences to a destination memory chip CP.

In addition, when the time $t_{WHR}$ defined in the toggle DDR standard elapses after the transfer of the two read status command sequences, the signal transfer/processing circuit 112c toggles the read enable signal RE/REn once in the channels CH1 and CH2 to acquire the status information from each memory chip CP as a destination of the read status sequence. The status information acquired from each memory chip CP as the destination of the read status sequence is stored in the register 113c.

After the status information is acquired from each memory chip CP as the destination of the read status sequence, the read enable signal RE/REn from the memory controller MCc is toggled. The signal transfer/processing circuit 112c transfers the status information acquired from each memory chip CP and stored in the register 113c to the memory controller MCc based on the toggling of the read enable signal RE/REn.

Figure 26:
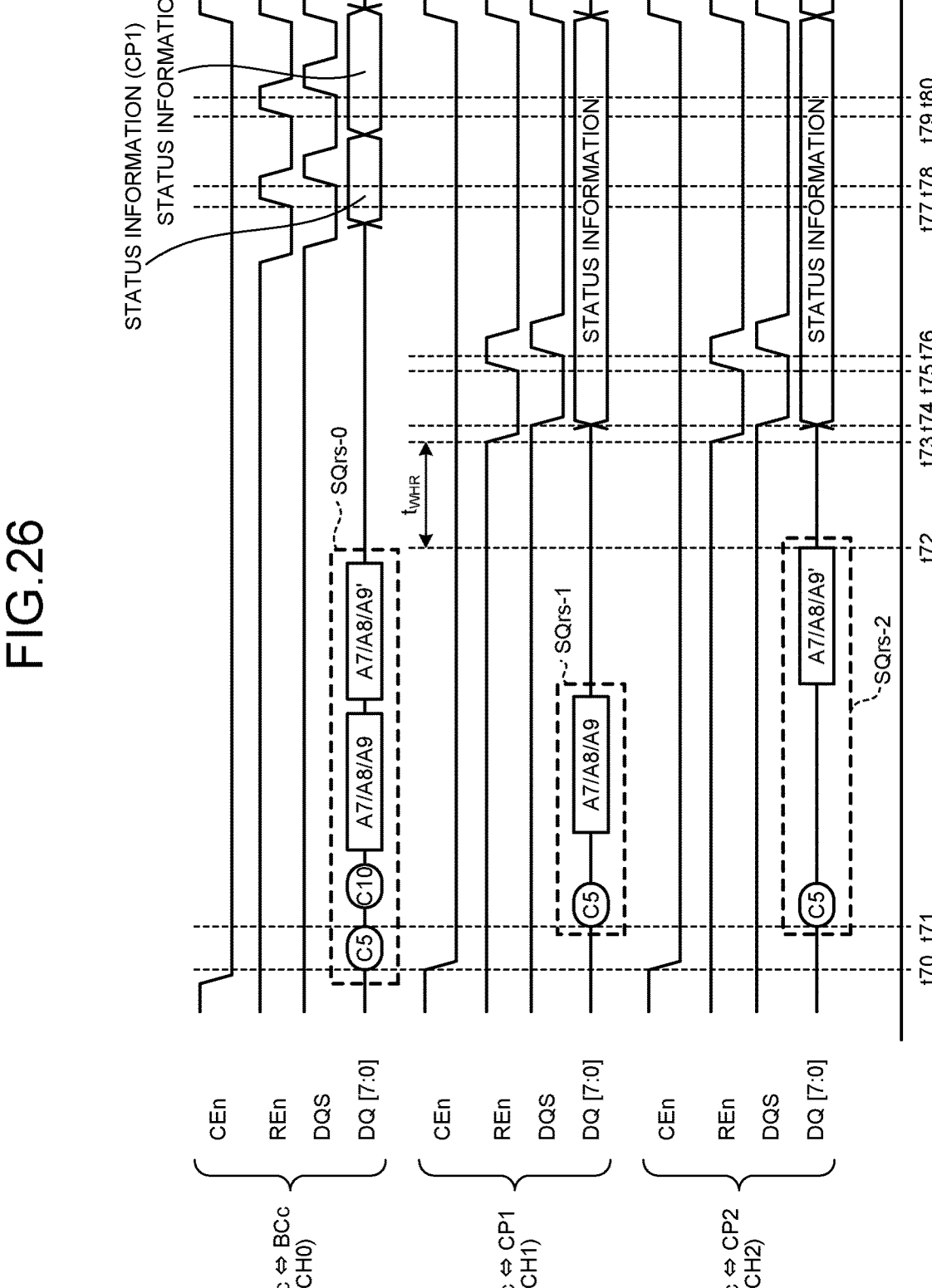
FIG. 26 is a timing chart illustrating an example of information transferred via each channel when status information is acquired in the memory system according to the fourth embodiment.

FIG. 26 is a timing chart illustrating an example of information transferred via each channel when the status information is acquired in the memory system SYSc according to the fourth embodiment. FIG. 26 illustrates waveforms of a chip enable signal CEn, a read enable signal REn of the read enable signals RE/REn, a data strobe signal DQS of a data strobe signal DQS/DQSn, and a data signal DQ(7:0).

The memory controller MCc activates the chip enable signal CEn of the channel CH0, that is, sets the chip enable signal CEn to a low level, and inputs a read status command sequence SQrs-0 to the bridge chip BCc (time t70). The read status command sequence SQrs-0 includes a read status command C5, the parallel operation command C10, first address information (address segments A7, A8, and A9), and second address information (address segments A7, A8, and A9'). The read status command C5 is a command for requesting the status information. The configuration of the read status command sequence SQrs-0 is not compliant with the toggle DDR standard.

In the example illustrated in FIG. 26, the set of the address segments A7, A8, and A9 (or A9') is obtained by omitting a column address from complete address information. That is, the set of the address segments A7, A8, and A9 (or A9') includes a row address. Each of the address segments A7, A8, and A9 (or A9') is information of a minimum unit transferred using eight data signal DQ(7:0), that is, information of one byte. Among the address segments A7, A8, and A9 (or A9'), the address segment A9 (or A9') includes a LUN. The LUN included in the address segment A9 indicates a memory chip CP connected to one of the channels CH1 and CH2, and the LUN included in the address segment A9' indicates a memory chip CP connected to the other of the channels CH1 and CH2.

Similarly to the second embodiment, a channel used for transferring each of the two sets of address information included in the read status command sequence SQrs-0 is preset from among the channels CH1 and CH2 by means of an optional method. As one example, it is herein assumed that the presetting is made on the bridge chip BCc such that the first address information is addressed to a memory chip CP connected to the channel CH1 and the second address information is addressed to a memory chip CP connected to the channel CH2. In the description of the fourth embodiment, the memory chip CP indicated by the first address information is referred to as a first memory chip CP, and the memory chip CP indicated by the second address information is referred to as a second memory chip CP.

In the bridge chip BCc, when the command decoder 111c interprets the read status command C5 and the parallel operation command C10, the signal transfer/processing circuit 112c generates two read status command sequences SQrs-1 and SQrs-2 by duplicating the read status command sequence SQrs-0. Then, the transfer of the two read status command sequences SQrs-1 and SQrs-2 is started (time t71). The read status command sequence SQrs-1 is a read status command sequence addressed to the first memory chip CP. The read status command sequence SQrs-2 is a read status command sequence addressed to the second memory chip CP.

The signal transfer/processing circuit 112c masks various types of information similarly to the second embodiment. Specifically, the signal transfer/processing circuit 112c masks the parallel operation command C10 when transferring the two read status command sequences SQrs-1 and SQrs-2. The signal transfer/processing circuit 112c masks the second address information when transferring the read status command sequence SQrs-1. The signal transfer/processing circuit 112c masks the first address information when transferring the read status command sequence SQrs-2.

Therefore, each of the two read status command sequences SQrs-1 and SQrs-2 is transferred to a destination memory chip CP as a signal having a configuration compliant with the toggle DDR standard and including the read status command C5 and one set of address information.

The first memory chip CP and the second memory chip CP generate the status information in response to receiving of the read status command sequence.

When the transfer of the read status command sequences SQrs-1 and SQrs-2 is completed (time t72), the bridge chip BCc waits for the elapse of the time $t_{WHR}$ defined in the toggle DDR standard. When the time $t_{WHR}$ has elapsed from time t72 (time t73), the read enable signals REn are caused to transition to the low level in the channels CH1 and CH2, thereby prompting the first memory chip CP and the second memory chip CP to prepare the output of the status information. Then, each of the first memory chip CP and the second memory chip CP starts outputting the status information as the data signal DQ(7:0) and causes the data strobe signal DQS to transition to the low level (time t74).

When the bridge chip BCc detects that the data strobe signals DQS are caused to transition to the low level in the channels CH1 and CH2, the bridge chip BCc toggles the read enable signals REn once in the channels CH1 and CH2 (time t75).

Each of the first memory chip CP and the second memory chip CP returns the data strobe signal DQS that is based on the read enable signal REn toggled once (time t76). The bridge chip BCc acquires the status information output as the data signals DQ(7:0) in the channels CH1 and CH2 in response to the toggling of the data strobe signals DQS, and stores the status information acquired from each of the channels CH1 and CH2 in the register 113c (time t76). The status information acquired from the channel CH1 is the status information output from the first memory chip CP. The status information acquired from the channel CH2 is the status information output from the second memory chip CP.

The memory controller MCc toggles the read enable signal REn twice in the channel CH0 (times t77 and t79).

The bridge chip BCc outputs two pieces of status information stored in the register 113c in response to the toggling of the read enable signal REn. For example, in response to the first toggling of the read enable signal REn, the bridge chip BCc outputs the status information related to the first memory chip CP as the data signal DQ(7:0), and returns the data strobe signal DQS based on the read enable signal REn toggled once (time t78). In response to the second toggling of the read enable signal REn, the bridge chip BCc outputs the status information related to the second memory chip CP as the data signal DQ(7:0), and returns the data strobe signal DQS based on the read enable signal REn toggled once (time t80). The memory controller MCc acquires the status information related to the first memory chip CP and the status information related to the second memory chip CP in response to the toggling of the data strobe signal DQS.

In FIG. 26, when the time $t_{WHR}$ defined in the toggle DDR standard has elapsed after the transfer of the read status command sequences SQrs-1 and SQrs-2 is completed, the bridge chip BCc causes the read enable signal REn to transition to the low level in the channels CH1 and CH2. A time between a timing at which the transfer of the read status command sequences SQrs-1 and SQrs-2 is completed and a timing at which the read enable signals REn transitions to the low level in the channels CH1 and CH2 does not need to be equal to the time $t_{WHR}$. The bridge chip BCc may be configured to cause the read enable signals REn to transition to the low level when a time equal to or longer than the time $t_{WHR}$ has elapsed from the timing at which the transfer of the read status command sequences SQrs-1 and SQrs-2 is completed.

As described above, according to the fourth embodiment, the bridge chip BCc receives the read status command sequence SQrs-0 including the first address information indicating the first memory chip CP and the second address information indicating the second memory chip CP from the memory controller MCc. In response to the receiving, the bridge chip BCc performs the transfer of the read status command sequence SQrs-1 that includes the first address information and does not include the second address information to the first memory chip CP, and the transfer of the read status command sequence SQrs-2 that includes the second address information and does not include the first address information to the second memory chip CP. After at least the time $t_{WHR}$ elapses from completion of the transfer of the read status command sequence SQrs-1 and the read status command sequence SQrs-2, the bridge chip BCc simultaneously (in parallel) toggles the read enable signals RE/REn transferred to the channels CH1 and CH2, thereby simultaneously (in parallel) acquiring the pieces of status information via the respective channels CH1 and CH2. When the read enable signal RE/REn is toggled in the channel CH0, the bridge chip BCc outputs the status information received via each of the channels CH1 and CH2 to the memory controller MCc on the basis of the toggling of the read enable signal RE/REn in the channel CH0.

Therefore, a time required to acquire the status information from a plurality of memory chips is reduced.

In addition, according to the fourth embodiment, the read status command sequence SQrs-0 has a configuration including the first address information indicating the first memory chip CP and the second address information indicating the second memory chip CP, similarly to the command sequence for data transfer transferred to the bridge chip BCa by the memory controller MCa according to the second embodiment.

Note that the configuration of the read status command sequence SQrs-0 is not limited thereto. For example, similarly to the command sequence for data transfer of the second embodiment that does not include the parallel operation command C10, the read status command sequence SQrs-0 does not need to include the parallel operation command C10. Other configuration examples of the read status command sequence SQrs-0 are described in several modified examples.

First Modified Example of Fourth Embodiment

According to a first modified example of the fourth embodiment, a configuration of the read status command sequence transferred by the memory controller to the bridge chip is different from that of the fourth embodiment. Here, the same contents as those of the fourth embodiment will not be described or will be briefly described.

Figure 27:
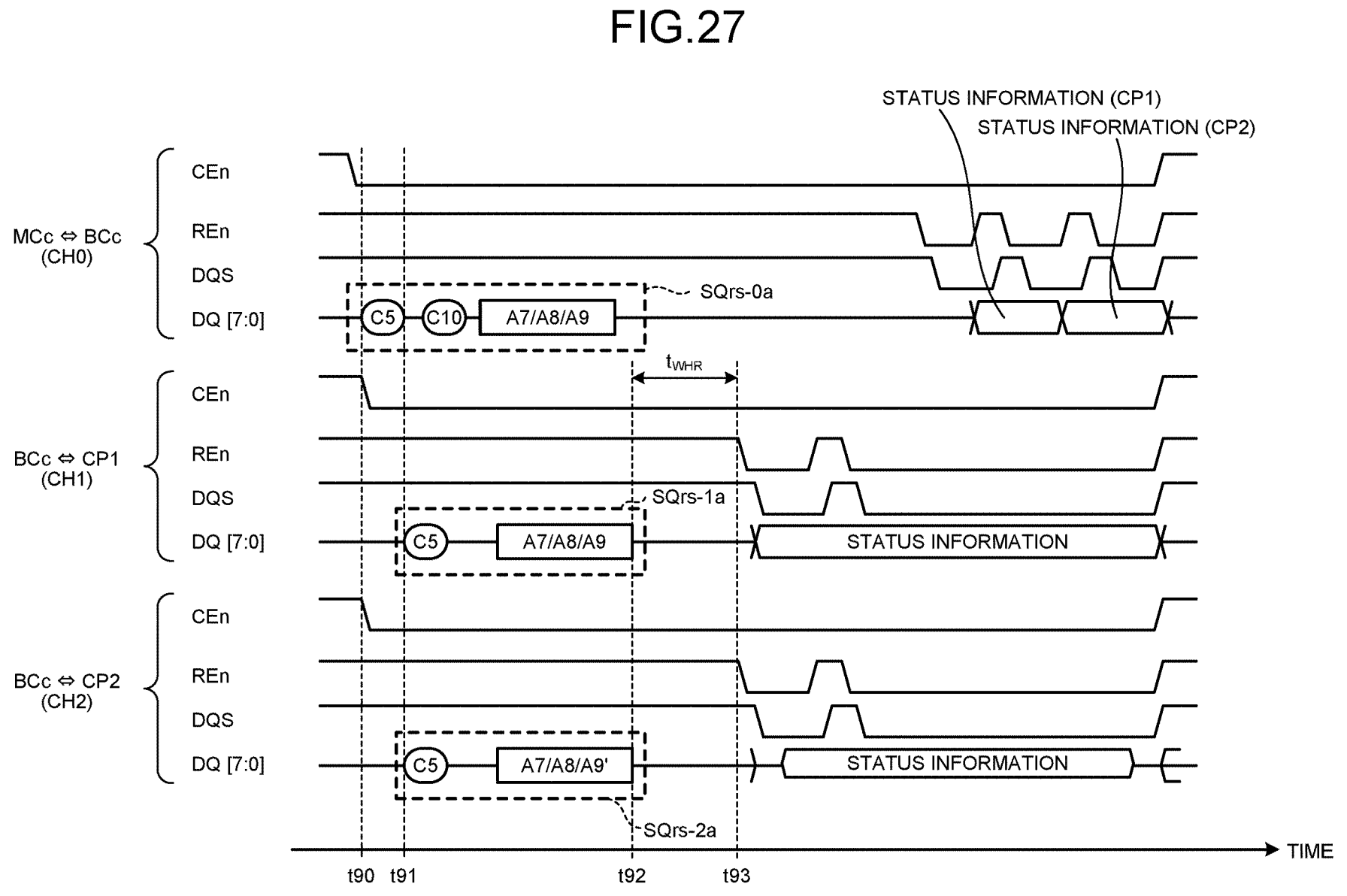

FIG. 27 is a timing chart illustrating an example of information transferred via each channel when status information is acquired in the memory system SYSc according to the first modified example of the fourth embodiment.

The memory controller MCc activates the chip enable signal CEn of the channel CH0, that is, sets the chip enable signal CEn to the low level, and inputs a read status command sequence SQrs-0a to the bridge chip BCc (time t90). The read status command sequence SQrs-0a includes the read status command C5, the parallel operation command C10, and the first address information (address segment A7, A8, and A9). The configuration of the read status command sequence SQrs-0a is not compliant with the toggle DDR standard.

The address segment A9 of the first address information includes the LUN. A memory chip CP indicated by the LUN included in the address segment A9 of the first address information is referred to as a first memory chip CP in the description of the first modified example of the fourth embodiment.

In the fourth embodiment, as in the first embodiment, the bridge chip BCc manages a plurality of (here, two) memory chips CP connected to different channels as one chip group based on a simple relationship using the LUN. A memory chip CP different from the first memory chip CP among the two memory chips CP belonging to one chip group is referred to as a second memory chip CP in the description of the first modified example of the fourth embodiment.

In the bridge chip BCc, when the command decoder 111c interprets the read status command C5 and the parallel operation command C10, the signal transfer/processing circuit 112c generates two read status command sequences SQrs-1a and SQrs-2a by duplicating the read status command sequence SQrs-0a. Then, the signal transfer/processing circuit 112c starts transfer of the two read status command sequences SQrs-1a and SQrs-2a (time t91). The read status command sequence SQrs-1a is a read status command sequence addressed to the first memory chip CP. The read status command sequence SQrs-2a is a read status command sequence addressed to the second memory chip CP.

When transferring the status command sequence SQrs-2a, the signal transfer/processing circuit 112c changes the LUN included in the address segment A9 among the address segments A7 to A9 from a value indicating the first memory chip CP to a value indicating the second memory chip CP by the same method as in the first embodiment. The address segment A9 after the change of the LUN is referred to as an address segment A9'.

In addition, the signal transfer/processing circuit 112c masks the parallel operation command C10 when transferring the two read status command sequences SQrs-1a and SQrs-2a.

Therefore, each of the two read status command sequences SQrs-1a and SQrs-2a is transferred to a destination memory chip CP as a signal with a configuration compliant with the toggle DDR standard and including the read status command C5 and one set of address information.

When the transfer of the read status command sequences SQrs-1a and SQrs-2a is completed (time t92), the bridge chip BCc waits for the elapse of the time $t_{WHR}$ defined in the toggle DDR standard. After the time $t_{WHR}$ elapses from time t92 (from time t93), an operation similar to the operation described in the fourth embodiment is performed.

As described above, according to the first modified example of the fourth embodiment, the read status command sequence SQrs-0a includes the first address information and does not include the second address information, similarly to the command sequence for data transfer transferred to the bridge chip BC by the memory controller MC according to the first embodiment. The bridge chip BCc acquires the second address information by changing the LUN in the first address information from the value indicating the first memory chip CP to the value indicating the second memory chip CP.

In addition, according to the first modified example of the fourth embodiment, the read status command sequence SQrs-0a includes the read status command C5 requesting the status information and the parallel operation command C10 giving an instruction for the parallel operation. The read status command sequences SQrs-1a and SQrs-2a include the read status command C5 but do not include the parallel operation command C10.

Second Modified Example of Fourth Embodiment

As a second modified example of the fourth embodiment, still another example of the configuration of the read status command sequence transferred by the memory controller to the bridge chip will be described. Here, the same contents as those of the fourth embodiment will not be described or will be briefly described.

Figure 28:
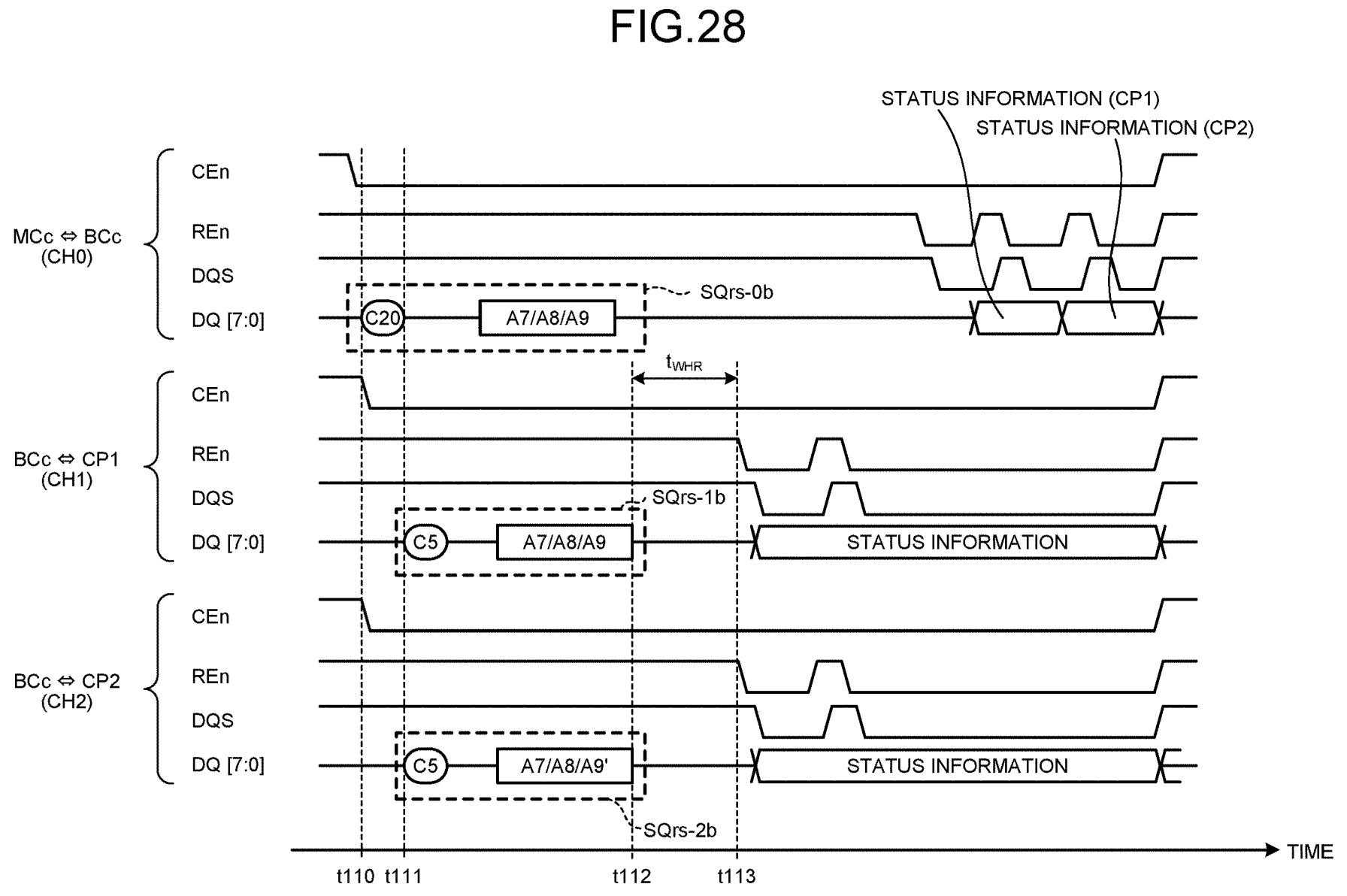

FIG. 28 is a timing chart illustrating an example of information transferred via each channel when status information is acquired in the memory system SYSc according to the second modified example of the fourth embodiment.

The memory controller MCc activates the chip enable signal CEn of the channel CH0, namely, sets the chip enable signal CEn to be the low level, and inputs a read status command sequence SQrs-0b to the bridge chip BCc (time t010). The read status command sequence SQrs-0b includes a parallel read status command C20 and the first address information (address segment A7, A8, and A9). The parallel read status command C20 has the same meaning as a combination of the read status command C5 and the parallel operation command C10. The configuration of the read status command sequence SQrs-0*b* is not compliant with the toggle DDR standard.

The address segment A9 of the first address information includes the LUN. A memory chip CP indicated by the LUN included in the address segment A9 of the first address information is referred to as a first memory chip CP in the description of the second modified example of the fourth embodiment.

Note that, similarly to the first modified example of the fourth embodiment, the bridge chip BCc manages a plurality of (here, two) memory chips CP connected to different channels as one chip group based on a simple relationship using the LUN. A memory chip CP different from the first memory chip CP among the two memory chips CP belonging to one chip group is referred to as a second memory chip CP in the description of the second modified example of the fourth embodiment.

In the bridge chip BCc, when the command decoder 111*c* interprets the parallel read status command C20, the signal transfer/processing circuit 112*c* generates two read status command sequences SQrs-1*b* and SQrs-2*b* by duplicating the read status command sequence SQrs-0*b*. Then, the signal transfer/processing circuit 112*c* starts transfer of the two read status command sequences SQrs-1*b* and SQrs-2*b* (time t111).

When transferring the status command sequence SQrs-2*b*, the signal transfer/processing circuit 112*c* changes the LUN included in the address segment A9 among the address segments A7 to A9 from a value indicating the first memory chip CP to a value indicating the second memory chip CP by the same method as in the first embodiment and the first modified example of the fourth embodiment. The address segment A9 after the change of the LUN is referred to as an address segment A9'.

When the transfer of the read status command sequences SQrs-1*b* and SQrs-2*b* is completed (time t112), the bridge chip BCc waits for the elapse of the time $t_{WHR}$ defined in the toggle DDR standard. After the time $t_{WHR}$ elapses from the time t112 (from time t113), an operation similar to the operation described in the fourth embodiment is performed.

As described above, the read status command sequence SQrs-0*b* can include an optional command as long as the request for the status information and the instruction for the parallel operation are included.

Third Modified Example of Fourth Embodiment

In a third modified example of the fourth embodiment, the bridge chip BCc merges pieces of status information (referred to as first status information) acquired as 1-byte data signals DQ(7:0) from the respective memory chips CP to generate 1-byte new status information (referred to as second status information). Then, the bridge chip transfers the second status information to the memory controller.

The third modified example of the fourth embodiment can be used in combination with any of the fourth embodiment, the first modified example of the fourth embodiment, and the second modified example of the fourth embodiment. Here, as an example, a case where the third modified example of the fourth embodiment is used in combination with the first modified example of the fourth embodiment will be described.

Figure 29:
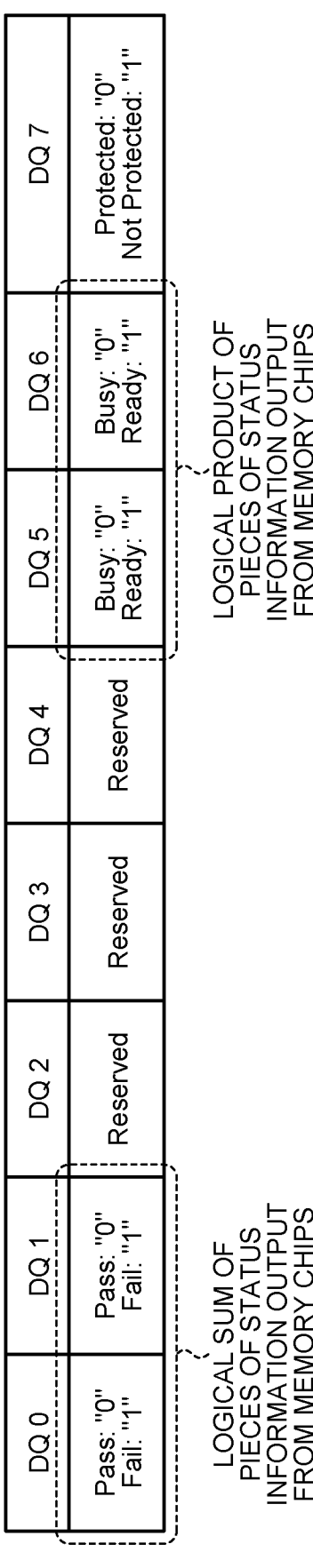
FIG. 29 is a schematic diagram illustrating an example of data configurations of first status information and second status information according to a third modified example of the fourth embodiment.

FIG. 29 is a schematic diagram illustrating an example of data configurations of the first status information and the second status information according to the third modified example of the fourth embodiment.

The first status information and the second status information have a common data configuration. The first status information and the second status information are transferred as pieces of 1-byte (or 8-bit) information. Each of bits DQ0 and DQ1 of the first status information and the second status information indicates whether the internal operation has been successfully performed (pass) or has failed (fail). Here, as an example, "0" indicates that the internal operation has been successfully performed, and "1" indicates that the internal operation has failed. Each of bits DQ5 and DQ6 of the first status information and the second status information indicates whether the memory chip CP is in a ready state or a busy state. Here, as an example, "0" indicates that the memory chip CP is in a busy state, and "1" indicates that the memory chip CP is in a ready state.

After the bridge chip BCc acquires the first status information from each of the first memory chip CP and the second memory chip CP, the signal transfer/processing circuit 112*c* calculates a logical sum of the bit DQ0 included in the first status information acquired from the first memory chip CP and the bit DQ0 included in the first status information acquired from the second memory chip CP. Then, the signal transfer/processing circuit 112*c* sets a value obtained by the logical sum as the bit DQ0 of the second status information. The signal transfer/processing circuit 112*c* calculates a logical sum of the bit DQ1 included in the first status information acquired from the first memory chip CP and the bit DQ1 included in the first status information acquired from the second memory chip CP. Then, the signal transfer/processing circuit 112*c* sets a value obtained by the logical sum as the bit DQ1 of the second status information. The signal transfer/processing circuit 112*c* calculates a logical product of the bit DQ5 included in the first status information acquired from the first memory chip CP and the bit DQ5 included in the first status information acquired from the second memory chip CP. Then, the signal transfer/processing circuit 112*c* sets a value obtained by the logical product as the bit DQ5 of the second status information. The signal transfer/processing circuit 112*c* calculates a logical product of the bit DQ6 included in the first status information acquired from the first memory chip CP and the bit DQ6 included in the first status information acquired from the second memory chip CP. Then, the signal transfer/processing circuit 112*c* sets a value obtained by the logical product as the bit DQ6 of the second status information.

Therefore, the second status information includes, in each of the bits DQ0 and DQ1, a value indicating "0" in a case where both the first memory chip CP and the second memory chip CP have succeeded in performing the internal operation, and a value indicating "1" in a case where one or both of the first memory chip CP and the second memory chip CP have failed in performing the internal operation. The second status information includes, in each of the bits DQ5 and DQ6, a value indicating "1" in a case where both the first memory chip CP and the second memory chip CP are in the ready state, and a value indicating "0" in a case where one or both of the first memory chip CP and the second memory chip CP are in the busy state.

Therefore, the memory controller MCc can recognize whether or not the internal operation has been successfully performed in both the first memory chip CP and the second memory chip CP and whether or not both the first memory chip CP and the second memory chip CP are in the ready state based on the second status information.

Figure 30:
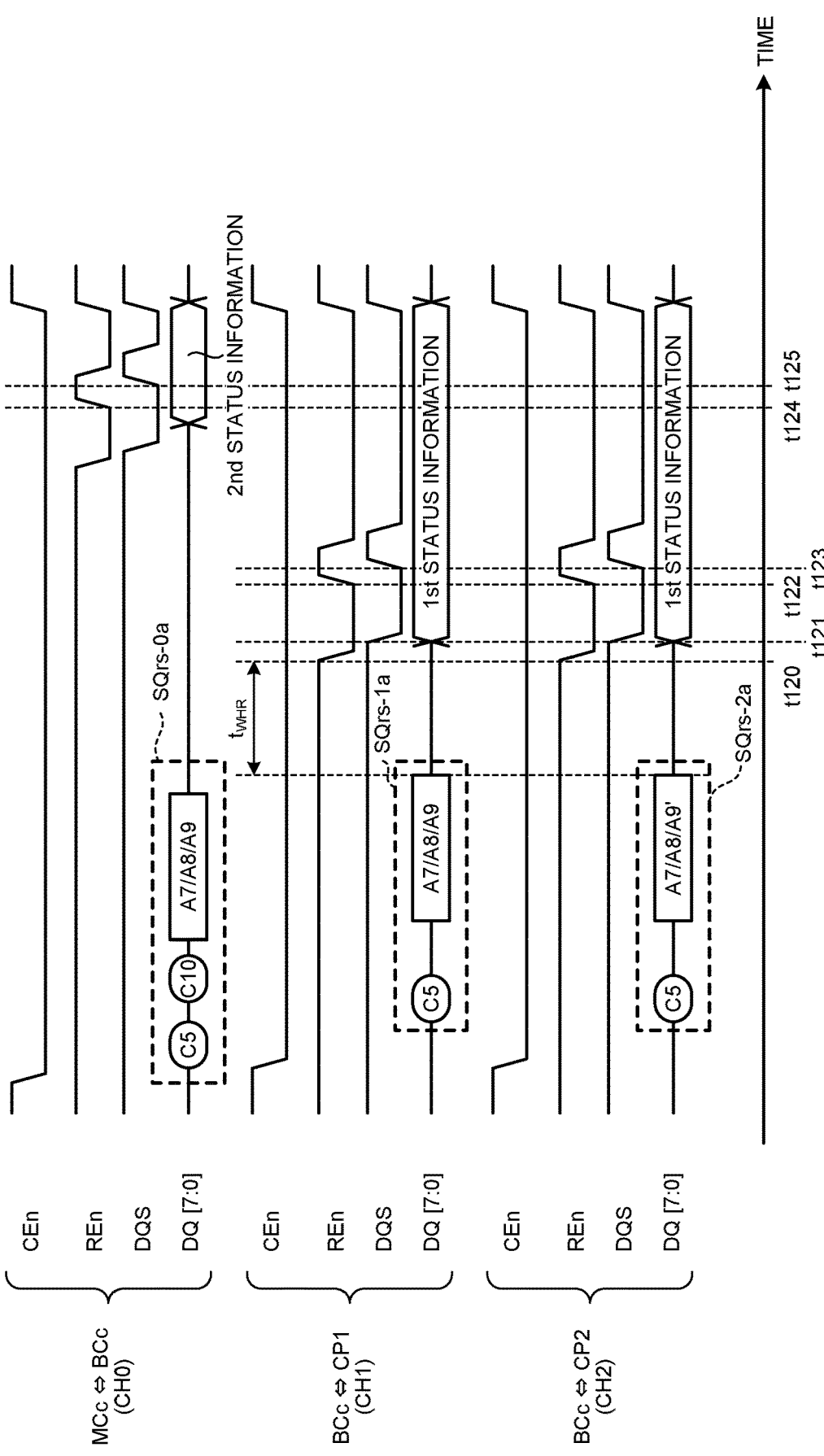
FIG. 30 is a timing chart illustrating an example of information transferred via each channel when the status information is acquired in the memory system according to the third modified example of the fourth embodiment.

FIG. 30 is a timing chart illustrating an example of information transferred via each channel when the status information is acquired in the memory system SYSc according to the third modified example of the fourth embodiment.

As in the first modified example of the fourth embodiment, the memory controller MCc inputs the read status command sequence SQrs-0a to the bridge chip BCc. The bridge chip BCc generates two read status command sequences SQrs-1a and SQrs-2a, and starts transfer of the two read status command sequences SQrs-1a and SQrs-2a.

When the transfer of the read status command sequences SQrs-1a and SQrs-2a is completed, the bridge chip BCc waits for the elapse of the time $t_{WHR}$ defined in the toggle DDR standard. When the time $t_{WHR}$ has elapsed after the transfer of the read status command sequences SQrs-1a and SQrs-2a is completed (time t120), the signal transfer/processing circuit 112c causes the read enable signals REn to transition to the low level in the channels CH1 and CH2, thereby prompting the first memory chip CP and the second memory chip CP to prepare the output of the status information. Then, each of the first memory chip CP and the second memory chip CP starts outputting the first status information as the data signal DQ(7:0) and causes the data strobe signals DQS to transition to the low level (time t121).

When the bridge chip BCc detects that the data strobe signals DQS are caused to transition to the low level in the channels CH1 and CH2, the bridge chip BCc toggles the read enable signals REn once in the channels CH1 and CH2 (time t122).

Each of the first memory chip CP and the second memory chip CP returns the data strobe signal DQS based on the read enable signal REn toggled once (time t123). The signal transfer/processing circuit 112c acquires the first status information output as the data signals DQ(7:0) in the channels CH1 and CH2 in response to the toggling of the data strobe signals DQS, and generates the second status information on the basis of the first status information acquired from each of the channels CH1 and CH2. Then, the signal transfer/processing circuit 112c stores the second status information in the register 113c.

The memory controller MCc toggles the read enable signal REn once in the channel CH0 (time t124).

In response to the toggling of the read enable signal REn, the bridge chip BCc outputs the second status information stored in the register 113c and returns the data strobe signal DQS based on the read enable signal REn toggled once (time t125). The memory controller MCc acquires the second status information in response to the toggling of the data strobe signal DQS.

As described above, according to the third modified example of the fourth embodiment, the bridge chip BCc acquires the second status information by the logical product or the logical sum of the first status information output from the first memory chip CP and the first status information output from the second memory chip CP. Then, the bridge chip BCc transfers the second status information to the memory controller MCc on the basis of the read enable signal RE/REn from the memory controller MCc.

The contents of two pieces of status information are merged into one piece of second status information. Therefore, a time required for transferring the status information is shortened as compared with a case where the two pieces of first status information are serially transferred to the memory controller MCc.

As described in the fourth embodiment, the first modified example of the fourth embodiment, the second modified example of the fourth embodiment, and the third modified example of the fourth embodiment, in a case where the read status command sequence SQrs-0, SQrs-0a, or SQrs-0b including at least the first address information is received from the memory controller MCc, the bridge chip BCc performs transfer of the read status command sequence SQrs-1, SQrs-1a, or SQrs-1b including the first address information and transfer of the read status command sequence SQrs-2, SQrs-2a, or SQrs-2b including the second address information. After the time $t_{WHR}$ elapses from completion of the transfer of the read status command sequence SQrs-1, SQrs-1a, or SQrs-1b and the transfer of the read status command sequence SQrs-2, SQrs-2a, or SQrs-2b, pieces of status information are simultaneously (in parallel) acquired from the first memory chip CP and the second memory chip CP by simultaneously transferring the read enable signals RE/REn to the channel CH0 and the channel CH1. In a case where the read enable signal RE/REn is received from the memory controller MCc, the bridge chip BCc transfers the status information acquired from the first memory chip CP and the second memory chip CP to the memory controller MCc on the basis of the read enable signal RE/REn.

Therefore, a time required to acquire the status information from a plurality of memory chips is reduced.

In the first embodiment, the second embodiment, the modified example of the second embodiment, the third embodiment, the fourth embodiment, the first modified example of the fourth embodiment, the second modified example of the fourth embodiment, and the third modified example of the fourth embodiment, the command and the address information are transferred as the data signal DQ(7:0). The command or the address information may be transferred via one or more signal lines that transfer other signals different from the data signal DQ(7:0).

For example, the command or the address information may be transferred as a 2-bit width signal via a signal line that transfers the address latch enable signal ALE and a signal line that transfers the command latch enable signal CLE. In this case, the write enable signal WEn may be used as a clock signal. Whether information transferred via the signal line that transfers the address latch enable signal ALE and the signal line that transfers the command latch enable signal CLE is the command or the address information can be reported by, for example, a combination of a logic of the address latch enable signal ALE and a logic of the command latch enable signal CLE corresponding to one to several bits at the start of transfer. A rising edge, a falling edge, or both of the rising edge and the falling edge of the clock signal may be used as the command or address information acquisition timing.

Alternatively, the command or the address information may be transferred as a 1-bit width signal via one of the signal line that transfers the address latch enable signal ALE and the signal line that transfers the command latch enable signal CLE. In this case, the other one of the signal line that transfers the address latch enable signal ALE and the signal line that transfers the command latch enable signal CLE may be used as a signal line that transfers the clock signal, or the write enable signal WEn may be used as the clock signal. A rising edge, a falling edge, or both of the rising edge and the falling edge of the clock signal may be used as the command or address information acquisition timing.

In the first embodiment, the second embodiment, the modified example of the second embodiment, the third embodiment, the fourth embodiment, the first modified example of the fourth embodiment, the second modified example of the fourth embodiment, and the third modified example of the fourth embodiment, the configuration example in which the bridge chip BC, BCa, BCb, or BCc is connected to a plurality of memory chips CP through two channels CH1 and CH2 has been described. All the embodiments and all the modified examples can be applied even when the bridge chip BC, BCa, BCb, or BCc is connected to a plurality of memory chips CP through three or more channels. In the configuration in which the bridge chip BC, BCa, BCb, or BCc is connected to a plurality of memory chips CP through three or more channels, one of the three or more memory chips connected to different channels is regarded as the first memory chip CP, and each of the three or more memory chips except the first memory chip CP is regarded as the second memory chip CP, whereby the first embodiment, the second embodiment, the modified example of the second embodiment, the third embodiment, the fourth embodiment, the first modified example of the fourth embodiment, the second modified example of the fourth embodiment, and the third modified example of the fourth embodiment can be applied to the configuration.

While some embodiments have been described, these embodiments have been presented by way of example only, and are not intended to limit the scope of the inventions. Indeed, the novel embodiments described herein may be embodied in a variety of other forms; moreover, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for a semiconductor memory device comprising:
    a first chip including a first memory cell array;
    a second chip including a second memory cell array; and
    a third chip connectable to a first device, the third chip being connected to the first chip via a first channel and connected to the second chip via a second channel, the method comprising:
    in a case where the semiconductor memory device is connected to the first device via the third chip,
    receiving, by the third chip, a first command sequence for data transfer from the first device, the first command sequence including only a first address indicating a position in the first memory cell array and a first command, the first address including a first value indicating the first chip, the first command being a command to request the data transfer;
    generating, by the third chip, a second command sequence and a third command sequence by duplicating the first command sequence;
    specifying, by the third chip, a second value indicating the second chip based on the first value in the first address;
    replacing, by the third chip, the first value in the first address included in the third command sequence with the second value to generate a fourth command sequence including a second address obtained by replacing the first value in the first address; and
    transferring, by the third chip, the second command sequence to the first chip via the first channel and transferring the fourth command sequence for the data transfer to the second chip via the second channel.

2. The method according to claim 1, further comprising:
    executing, by the third chip, the transfer of the second command sequence and the transfer of the fourth command sequence in parallel.

3. The method according to claim 2, further comprising:
upon starting receiving of the first command sequence, starting, by the third chip, the transfer of the second command sequence and the transfer of the fourth command sequence before the receiving of the first command sequence is completed.

4. The method according to claim 1, wherein
the semiconductor memory device further comprises:
    a plurality of fourth chips including the first chip, each being connected to the first channel; and
    a plurality of fifth chips including the second chip, each being connected to the second channel, and
    the method further comprises acquiring, by the third chip, the second value by an arithmetic operation using the first value in the first address.

5. A method for a semiconductor memory device comprising:
    a first chip including a first memory cell array;
    a second chip including a second memory cell array; and
    a third chip connectable to a first device, the third chip being connected to the first chip via a first channel and connected to the second chip via a second channel, the method comprising:
    in a case where the semiconductor memory device is connected to the first device via the third chip,
    receiving, by the third chip, a first command sequence for data transfer from the first device, the first command sequence including both a first address and a second address, the first address indicating a position in the first memory cell array, the second address indicating a position in the second memory cell array; and
    in response to receiving the first command sequence, transferring, by the third chip, a second command sequence for the data transfer to the first chip via the first channel and transferring a third command sequence for the data transfer to the second chip via the second channel, the second command sequence including the first address included in the first command sequence without including the second address, the third command sequence including the second address included in the first command sequence without including the first address.

6. The method according to claim 5, further comprising:
generating, by the third chip, a fourth command sequence and a fifth command sequence by duplicating the first command sequence,
generating, by the third chip, the second command sequence by masking the second address included in the fourth command sequence, and
generating, by the third chip, the third command sequence by masking the first address included in the fifth command sequence.

7. The method according to claim 6, wherein
the first command sequence includes a first command to request the data transfer and a second command to give an instruction for a parallel operation, and
the method further comprises masking, by the third chip, the second command included in the fourth command sequence and the fifth command sequence without masking the first command included in the fourth command sequence and the fifth command sequence.

8. The method according to claim 5, wherein
the first address is a complete address indicating the position in the first memory cell array,
the second address is an address obtained by omitting a first portion of a third address being a complete address indicating the position in the second memory cell array, the first portion being included in the first address, and

the method further comprises:

generating, by the third chip, a fourth command sequence and a fifth command sequence by duplicating the first command sequence, generating, by the third chip, the second command sequence by masking the second address included in the fourth command sequence, and generating, by the third chip, the third command sequence by masking a second portion being a portion other than the first portion in the first address included in the fifth command sequence.

9. The method according to claim 8, wherein the second address includes a block identification number and a chip identification number, and the block identification number is a number by which a plurality of blocks included in the second memory cell array is identifiable.

10. A method for a memory system comprising:

a first device; and a semiconductor memory device, wherein the semiconductor memory device comprises:

a first chip including a first memory cell array;

a second chip including a second memory cell array; and a third chip connected to the first device, the third chip being connected to the first chip via a first channel and connected to the second chip via a second channel, the method comprising:

receiving, by the third chip, a first command sequence for data transfer from the first device, the first command sequence including only a first address indicating a position in the first memory cell array and a first command, the first address including a first value indicating the first chip, the first command being a command to request the data transfer;

generating, by the third chip, a second command sequence and a third command sequence by duplicating the first command sequence;

specifying, by the third chip, a second value indicating the second chip based on the first value in the first address;

replacing, by the third chip, the first value in the first address included in the third command sequence with the second value indicating the second chip to generate a fourth command sequence including a second address obtained by replacing the first value in the first address; and transferring, by the third chip, the second command sequence to the first chip via the first channel and transferring the fourth command sequence for the data transfer to the second chip via the second channel.

11. The method according to claim 10, further comprising:

executing, by the third chip, the transfer of the second command sequence and the transfer of the fourth command sequence in parallel.

12. The method according to claim 10, wherein the semiconductor memory device further includes:

a plurality of fourth chips including the first chip, each being connected to the first channel; and a plurality of fifth chips including the second chip, each being connected to the second channel, wherein the method further comprises acquiring, by the third chip, the second value by an arithmetic operation using the first value in the first address.

13. A method for a memory system comprising:

a first device; and a semiconductor memory device, wherein the semiconductor memory device comprises:

a first chip including a first memory cell array;

a second chip including a second memory cell array; and a third chip connected to a first device, the third chip being connected to the first chip via a first channel and connected to the second chip via a second channel, the method comprising:

receiving, by the third chip, a first command sequence for data transfer from the first device, the first command sequence including both a first address and a second address, the first address indicating a position in the first memory cell array, the second address indicating a position in the second memory cell array, and in response to receiving the first command sequence, transferring, by the third chip, a second command sequence for the data transfer to the first chip via the first channel and transferring a third command sequence for the data transfer to the second chip via the second channel, the second command sequence including the first address included in the first command sequence without including the second address, the third command sequence including the second address included in the first command sequence without including the first address.

14. The method according to claim 13, further comprising:

generating, by the third chip, a fourth command sequence and a fifth command sequence by duplicating the first command sequence, generating, by the third chip, the second command sequence by masking the second address included in the fourth command sequence, and generating, by the third chip, the third command sequence by masking the first address included in the fifth command sequence.

15. The method according to claim 13, wherein the first address is a complete address indicating the position in the first memory cell array, the second address is an address obtained by omitting a first portion of a third address being a complete address indicating the position in the second memory cell array, the first portion being included in the first address, and the method further comprises:

generating, by the third chip, a fourth command sequence and a fifth command sequence by duplicating the first command sequence, generating, by the third chip, the second command sequence by masking the second address included in the fourth command sequence, and generating, by the third chip, the third command sequence by masking a second portion being a portion other than the first portion in the first address included in the fifth command sequence.

16. A method for a memory system comprising:

a first device;

a first chip including a first memory cell array;

a second chip including a second memory cell array; and a third chip connected to the first device, the third chip being connected to the first chip via a first channel and connected to the second chip via a second channel, in a case where a first command sequence for data transfer is received from the first device, the first command sequence including only a first address indicating a position in the first memory cell array and a first command, the first command sequence not including a second address indicating a position in the second memory cell array, the first address including a first value indicating the first chip, the first command being a command to request the data transfer, the method comprising:

generating, by the third chip, a second command sequence and a third command sequence by duplicating the first command sequence;

specifying, by the third chip, a second value indicating the second chip based on the first value in the first address;

replacing, by the third chip, the first value in the first address included in the third command sequence with the second value indicating the second chip to generate a fourth command sequence including a second address obtained by replacing the first value in the first address;

transferring, by the third chip, the second command sequence to the first chip via the first channel and transferring the fourth command sequence to the second chip via the second channel; and in a case where a fifth command sequence for data transfer is received from the first device, transferring, by the third chip, a sixth command sequence for the data transfer to the first chip via the first channel and transferring a seventh command sequence for the data transfer to the second chip via the second channel, the fifth command sequence including a fourth address indicating a position in the first memory cell array and a fifth address indicating a position in the second memory cell array, the sixth command sequence including the fourth address included in the fifth command sequence without including the fifth address, the seventh command sequence including the fifth address included in the fifth command sequence without including the fourth address.

17. The method according to claim 16, further comprising:

transferring, by the third chip, the first command sequence to the third chip in a case where a first block in the first memory cell array and a second block in the second memory cell array are targets of the data transfer, the second block being indicated by seventh address information, the seventh address information being obtained by replacing a third value of the chip identification number in sixth address information indicating the first block with a fourth value indicating the second chip, and transferring, by the third chip, the fifth command sequence to the third chip in a case where the first block and a third block in the second memory cell array are targets of the data transfer, the third block being indicated by eighth address information different from the seventh address information.

18. The method according to claim 16, further comprising:

in a case where both the first block and the second block are usable, managing, by the first device, the first block and the second block as a first group to which the first command sequence is transferable; and in a case where the second block becomes unusable, canceling, by the first device, the first group and manage the first block and the third block out of usable blocks as a second group to which the fifth command sequence is transferable.

* * * * *